US012628649B1

(12) United States Patent
Haba et al.

(10) Patent No.: US 12,628,649 B1
(45) Date of Patent: May 12, 2026

(54) INTEGRATED COOLING ASSEMBLY WITH UPPER AND LOWER CHANNELS AND CO-PACKAGED OPTICS

(71) Applicant: Adeia Semiconductor Bonding Technologies Inc., San Jose, CA (US)

(72) Inventors: Belgacem Haba, Saratoga, CA (US); Ron Zhang, Sunnyvale, CA (US); Rasit Onur Topaloglu, Poughkeepsie, NY (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 19/195,456

(22) Filed: Apr. 30, 2025

Related U.S. Application Data

(60) Provisional application No. 63/768,379, filed on Mar. 7, 2025.

(51) Int. Cl.
  H01L 23/04 (2006.01)
  H10W 40/47 (2026.01)
  H10W 90/00 (2026.01)

(52) U.S. Cl.
  CPC ........... H10W 40/47 (2026.01); H10W 90/00 (2026.01)

(58) Field of Classification Search
  CPC ............................ H01L 23/473; H01L 25/167
  See application file for complete search history.

(56) References Cited

U.S. PATENT DOCUMENTS

| | | | |
|---|---|---|---|
| 1,032,695 | A | 7/1912 | Minier et al. |
| 1,083,934 | A | 1/1914 | Koebner et al. |

| | | | |
|---|---|---|---|
| 4,274,479 | A | 6/1981 | Eastman |
| 5,309,986 | A | 5/1994 | Itoh |
| 5,522,452 | A | 6/1996 | Mizuno et al. |
| 5,769,154 | A | 6/1998 | Adkins et al. |

(Continued)

FOREIGN PATENT DOCUMENTS

| | | |
|---|---|---|
| CN | 109524373 A | 3/2019 |
| CN | 106911058 B | 2/2020 |

(Continued)

OTHER PUBLICATIONS

"GB200 Hardware Architecture—Component Supply Chain & BOM", Semi Analysis, Retrieved from URL: https://www.semianalysis.com/p/gb200-hardware-architecture-and-component, Jul. 17, 2024, 41 Pages.

(Continued)

*Primary Examiner* — Ismail A Muse

(74) *Attorney, Agent, or Firm* — HG LAW LLP

(57) ABSTRACT

Embodiments herein provide for fluidic cooling assemblies embedded within a device package and related manufacturing methods. In one embodiment, an integrated cooling assembly comprises a semiconductor device and a cold plate attached to a backside of the semiconductor device. The cold plate comprises an upper portion disposed vertically adjacent to the backside of the semiconductor device. The cold plate further comprises a lower portion disposed between the upper portion of the cold plate and the backside of the semiconductor device. The upper portion comprises upper coolant channels defined by upper cavity sidewalls. The lower portion comprises lower coolant channels defined by lower cavity sidewalls.

16 Claims, 24 Drawing Sheets

(56) References Cited

U.S. PATENT DOCUMENTS

| | | | |
|---|---|---|---|
| 6,056,044 A | 5/2000 | Benson et al. | |
| 6,351,384 B1 | 2/2002 | Daikoku et al. | |
| 6,686,532 B1 | 2/2004 | Macris | |
| 6,729,339 B1 | 5/2004 | Boyd et al. | |
| 6,822,326 B2 | 11/2004 | Enquist et al. | |
| 7,289,326 B2 | 10/2007 | Heydari et al. | |
| 7,485,957 B2 | 2/2009 | Brandenburg et al. | |
| 7,511,372 B2 | 3/2009 | Chiu | |
| 7,523,617 B2 | 4/2009 | Venkatasubramanian et al. | |
| 7,622,324 B2 | 11/2009 | Enquist et al. | |
| 7,692,926 B2 | 4/2010 | Henderson et al. | |
| 7,957,137 B2 | 6/2011 | Prasher | |
| 7,978,473 B2 | 7/2011 | Campbell et al. | |
| 7,997,087 B2 | 8/2011 | Venkatasubramanian et al. | |
| 8,164,169 B2 | 4/2012 | Chrysler et al. | |
| 8,630,091 B2 | 1/2014 | Ward et al. | |
| 9,224,673 B2 | 12/2015 | Chen et al. | |
| 9,299,641 B2 | 3/2016 | Sekar et al. | |
| 9,355,932 B2 | 5/2016 | Ankireddi et al. | |
| 9,391,143 B2 | 7/2016 | Tong et al. | |
| 9,553,071 B1 | 1/2017 | Haba | |
| 9,741,638 B2 | 8/2017 | Hsieh et al. | |
| 9,741,663 B2 | 8/2017 | Ishikura et al. | |
| 9,741,696 B2 | 8/2017 | Katkar et al. | |
| 9,746,248 B2 | 8/2017 | Semenov et al. | |
| 9,768,149 B2 | 9/2017 | Vadhavkar et al. | |
| 9,818,723 B2 | 11/2017 | Haba | |
| 10,032,695 B2 | 7/2018 | Iyengar et al. | |
| 10,083,934 B2 | 9/2018 | Haba | |
| 10,157,818 B2 | 12/2018 | Chen et al. | |
| 10,170,392 B2 | 1/2019 | Chainer et al. | |
| 10,199,356 B2 | 2/2019 | Kinsley | |
| 10,312,221 B1 | 6/2019 | Agarwal et al. | |
| 10,332,823 B2 | 6/2019 | Chen et al. | |
| 10,461,059 B2 | 10/2019 | Koopmans et al. | |
| 10,694,641 B2 | 6/2020 | Basu et al. | |
| 10,861,665 B1* | 12/2020 | Backman | H10D 1/47 |
| 10,978,427 B2 | 4/2021 | Li et al. | |
| 11,187,469 B2 | 11/2021 | Karesh | |
| 11,191,184 B2 | 11/2021 | Mizerak et al. | |
| 11,387,164 B2 | 7/2022 | Wu et al. | |
| 11,598,594 B2 | 3/2023 | Lewis et al. | |
| 11,860,428 B1 | 1/2024 | Lau et al. | |
| 11,996,351 B2 | 5/2024 | Hsiao et al. | |
| 12,080,626 B1 | 9/2024 | Gutierrez et al. | |
| 12,183,659 B2 | 12/2024 | Haba | |
| 12,261,099 B2 | 3/2025 | Gao et al. | |
| 12,283,490 B1 | 4/2025 | Fountain, Jr. et al. | |
| 12,322,677 B1 | 6/2025 | Zhang et al. | |
| 2003/0157782 A1 | 8/2003 | Kellar et al. | |
| 2004/0184237 A1 | 9/2004 | Chang | |
| 2004/0251530 A1 | 12/2004 | Yamaji | |
| 2005/0126766 A1 | 6/2005 | Lee et al. | |
| 2005/0213301 A1 | 9/2005 | Prasher | |
| 2006/0042825 A1 | 3/2006 | Lu et al. | |
| 2006/0060331 A1 | 3/2006 | Glezer et al. | |
| 2006/0103011 A1 | 5/2006 | Andry et al. | |
| 2006/0130506 A1 | 6/2006 | Tain et al. | |
| 2007/0025082 A1 | 2/2007 | Lee et al. | |
| 2007/0107875 A1 | 5/2007 | Lee et al. | |
| 2007/0231969 A1 | 10/2007 | Chrysler et al. | |
| 2008/0096320 A1 | 4/2008 | Farrar | |
| 2008/0315403 A1* | 12/2008 | Andry | H01L 25/0657 257/713 |
| 2009/0122491 A1 | 5/2009 | Martin et al. | |
| 2010/0116534 A1 | 5/2010 | Choi et al. | |
| 2010/0230805 A1 | 9/2010 | Refai-Ahmed | |
| 2010/0300202 A1 | 12/2010 | Joyce | |
| 2011/0129986 A1 | 6/2011 | Libralesso et al. | |
| 2011/0205708 A1* | 8/2011 | Andry | H01L 23/3677 438/122 |
| 2013/0044431 A1 | 2/2013 | Koeneman | |
| 2013/0050944 A1 | 2/2013 | Shepard | |
| 2013/0087904 A1 | 4/2013 | Clark et al. | |

| | | | |
|---|---|---|---|
| 2013/0299924 A1* | 11/2013 | Weber | B81C 1/00301 438/51 |
| 2014/0126150 A1 | 5/2014 | Song et al. | |
| 2014/0254099 A1 | 9/2014 | Takeda | |
| 2015/0194363 A1 | 7/2015 | Jun et al. | |
| 2016/0109399 A1* | 4/2016 | O'Donnell | H02S 40/38 73/31.06 |
| 2016/0276314 A1 | 9/2016 | Ching et al. | |
| 2017/0012016 A1 | 1/2017 | Joshi et al. | |
| 2017/0092565 A1 | 3/2017 | Chen et al. | |
| 2017/0103937 A1 | 4/2017 | Hsieh et al. | |
| 2018/0053730 A1 | 2/2018 | Shao et al. | |
| 2018/0087842 A1 | 3/2018 | Chainer et al. | |
| 2018/0090427 A1 | 3/2018 | Bernstein et al. | |
| 2018/0160565 A1 | 6/2018 | Parida | |
| 2018/0211900 A1 | 7/2018 | Gutala et al. | |
| 2018/0308783 A1 | 10/2018 | Refai-Ahmed et al. | |
| 2019/0008071 A1 | 1/2019 | Kim | |
| 2019/0355706 A1 | 11/2019 | Enquist et al. | |
| 2019/0385928 A1 | 12/2019 | Leobandung | |
| 2019/0385933 A1 | 12/2019 | Eid et al. | |
| 2020/0035583 A1 | 1/2020 | Beauchemin et al. | |
| 2020/0105639 A1 | 4/2020 | Valavala et al. | |
| 2020/0312742 A1 | 10/2020 | Lofgreen et al. | |
| 2020/0343160 A1 | 10/2020 | Mizerak et al. | |
| 2020/0350233 A1* | 11/2020 | Mizerak | H01L 23/4735 |
| 2020/0352053 A1 | 11/2020 | Mizerak et al. | |
| 2020/0395313 A1 | 12/2020 | Mallik et al. | |
| 2021/0066164 A1 | 3/2021 | Wu et al. | |
| 2021/0175143 A1 | 6/2021 | Yu et al. | |
| 2021/0183741 A1 | 6/2021 | Jha et al. | |
| 2021/0193548 A1 | 6/2021 | Wan et al. | |
| 2021/0193620 A1 | 6/2021 | Refai-Ahmed et al. | |
| 2021/0280497 A1 | 9/2021 | Brun et al. | |
| 2021/0288037 A1 | 9/2021 | Tao et al. | |
| 2021/0378106 A1 | 12/2021 | Iyengar et al. | |
| 2021/0378139 A1 | 12/2021 | Rice et al. | |
| 2021/0410329 A1 | 12/2021 | Yang et al. | |
| 2022/0037231 A1 | 2/2022 | Hsiao et al. | |
| 2022/0087059 A1 | 3/2022 | Sathyamurthy et al. | |
| 2022/0117115 A1 | 4/2022 | Malouin et al. | |
| 2022/0130734 A1 | 4/2022 | Chiu et al. | |
| 2022/0189850 A1 | 6/2022 | Liff et al. | |
| 2022/0210949 A1 | 6/2022 | Edmunds et al. | |
| 2022/0230937 A1 | 7/2022 | Malouin et al. | |
| 2022/0392881 A1 | 12/2022 | Yu et al. | |
| 2022/0408592 A1 | 12/2022 | Malouin et al. | |
| 2023/0012157 A1 | 1/2023 | Yu et al. | |
| 2023/0048500 A1 | 2/2023 | Malouin et al. | |
| 2023/0154828 A1 | 5/2023 | Haba et al. | |
| 2023/0156959 A1 | 5/2023 | Malouin et al. | |
| 2023/0161120 A1 | 5/2023 | Yu et al. | |
| 2023/0197559 A1 | 6/2023 | Haba et al. | |
| 2023/0197560 A1 | 6/2023 | Katkar et al. | |
| 2023/0207474 A1 | 6/2023 | Uzoh et al. | |
| 2023/0245950 A1 | 8/2023 | Haba et al. | |
| 2023/0284421 A1* | 9/2023 | Malouin | G06F 1/20 |
| 2023/0298969 A1 | 9/2023 | Park et al. | |
| 2024/0038633 A1* | 2/2024 | Haba | H01L 24/29 |
| 2024/0184527 A1* | 6/2024 | Pearcey | G06F 7/57 |
| 2024/0194478 A1* | 6/2024 | Hoshino | H01L 21/67017 |
| 2024/0203823 A1 | 6/2024 | Uzoh et al. | |
| 2024/0222222 A1 | 7/2024 | Haba et al. | |
| 2024/0222226 A1 | 7/2024 | Haba | |
| 2024/0249995 A1 | 7/2024 | Haba | |
| 2024/0249998 A1 | 7/2024 | Gao et al. | |
| 2024/0266265 A1 | 8/2024 | Haba et al. | |
| 2024/0332128 A1 | 10/2024 | Uzoh et al. | |
| 2024/0332129 A1 | 10/2024 | Haba et al. | |
| 2025/0029970 A1* | 1/2025 | Kang | H01L 25/18 |
| 2025/0210457 A1 | 6/2025 | Fountain, Jr. et al. | |
| 2025/0253207 A1 | 8/2025 | Fountain, Jr. et al. | |
| 2025/0266394 A1 | 8/2025 | Mandalapu et al. | |
| 2025/0273538 A1 | 8/2025 | Gao et al. | |

FOREIGN PATENT DOCUMENTS

| | | | |
|---|---|---|---|
| CN | 111128976 A | 5/2020 | |
| CN | 115719735 A | 2/2023 | |

(56) References Cited

FOREIGN PATENT DOCUMENTS

| | | | |
|---|---|---|---|
| DE | 10315225 | A1 | 10/2004 |
| JP | 2000-340727 | A | 12/2000 |
| KR | 10-1049508 | B1 | 7/2011 |
| KR | 10-2023-0136509 | A | 9/2023 |
| TW | 200834871 | A | 8/2008 |
| WO | 2013/097146 | A1 | 7/2013 |
| WO | 2024/145475 | A1 | 7/2024 |

OTHER PUBLICATIONS

"Heating and Cooling with a Peltier Controller", meerstetter, available online at <https://www.meerstetter.ch/customer-center/compendium/16-heating-and-coolingwith-a-peltier-controller>, Dec. 27, 2024, pp. 1-2.

"How Removing the TEC Increases Laser Diode Stability," RPMC, available online at https://www.rpmclasers.com/blog/how-removing-the-tec-increases-laser-diode-stability/, Oct. 17, 2019, 3 pages.

"Laser Operation: Temperature Control and Mount Selection", Photonics, available online at <https://www.photonics.com/Articles/Laser_Operation_Temperature_Control_and_Mount/a57161>, retrieved on Dec. 27, 2024, pp. 1-7.

"Lasers 101—Laser Selection Guide", rpm classers, available online at <https://www.rpmclasers.com/lasers-101-laser-selection-guide/>, retrieved on Dec. 27, 2024, pp. 1-30.

"Photonic Integrated Circuit: Definition, Disadvantage, Fabrication, Application", Ovaga Technologies, Nov. 22, 2023, available online at <https://www.ovaga.com/blog/transistor/photonic-integrated-circuit-definitiondisadvantage-fabrication-application>, retrieved on Dec. 27, 2024, pp. 1-24.

"TEC / Peltier Element Design Guide", meerstetter, available online at <https://www.meerstetter.ch/customer-center/compendium/32-tec-peltier-elementdesign- guide>, retrieved on Dec. 27, 2024, 11 pages.

"TEC Controllers-Temperature Controllers", OPT Lasers, available online at <https://optlasers.com/tec-controllers/>, retrieved on Dec. 27, 2024, pp. 1-12.

"Vertical Cavity Surface Emitting Lasers (VCSELs) and their Applications", Denton Vacuum, Mar. 14, 2024, available online at <https://www.dentonvacuum.com/vertical-cavity-surface-emitting-lasers-vcsels-andtheir-applications>, retrieved on Dec. 27, 2024, pp. 1-6.

"Microconvective Liquid Cooling for high power electronics," https://jetcool. com/technology/, downloaded Mar. 7, 2024, 6 pages.

Benson D.A. et al., "Micro-Machined Heat Pipes in Silicon MCM Substrates", Sandia National Laboratories, Sandia Report: SAND97-0100-UC-704, printed Jan. 1997, 17 pages.

Colgan, Evan G., "A practical implementation of silicon microchannel coolers," Electronics Cooling, Nov. 1, 2007, http://www.electronics-cooling.com/2007/11/a-practical-implementation-of-silicon-microchannel-coolers, printed May 23, 2023, 11 pages.

Evan G. Colgan, "A Practical Implementation of Silicon Microchannel Coolers", available online at <https://www.electronics-cooling.com/2007/11/a-practical-implementation-of-silicon-microchannel-coolers/>, Nov. 1, 2007, 10 pages.

Francisco Pires, "TSMC Exploring On-Chip, Semiconductor-Integrated Watercooling", tom's Hardware, retrieved from https://www.tomshardware.com/news/tsmc-exploring-on-chi p-semiconductor-integrated-watercooling, Jul. 13, 2021, 23 pages.

IBM, "Functional electronic packaging-Thermal management roadmap", available online at <https://web.archive.org/web/20170220095511/https://www.zurich.ibm.com/st/electronicpackaging/cooling.html>, Feb. 20, 2017, 7 pages.

John H, "Recent Advances and Trends in Advanced Packaging", IEEE Transactions on Components, Packaging and Manufacturing Technology, IEEE, USA, vol. 12, No. 2, Jan. 20, 2022, pp. 228-252.

John H., "Chapter 3: Multiple System and Heterogeneous Integration with TSV-Interposers" in: "Chiplet Design and Heterogeneous Integration Packaging", Mar. 28, 2023, Springer Nature Singapore, Singapore, pp. 137-269.

Johnstone, Caitlin, "Coolant-on-Chip: Say Goodbye to Thermal Interfaces," jetcool, Jun. 9, 2020, https://jetcool.com/post/coolant-on-chip-say-goodbye-to-thermal-interfaces/, downloaded Feb. 29, 2024, 7 pages.

Kaplan, F., et al., "LoCool: Fighting Hot Spots Locally for Improving System Energy Efficiency", IEEE Transactions on Computer-Aided Design of Integrated Circuits and Systems, vol. 39, No. 4, Apr. 2020, pp. 895-908.

KoolMicro Inc. developed the World's First 2,000 W/cm2 Cooling Technology for High Heat Generation Chips, Press Release, 2 pages, downloaded from www.semiconductorpackagingnews.com/uploads/1/KoolMicro_High_Cooling_Power_Density.pdf on Nov. 22, 2023.

Lien, Y-J, et al., "An Energy-efficient Si-integrated Micro-cooler for High Power and Power-density Computing Applications," 74th Electronic Components and Technology Conference, 2024, pp. 1025-1029.

Pires F., "TSMC Exploring On-Chip, Semiconductor-Integrated Watercooling", Tom's Hardware, retrieved from https://www.tomshardware.com/news/tsmc-exploring-on-chip-semiconductor-integrated-watercooling, Jul. 13, 2021, 15 pages.

Shamsa, M., et al., "Thermal conductivity of diamond-like carbon films", Applied Physics Letters, vol. 89, No. 16, Oct. 20, 2006, pp. 161921-161921-3.

Single-Phase Direct-to-Chip Liquid Cooling, 6 pages, downloaded from https://jetcool.com/posl/single-phase- direct-to-chip-liquid-cooling-microconvective-vs-microchannel-liquid-cooled-cold-plates/ on Mar. 7, 2024.

Walsh, Stephen Michael, "Microjet Impingement Cooling of High Power-Density Electronics," Thesis, submitted May 11, 2018, 93 pages.

Wu, C. J., et al., "Ultra High Power Cooling Solution for 3D-Ics", 2021 Symposium on VLSI Technology, Jun. 2021, 2 pages.

U.S. Appl. No. 19/422,695, filed Dec. 17, 2025. Title: Embedded Cooling Systems for Advanced Device Packaging (Not provided; USPTO in possession of specification, claims, and prosecution history).

* cited by examiner

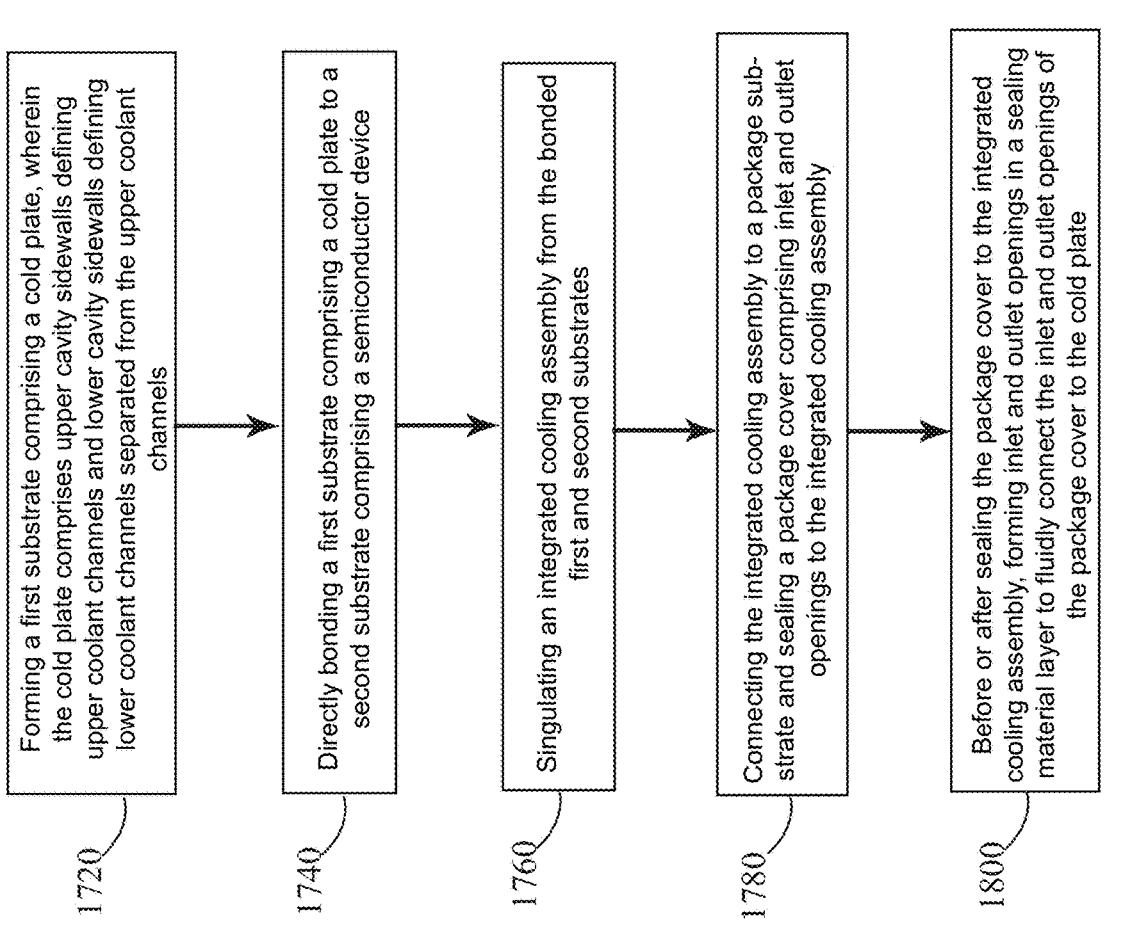

1720 — Forming a first substrate comprising a cold plate, wherein the cold plate comprises upper cavity sidewalls defining upper coolant channels and lower cavity sidewalls defining lower coolant channels separated from the upper coolant channels 1740 — Directly bonding a first substrate comprising a cold plate to a second substrate comprising a semiconductor device 1760 — Singulating an integrated cooling assembly from the bonded first and second substrates 1780 — Connecting the integrated cooling assembly to a package substrate and sealing a package cover comprising inlet and outlet openings to the integrated cooling assembly 1800 — Before or after sealing the package cover to the integrated cooling assembly, forming inlet and outlet openings in a sealing material layer to fluidly connect the inlet and outlet openings of the package cover to the cold plate

INTEGRATED COOLING ASSEMBLY WITH UPPER AND LOWER CHANNELS AND CO-PACKAGED OPTICS

CROSS REFERENCE TO RELATED APPLICATION

This application claims the benefit of U.S. Provisional Patent Application No. 63/768,379 filed Mar. 7, 2025, which is hereby incorporated by reference herein in its entirety.

FIELD

The present disclosure relates to advanced packaging for microelectronic devices, and in particular, cooling systems for device packages and methods of manufacturing the same.

BACKGROUND

Energy consumption poses a critical challenge for the future of large-scale computing as the world's computing energy requirements are rising at a rate that would consider unsustainable. Some models predict that the information, communication and technology (ICT) ecosystem could exceed 20% of global electricity use by 2030, with direct electrical consumption by large-scale computing centers accounting for more than one-third of that energy usage. A significant portion of the energy used by such large-scale computing centers is devoted to cooling, since even small increases in undesirable operating temperatures can negatively impact the performance of microprocessors, memory devices, and other electronic components. While some of this energy is expended to operate the cooling systems that are directly cooling the chips (e.g., heat spreaders, heat pipes, etc.), energy consumption/costs for indirect cooling can also be quite staggering. Indirect cooling energy costs include, for example, cooling or air conditioning of data center buildings. Data center buildings can house thousands, to tens of thousands or more, of high performance chips in server racks, and each of those high performance chips is a heat source. An uncontrolled ambient temperature in a data center will adversely affect the performance of the individual chips, and the data center system performance as a whole.

Thermal dissipation in high-power density chips (semiconductor devices/die) is also a critical challenge as improvements in chip performance, e.g., through increased gate or transistor density due to advanced processing nodes, evolution of multi-core microprocessors, etc., have resulted in increased power density and a corresponding increase in thermal flux that contributes to elevated chip temperatures. Higher density of transistors also increases the length of metal wiring on the chips, which generates its own additional thermal flux due to Joule heating of these wires due to higher currents. These elevated temperatures are undesirable as they can degrade the chip's operating performance, efficiency, reliability, and amount of remaining life. Cooling systems used to maintain the chip at a desired operating temperature typically remove heat using one or more heat dissipation devices, e.g., thermal spreaders, heat pipes, cold plates, liquid cooled heat pipe systems, thermal-electric coolers, heat sinks, etc. One or more thermal interface materials (TIMs), such as, for example, thermal paste, thermal adhesive, or thermal gap filler, may be used to facilitate heat transfer between the surfaces of a chip and heat dissipation device(s). A thermal interface material is any material that is inserted between two components to enhance the thermal coupling therebetween. Unfortunately, the combined thermal resistance of (i) the thermal resistance of interfacial boundary regions between one or more TIMs and the chip and/or the heat dissipation device(s), and (ii) the thermal resistance of a thermal interface material itself can inhibit heat transfer from the chip to the heat dissipation devices, undesirably reducing the cooling efficiency of the cooling system.

Generally speaking, there are multiple components between the heat dissipating sources (i.e., active circuitry) in the chips and the heat dissipation devices, each of which contributes to the system thermal resistance cumulatively along the heat transfer paths and raises chip junction temperatures from the ambient. Such cooling systems can suffer from reduced cooling efficiency due to the design and manufacture of system components.

Additionally, communication between electronic components on a server rack, and between server racks themselves, is generally provided by copper wires. Unfortunately, these copper wires suffer from problems such as heat dissipation (due to their intrinsic resistance to current), communication signal attenuation, and bandwidth loss. As data demands grow, copper-based Serializer/Deserializer (SerDes) circuitry, which connects switching application-specific integrated circuits (ASICs) to pluggable transceivers, may be used to enable faster transmission, but faster ASICs require improved copper connections through more channels or higher speeds. However, as link density and bandwidth increase, a significant portion of system power and cost is consumed by driving signals from the ASICs to optical interconnects at the edge of the rack. The size limitations of ASIC ball grid array (BGA) packages (e.g. due to warpage concerns), require higher SerDes speeds to support increased bandwidth. This also results in higher power consumption because greater channel loss occurs at higher frequencies. One solution could be systems in which copper wires are replaced by optical fibers for signal transmission, which consumes relatively less energy with faster transmission speeds and improved reliability. As opposed to copper, multiple wavelengths carrying different signals can be simultaneously sent on a single fiber; such parallel signals using the same wires is not possible in copper wires. Optical fibers that enables signal transmission via an alternative medium (i.e., light) therefore mitigate the issues inherent to copper wires. The placement of a photonic integrated circuit (PIC) inside an electrical package increases the possibility of thermal crosstalk. While the thermal power from heaters and laser sources in a photonic die will affect the temperature map of the electrical package, the heat generated in electrical dies and the cooling mechanism of the overall system will affect the thermal behavior of the PIC. A complete thermal analysis from die to system level is therefore needed.

Co-packaged optics (CPO) is an approach that aims to enable high performance computing and networks by addressing challenges around bandwidth density, communication latency, copper reach, and power efficiency datahungry networks by bringing key elements like optics and electronics needed for communication closer together. The primary application of CPOs is in front-end networks used for connecting servers in data centers. In order for signals to be transmitted optically, lasers or light emitting diodes (LEDs), such as micro LEDs, may be used to generate optical signals which propagate along the optical fibers. LEDs typically offer less bandwidth than lasers and are used with low bandwidth communication systems (e.g., operating up to about 250 MHz or around 200 Mb/s), whereas lasers are ideal for long distance high speed links (e.g., systems operating well over 10 GHz or 10 Gb/s). Common types of lasers used in optical communication systems include fabry-perot (F-P) lasers, distributed feedback (DFB) lasers, vertical cavity surface-emitting lasers (VCSELs), quantum dot lasers, etc. Transceivers (comprising an electronic integrated circuit (EIC) and a photonic integrated circuit (PIC)) may be used to convert between optical signals and electrical signals for compatibility with electronic circuitry. The placement of the PIC inside the electrical package increases the possibility of thermal crosstalk. While the thermal power from heaters (e.g., laser sources, LEDs, etc.) in the photonic die can affect the temperature map of the package, the heat generated in the electrical dies and the cooling mechanism of the overall system can affect the thermal behavior of the PIC. The optimal performance of lasers requires a narrow operating temperature range (for example, about 50° C. to 75° C.), and therefore lasers are susceptible to small temperature variations. For example, deviations from its optimal operating temperature range may shift the laser wavelength range outside of the designed wavelength range such that at least a part of the optical signal cannot be carried through the optical fiber. Upon processing by a transceiver, this may lead to an erroneous or attenuated electrical signal. Furthermore, any shift from the optimal operating temperature range may prevent the optical signal from being carried through the optical fiber resulting in shutdown of the system. Consequently, maintaining an operating temperature of a laser within an optimal temperature range is important to ensure correct operation is maintained.

In some systems, lasers may be integrated with high-performance devices with an optimum operating temperature in the range of 80° C. to 110° C. (e.g., central processing units (CPUs), graphical processing units (GPUs), neural processing unit (NPU), tensor processing unit (TPU), ASIC, high bandwidth memory (HBM), etc.). Cooling solutions for such systems are therefore shared between lasers and high-performance devices, across multiple servers sometimes spread across multiple server racks. A target temperature for the overall system may not be appropriate for specific devices, such as lasers which require a narrow operating temperature range, as discussed above. Moreover, if the high-performance devices operate while the laser devices are already at a lower end of their optimum operating temperature, the cooling solution may be triggered by the high-performance devices which could inadvertently cool the laser device to a temperature below the optimum range.

In some approaches, thermoelectric coolers (TECs) are attached to lasers to control the operating temperature (e.g., cooling or heating the laser using the Peltier effect). To do so, a TEC comprises two different materials connected by a metallic junction, between which a voltage difference is applied to either generate or absorb heat and create thermal flux or heat transfer between the two material based on the sign of the voltage difference applied. TECs are responsive and may be made of semiconductors and thus easily interfaced with electronic components. However, TECs present a large footprint (for example, 5×5 mm$^2$, or 10× 10 mm$^2$) compared to that of lasers (for example, 0.5×0.5 mm$^2$, or 2×2 mm$^2$).

Accordingly, there exists a need in the art for providing dedicated temperature control for specific components in a relatively small footprint.

SUMMARY

Embodiments herein provide integrated device cooling assemblies embedded in advanced device packages. Advantageously, the integrated device cooling assemblies provide a cold plate with separate upper and lower coolant channels to improve the efficiency with which heat can be transferred away from a heat source.

A first general aspect includes an integrated cooling assembly. In one embodiment, the integrated cooling assembly includes a semiconductor device and a cold plate attached to a backside of the semiconductor device. The cold plate includes an upper portion disposed vertically adjacent to the backside of the semiconductor device. The cold plate further includes a lower portion disposed between the upper portion of the cold plate and the backside of the semiconductor device. The upper portion comprises upper coolant channels defined by upper cavity sidewalls. The lower portion comprises lower coolant channels defined by lower cavity sidewalls.

In some embodiments of the first aspect, the integrated cooling assembly of the first general aspect may include the upper coolant channels separated from the lower coolant channels.

In some embodiments of the first aspect, the semiconductor device may be a first semiconductor device and the integrated cooling assembly may further comprise a second semiconductor device. The cold plate may be disposed between the first and second semiconductor devices.

In some embodiments of the first aspect, the cold plate includes a lower side facing the backside of the first semiconductor device and an upper side opposite the lower side. The lower side may be directly bonded to the backside of the first semiconductor device. The upper side may be directly bonded to a backside of the second semiconductor device.

In some embodiments of the first aspect, the upper coolant channels are separated from the lower coolant channels by the upper cavity sidewalls and the lower cavity sidewalls.

A second general aspect includes a device package including the integrated cooling assembly of the first general aspect. The device package includes a package substrate. The integrated cooling assembly is attached to the package substrate.

A third general aspect includes a method of manufacturing the integrated cooling assembly of the first general aspect. The method includes forming a first substrate comprising a cold plate. The cold plate includes upper cavity sidewalls defining upper coolant channels and lower cavity sidewalls defining lower coolant channels separated from the upper coolant channels. The method further includes directly bonding the cold plate to a second substrate comprising a semiconductor device.

A fourth general aspect includes another integrated cooling assembly. The integrated cooling assembly includes a first semiconductor device, a second semiconductor device, and a cold plate attached to a backside of the first semiconductor device. The cold plate is disposed between the first and second semiconductor devices. The cold plate includes a perimeter sidewall, an upper portion, a cavity divider, and coolant channels. The perimeter sidewall and the cavity divider extend downwardly from the upper portion towards the backside of the first semiconductor device to define the coolant channels therebetween.

BRIEF DESCRIPTION OF THE DRAWINGS

The above and other objects and advantages of the disclosure will be apparent upon consideration of the following detailed description, taken in conjunction with the accompanying drawings, in which:

FIG. 17 shows a method that can be used to manufacture the integrated cooling assembly described herein;

Figure 1:
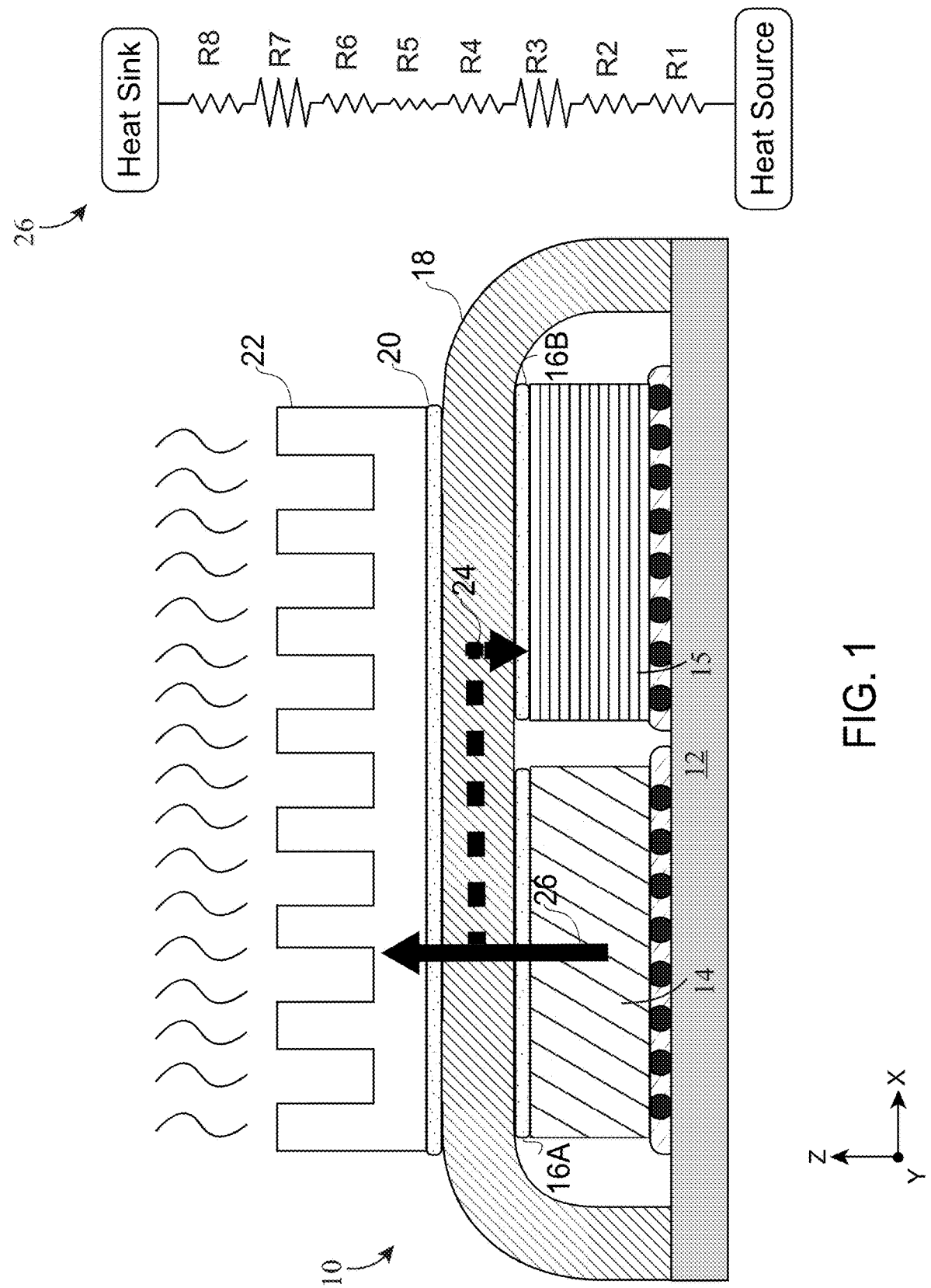
FIG. 1 illustrates a device package with an external heat sink.

The figures herein depict various embodiments of the present disclosure for purposes of illustration only. It will be appreciated that additional or alternative structures, assemblies, systems, and methods may be implemented within the principles set out by the present disclosure.

DETAILED DESCRIPTION

As used herein, the term "substrate" means and includes any workpiece, wafer, or article that provides a base material or supporting surface from which or upon which components, elements, devices, assemblies, modules, systems, or features of the heat-generating devices, packaging components, and cooling assembly components described herein may be formed or mounted. The term "substrate" also includes semiconductor substrates that provide a supporting material upon which elements of a semiconductor device are fabricated or attached, and any material layers, features, and/or electronic devices formed thereon, therein, or therethrough. Examples of substrate material that may be used in applications that generate high thermal density include, but are not limited to, Si, GaN, SiC, InP, GaP, InGaN, AlGaInP, AlGaAs, etc.

As described below, the semiconductor substrates herein generally have a "device side" e.g., the side on which semiconductor device elements are fabricated, such as transistors, resistors, and capacitors, and a "backside" that is opposite the device side. The term "active side" should be understood to include a surface of the device side of the substrate and may include the device side surface of the semiconductor substrate and/or a surface of any material layer, device element, or feature formed thereon or extending outwardly therefrom, and/or any openings formed therein. Thus, it should be understood that the material(s) that forms the active side may change depending on the stage of device fabrication and assembly. Similarly, the term "non-active side" (opposite the active side) includes the non-active side of the substrate at any stage of device fabrication, including the surfaces of any material layer, any feature formed thereon, or extending outwardly therefrom, and/or any openings formed therein. Thus, the terms "active side" or "non-active side" may include the respective surfaces of the semiconductor substrate at the beginning of device fabrication and any surfaces formed during material removal, e.g., after substrate thinning operations. Depending on the stage of device fabrication or assembly, the terms "active sides" and "non-active sides" are also used to describe surfaces of material layers or features formed on, in, or through the semiconductor substrate, whether or not the material layers or features are ultimately present in the fabricated or assembled device. For example, in some instances, the term "active side" is used to indicate a surface of a substrate that will in the future, but does not yet, include semiconductor device elements.

Spatially relative terms are used herein to describe the relationships between elements, such as the relationships between substrates, heat-generating devices, cooling assembly components, device packaging components, and other features described below. Unless the relationship is otherwise defined, terms such as "above," "over," "upper," "upwardly," "outwardly," "on," "below," "under," "beneath," "lower," "top," "bottom" and the like are generally made with reference to the X, Y, and Z directions set forth by X, Y and Z axes in the drawings. Thus, it should be understood that the spatially relative terms used herein are intended to encompass different orientations of the substrate and, unless otherwise noted, are not limited by the direction of gravity. Unless the relationship is otherwise defined, terms describing the relationships between elements such as "disposed on," "embedded in," "coupled to," "connected by," "attached to," "bonded to," and the like, either alone or in combination with a spatially relevant term, include both relationships with intervening elements and direct relationships where there are no intervening elements. Furthermore, the term "horizontal" is generally made with reference to the X-axis direction and the Y-axis direction set forth in the drawings. The term "vertical" is generally made with reference to the Z-axis direction set forth in the drawings.

Various embodiments disclosed herein include bonded structures in which two or more elements are directly bonded to one another without an intervening adhesive (referred to herein as "direct bonding" or "directly bonded"). The resultant bonds formed by this technique may be described as "direct bonds". In some embodiments, direct bonding includes the bonding of a single material on the first of the two or more elements and a single material on a second one of the two or more elements, where the single material on the different elements may or may not be the same. For example, bonding a layer of one inorganic dielectric (e.g., silicon oxide) to another layer of the same or different inorganic dielectric. As discussed in more detail below, the process of direct bonding (e.g., direct dielectric bonding) provides a reduction of thermal resistance between a semiconductor device and a cold plate. Examples of dielectric materials used in direct bonding include oxides, nitrides, oxynitrides, carbonitrides, and oxycarbonitrides, etc., such as, for example, silicon oxide, silicon nitride, silicon oxynitride, silicon carbonitride, silicon oxycarbonitride, etc. Direct bonding can also include bonding of multiple materials on one element to multiple materials on the other element (e.g., hybrid bonding). As used herein, the term "hybrid bonding" refers to a species of direct bonding having both i) at least one (first) nonconductive feature directly bonded to another (second) nonconductive feature, and ii) at least one (first) conductive feature directly bonded to another (second) conductive feature, without any intervening adhesive. The resultant bonds formed by this technique may be described as "hybrid bonds" and/or "direct hybrid bonds". In some hybrid bonding embodiments, there are many first conductive features, each directly bonded to a second conductive feature, without any intervening adhesive. In some embodiments, nonconductive features on the first element are directly bond to nonconductive features of the second element at room temperature without any intervening adhesive, which is followed by direct bonding of conductive features of the first element to conductive features of the second element via annealing at slightly higher temperatures (e.g., >100° C., >200° C., >250° C., >300° C., etc.)

Unless otherwise noted, the terms "cooling assembly" and "integrated cooling assembly" generally refer to a semiconductor device and a cold plate attached to the semiconductor device.

Typically, the cold plate is formed with recessed surfaces that define one or more fluid cavities (e.g., coolant chamber volume(s) or coolant channel(s)). In embodiments where the cold plate is formed with plural fluid cavities, each fluid cavity may be defined by cavity dividers and/or sidewalls of the cold plate. For example, cavity dividers may be spaced apart from each other and extend laterally between opposing cold plate sidewalls (e.g., in one direction between a first pair of opposing cold plate sidewalls, or in two directions between orthogonal pairs of opposing cold plate sidewalls). The cavity dividers and the cold plate sidewalls may collectively define adjacent fluid cavities therebetween. While it is preferred that the cold plate is formed of a material whose coefficient of linear thermal expansion (CTE) is the same as or similar to the bulk material of the semiconductor device, in some embodiments the cold plate may comprise one or more materials such as: polymer, copper, aluminum, silicon, glass, or ceramic, for example.

The cold plate may be attached to the semiconductor device by use of an adhesive layer or by direct bonding or hybrid bonding. Direct bonding may include direct dielectric bonding techniques as described herein, and may give rise to direct dielectric bonds. Hybrid bonding may include hybrid bonding techniques as described herein, and may give rise to direct hybrid bonds. For example, the cold plate may include material layers and/or metal features that facilitate direct bonding or hybrid bonding with the semiconductor device. In some embodiments, the backside of the semiconductor device is beneficially directly exposed to coolant fluids flowing through the integrated cooling assembly, thus providing for direct heat transfer therebetween. It will be understood that "coolant fluid" may alternatively be referred to as "cooling fluid". Unless otherwise noted, the cold plates described herein may be used with any desired fluid, e.g., liquid, gas, and/or vapor-phase coolants, such as water, glycol, etc. In some embodiments, the coolant fluid(s) may contain additives to enhance the conductivity of the coolant fluid(s) within the integrated cooling assemblies. The additives may comprise, for example, nanoparticles of various types, such as carbon nanotubes, graphene, and/or metal oxides. The concentration of these nanoparticles within the coolant fluid may be less than 1%, less than 0.2%, or less than 0.05%. The coolant fluids may also contain a small amount of glycol or glycols (e.g., propylene glycol, ethylene glycol, etc.) to reduce frictional shear stress and drag coefficient in the coolant fluid(s) within the integrated thermal control assembly or integrated cooling assembly. In some embodiments the coolant fluid may contain entirely glycol or glycols.

Exemplary fluids available for use in the various thermal solution embodiments include: water (either purified or deionized), a glycol (e.g., ethylene glycol, propylene glycol), glycols mixed with water (e.g., ethylene glycol mixed with water (EGW) or propylene glycol mixed with water (PGW)), dielectric fluids (e.g. fluorocarbons, polyalphaolefin (PAO), isoparaffins, synthetic esters, or very high viscosity index (VHVI) oils), or mineral oils. Additionally, depending upon design and operating conditions, these fluids may be used in single-phase liquid, single-phase vapor, two-phase liquid/vapor or two-phase solid/liquid. By adjusting the fluid selection and the relative fluid concentrations in the fluid mixtures, it is possible to alter the thermohydraulic and heat transfer properties by altering the temperatures where phase change occurs, enabling meeting design temperature and pressure conditions for the component being cooled or warmed and the thermal solution being deployed. Additionally, different combinations of the fluid phases may be employed in various hybrid configurations to meet the particular cooling or warming needs of a respective implementation and still be within the scope of the contemplated embodiments.

Additionally, in some embodiments part or all the cooling is provided by gases. Exemplary gases include atmospheric air and/or one or more inert gases such as nitrogen. Atmospheric air may be taken to mean the mixture of different gases in Earth's atmosphere made up of about 78% nitrogen and 21% oxygen.

Depending on the design needs of a thermal solution system using the disclosed embodiments, engineered dielectric coolant fluids may be used. As used herein, a dielectric coolant fluid is a fluid that is thermally conductive but not electrically conductive. Some examples of dielectric fluids used for cooling semiconductors include: 3M™ Fluorinert™ Liquid FC-40-A non-flammable, dielectric fluid that can be used in direct contact with live electronics; 3M™ Novec™ Engineered Fluids-A non-flammable, dielectric fluid that can be used in direct contact with live electronics; Galden® PFPE (perfluoropolyether) products used as heat transfer fluids; EnSolv Fluoro HTF-A solvent with a high boiling point and low pour point that can be used for semiconductor wafer cooling. It is understood that in the selection of the coolant fluid, system design aspects such as operating temperatures and pressures, fluid flow rates, fluid viscosity, and other properties will require evaluation when selecting the appropriate coolant fluid.

In some embodiments, the coolant fluids may contain microparticles and/or nano-particle additives to enhance the conductivity of the coolant fluid within the integrated cooling assemblies. Nanofluids are engineered fluids prepared by suspending the nano-sized (1-100 nm) particles of metals/non-metals and their oxide(s) with a base/conventional fluid. The suspension of high thermal conductivity metals/non-metals and their oxides nano-particles enhances the thermal conductivity and heat transfer ability, etc. of the base fluid. The additives to the underlying coolant fluid may comprise for example, nano-particles of carbon nanotube, nano-particles of graphene, or nano-particles of metal oxides. When the coolant fluid contains microparticles, the microparticles are typically 10 microns or less in diameter. Silicon oxide microparticles may be used.

The volume concentration of these micro or nano-particles within the coolant fluid may be less than 1%, less than 0.2%, or less than 0.05%. Depending upon the liquid and micro/nano-particle type chosen for the coolant fluid, higher volume concentrations of 10% or less, 5% or less, or 2% or less may be used. The coolant fluids may also contain small amounts of glycol or glycols (e.g. propylene glycol, ethylene glycol etc.) to reduce frictional shear stress and drag coefficient in the coolant fluid within the integrated thermal control assembly or integrated cooling assembly. The availability of different base fluids (e.g., water, ethylene glycol, mineral or other stable oils, etc.) and different nanomaterials provide a variety of nanomaterial options for nanofluid solutions to be used in the various embodiments. These nanomaterial option groups such as aforementioned metals (e.g., Cu, Ag, Fe, Au, etc.), metal oxides (e.g., $TiO_2$, $Al_2O_3$, CuO, etc.), carbons (e.g. CNTS, graphene, diamond, graphite . . . , etc.), or a mixture of different types of nanomaterials. Metal nano-particles (Cu, Ag, Au . . . ), metal oxide nano-particles ($Al_2O_3$, $TiO_2$, CuO), and carbon-based nano-particles are commonly employed elements. Silicon oxide nano-particles may also be used. Using coolant fluids with micro and/or nano-particles when practicing the various embodiments disclosed herein can result in increased heat removal efficiencies and effectiveness.

The fluid control design aspects of specific embodiments may require the nanofluids to be magnetic to facilitate either movement or cessation of movement of the fluids within the semiconductor structures. Magnetic nanofluids (MNFs) are suspensions of a non-magnetic base fluid and magnetic nano-particles. Magnetic nano-particles may be coated with surfactant layers such as oleic acid to reduce particle agglomeration and/or settling. Magnetic nano-particles used in MNFs are usually made of metal materials (ferromagnetic materials) such as iron, nickel, cobalt, as well as their oxides such as spinel-type ferrites, magnetite ($Fe_3O_4$), and so forth. The magnetic nano-particles used in MNFs typically range in size from about 1 to 100 nanometers (nm).

This disclosure describes embodiments involving the architecture of system and component elements that can be employed to provide for the cooling and/or heating of semiconductor components, packaging, and boards. However, those skilled in the art will appreciate the disclosed components and arrangements can be deployed and used in scenarios where component heat up or thermal warm up is desired for a component that is currently outside the low end of the desired operational range. Components that are outside the low end of their operational range can, if started in a cold environment, experience thermal warping or cracking up to and including thermal overexpansion and contact separation that may impair the successful operation of the system. Therefore, in these scenarios, the architectures and embodiments disclosed herein can be used where the indirect thermal solutions supporting them are repurposed or operated in a hybrid configuration to provide warming fluids or heat transfer media to accomplish the warm-up or heat-up scenario. These scenarios are controlled by systems not shown here to bring temperatures up at a speed or timing that enables the materials to avoid the excessive thermal expansion or unequal thermal expansion that may occur among the materials of the semiconductor or packaging being serviced by the thermal solution. Once the component or packaging is brought up into the normal operating range, it can be safely started and brought to a useful operational state.

Considering the warm-up or heat-up embodiments introduced above, the balance of this disclosure and terms used should be viewed in a light that also considers the design option for such warm-up or heat-up. Thus, where terms such as cooling channel, cooling chamber volume, and cooling port are used, for example, such terms could also be considered as a thermal control channel, a thermal control volume, or a thermal control port, respectively. A person of skill would understand that heat flux or heat transfer would go in a different direction, but the design concepts are similar and can be successfully employed in the various embodiments.

The term "adjacent" is taken to mean that two of more devices or components of the present disclosure are next to each other such one is above, below, or beside another. Furthermore, adjacent devices or components may be separated by intervening devices, components, or substrates while still being considered adjacent to one another. In the following disclosure, it will be understood that any two or more devices or components which are defined as being adjacent may alternatively be defined as "directly adjacent". Directly adjacent is taken to mean that at least two components or devices are contacting each other with no intervening component, device, or substrate therebetween.

In some embodiments, a cooling channel is a liquid cooling channel, and a liquid may flow through the liquid cooling channel. In some embodiments, the liquid may comprise a water and/or glycol (e.g., propylene glycol, ethylene glycol, and mixtures thereof).

As described below, coolant fluid flowing through a cold plate may be used to control the temperature of semiconductor devices. The fluid flowing across the surface of the semiconductor device absorbs heat and conducts heat away from the semiconductor device.

This disclosure includes embodiments involving optical communication using LED or laser devices (e.g., laser diodes) which have a narrow range of optimal operating temperatures. However, it will be understood that the embodiments described herein may equally be applied to other devices which have a narrow range of optical operating temperatures instead of laser devices. For example, certain embodiments may be applied to micro-electro-mechanical-systems (MEMS) devices in order to control the operating temperature to remain within a specific temperature range.

Examples of laser devices (e.g., laser diodes) of certain embodiments include: F-P lasers, DFB lasers, VCSELs, quantum dot lasers, double heterostructure lasers, quantum well lasers, quantum cascade lasers, and inter-band cascade lasers. It will be understood that such laser devices may be co-packaged as a photonic integrated circuit (PIC) that integrates multiple optical based components onto a single platform to perform functions related to the generation, manipulation and detection of light. Such PICs may include: a laser, an input coupler, an optical modulator, an optical waveguide, a photonic crystal, optical fibers, a photo diode, and an optical ring resonator.

FIG. 1 is a schematic side view of a device package 10 and a heat sink 22 attached to the device package 10. The device package 10 typically includes a package substrate 12, a first device 14, a device stack 15, a heat spreader 18, and first TIM layers 16A, 16B thermally coupling the first device 14 and the device stack 15 to the heat spreader 18. The device package 10 is thermally coupled to the heat sink 22 through a second TIM layer 20. The TIM layers 16A, 16B, 20 facilitate thermal contact between components in the device package 10 and between the device package 10 and the heat sink 22.

As heat flux density increases with increasing power density in advanced semiconductor devices, the cumulative thermal resistance of the system illustrated in FIG. 1 is increasingly problematic as heat cannot be dissipated quickly enough to allow semiconductor devices to run at optimal power. Consequently, the energy efficiency of semiconductor devices is reduced. Furthermore, heat is transferred between semiconductor devices within the device package 10, as shown with heat transfer path 24 (illustrated as a dashed line), where heat may be undesirably transferred from the first device 14 having a high heat flux, such as a central processing unit (CPU) or a graphical processing unit (GPU), to the device stack 15 having low heat flux, such as memory, through the heat spreader 18.

For example, as shown in FIG. 1, each device package component and the respective interfacial boundaries therebetween have a corresponding thermal resistance that forms heat transfer path 26 (illustrated by arrow 26 in FIG. 1). The right-hand side of FIG. 1 illustrates the heat transfer path 26 as a series of thermal resistances R1-R8 between a heat source and a heat sink. Here, R1 is the thermal resistance of the bulk semiconductor material of the first device 14. R3 and R7 are the thermal resistances of the first TIM layers 16A, 16B and the second TIM layer 20, respectively. R5 is the thermal resistance of the heat spreader 18. R2, R4, R6, and R8 represent the thermal resistance at the interfacial region of the components (e.g., contact resistances). In a typical cooling system, R3 and R7 may account for 80% or more of the cumulative thermal resistance of the heat transfer path 26, and R5 may account for 5% or more. R1 of the first device 14 and R2, R4, R6, and R8 of the interfaces account for the remaining cumulative thermal resistance. Accordingly, embodiments described herein provide for integrated cooling assemblies embedded within a device package. The embedded cooling assemblies shorten the thermal resistance path between a semiconductor device and a heat sink and reduce thermal communication between semiconductor devices disposed in the same device package, such as described in relation to the figures below.

Figure 2A:
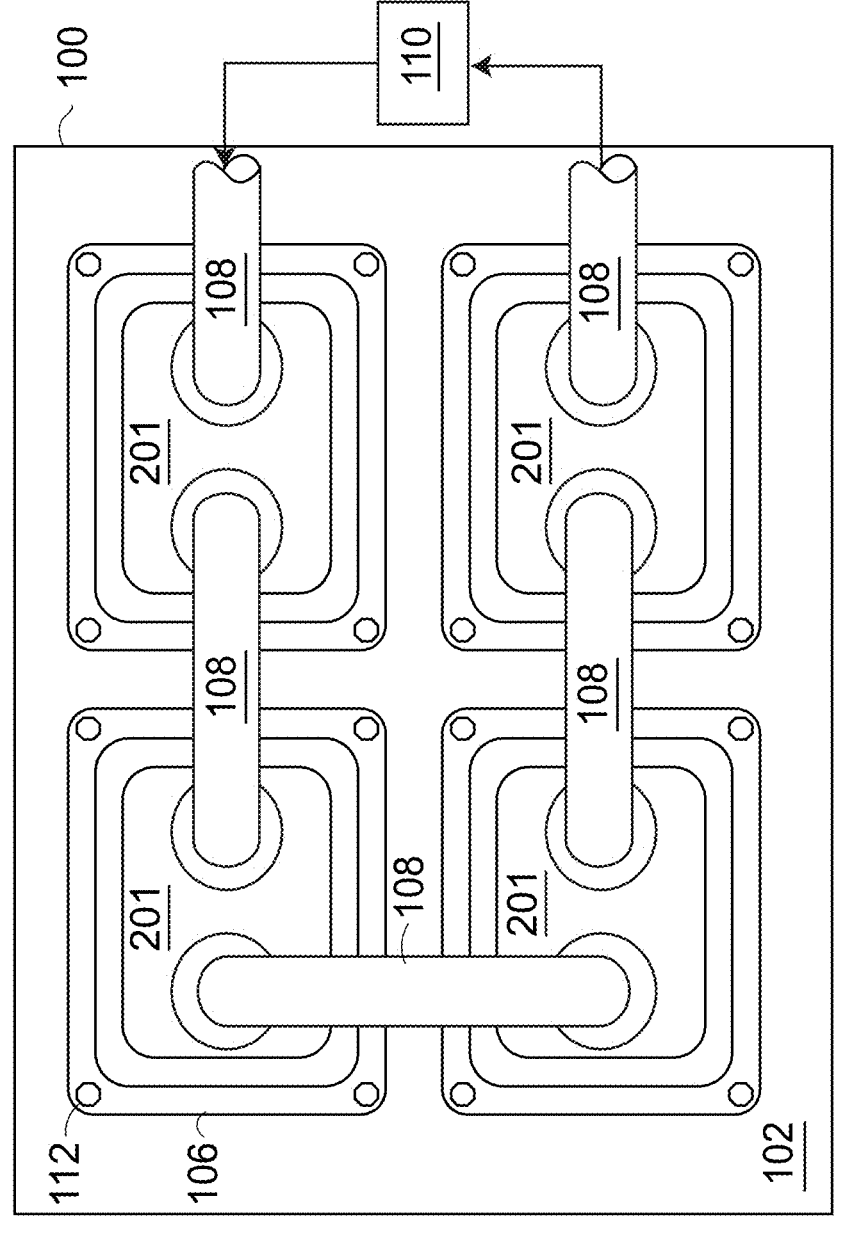
FIG. 2A is a schematic plan view of an example of a system panel, in accordance with embodiments of the present disclosure.

FIG. 2A is a schematic plan view of an example of a system panel 100, in accordance with embodiments of the present disclosure. Generally, the system panel 100 includes a PCB 102, a plurality of device packages 201 mounted to the PCB 102, and a plurality of coolant lines 108 fluidly coupling each of the device packages 201 to a coolant source 110. It is contemplated that coolant fluid may be delivered to each of the device packages 201 in any desired fluid phase, e.g., liquid, vapor, gas, or combinations thereof, and may flow out from each device package 201 in the same phase or a different phase. In some embodiments, the coolant fluid is delivered to the device packages 201 and returned therefrom as a liquid, whereby the coolant source 110 may comprise a heat exchanger or chiller to maintain the coolant fluid at a desired temperature. In other embodiments, the coolant fluid may be delivered to the device packages 201 as a liquid, vaporized to a vapor within the device packages 201, and returned to the coolant source 110 as a vapor. In those embodiments, the device packages 201 may be fluidly coupled to the coolant source 110 in parallel, and the coolant source 110 may include or further include a compressor (not shown) for condensing the received vapor to a liquid form.

Figure 2B:
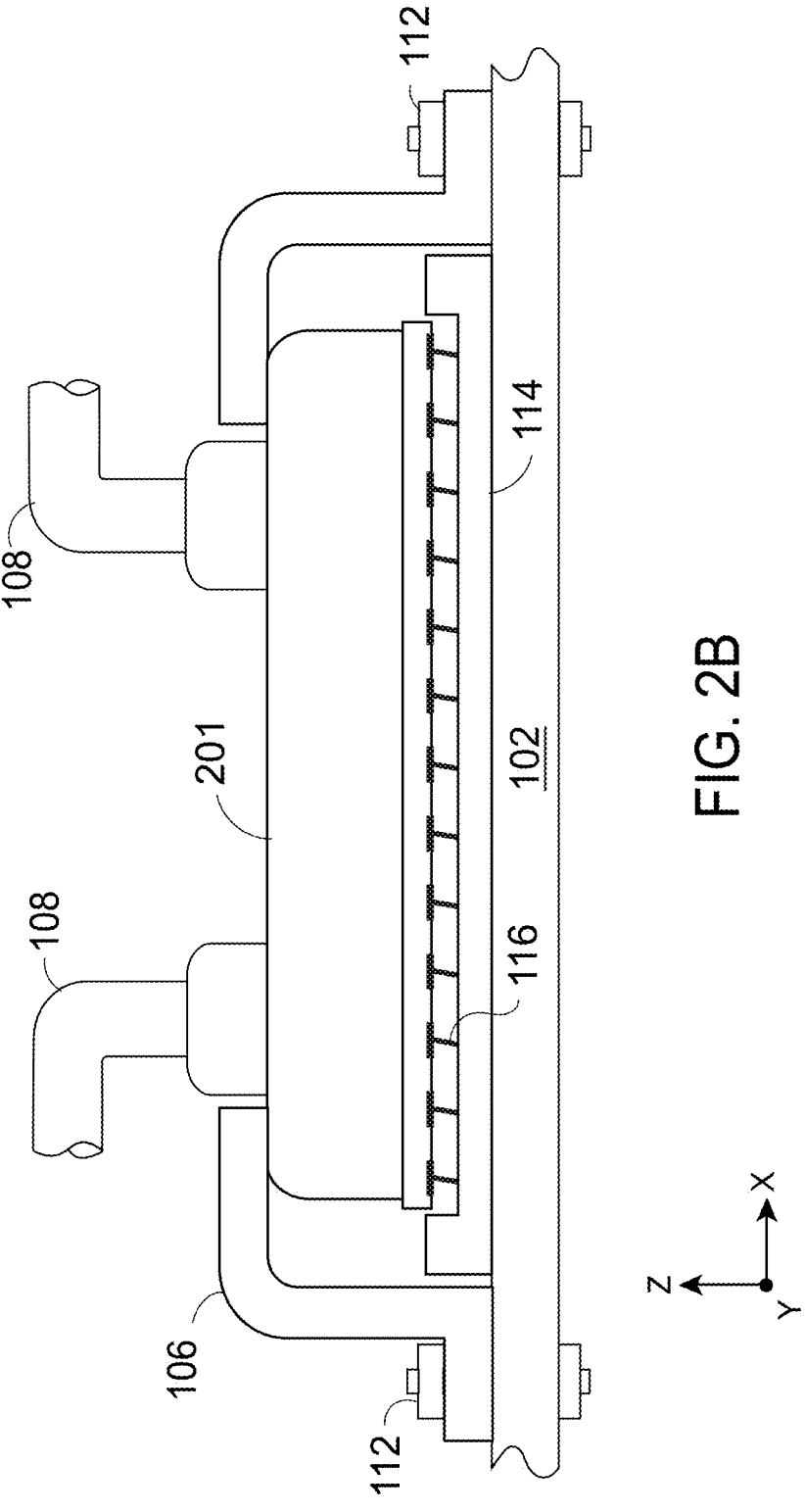
FIG. 2B is a schematic partial side view of a device package mounted on a printed circuit board (PCB), in accordance with embodiments of the present disclosure.

FIG. 2B is a schematic partial sectional side view of a portion of the system panel 100 of FIG. 2A. As shown, each device package 201 is fluidly coupled to the plurality of coolant lines 108 and is disposed in a socket 114 of the PCB 102 and connected thereto using a plurality of pins 116, or by other suitable connection methods, such as solder bumps (not shown). The device package 201 may be seated in the socket 114 and secured to the PCB 102 using a mounting frame 106 and a plurality of fasteners 112, e.g., compression screws, collectively configured to exert a relatively uniform downward force on the upward facing edges of the device package 201. The uniform downward force ensures proper pin contact between the device package 201 and the socket 114.

Figure 2C:
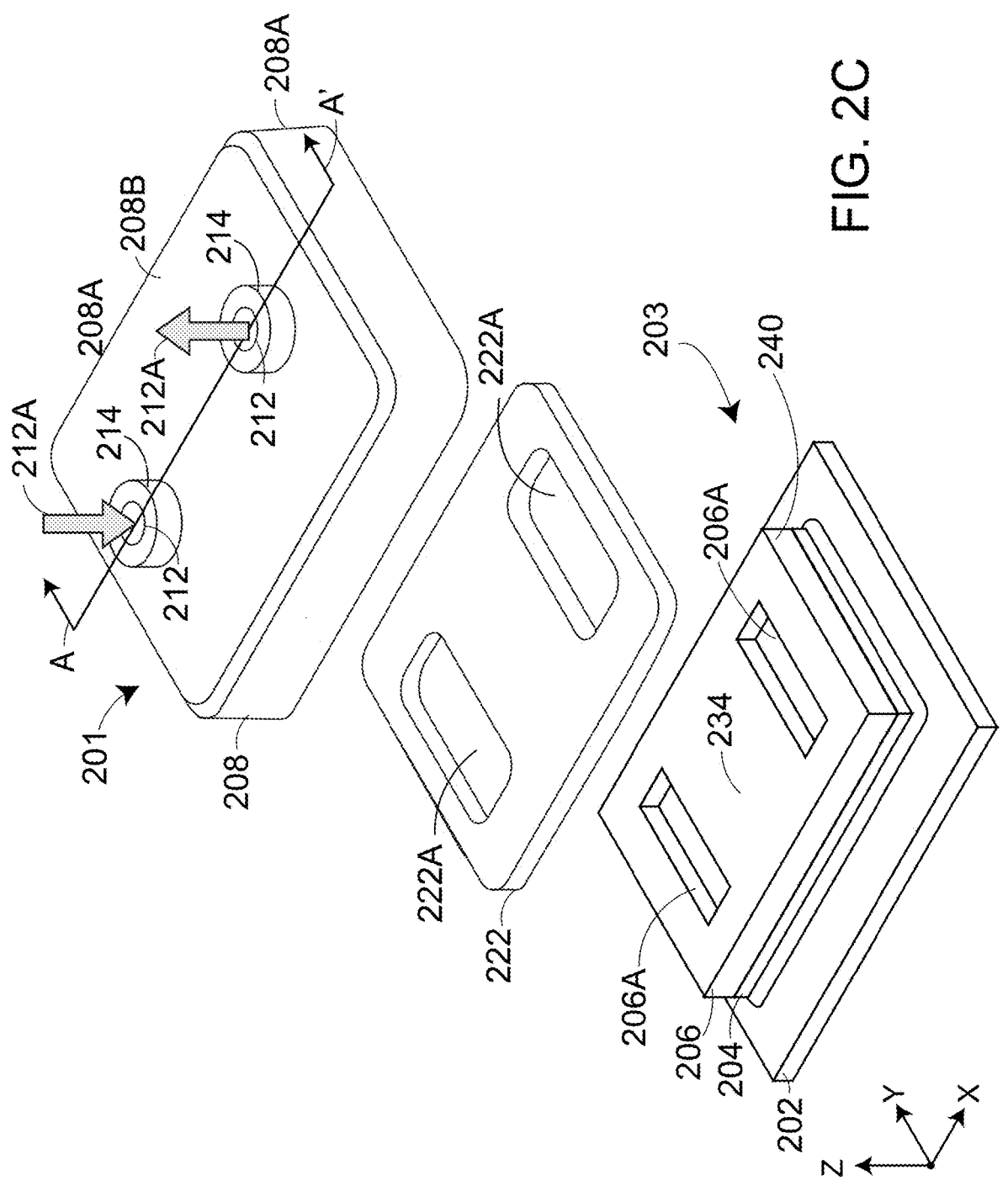
FIG. 2C is a schematic exploded isometric view of the device package in FIG. 2B.

FIG. 2C is a schematic exploded isometric view of an example device package 201, in accordance with embodiments of the present disclosure. Generally, the device package 201 includes a package substrate 202, an integrated cooling assembly 203 disposed on the package substrate 202, and a package cover 208 disposed on a peripheral portion of the package substrate 202. Suitable materials that may be used in the package cover 208 include copper, aluminum, metal alloys, etc. The package cover 208 extends over the integrated cooling assembly 203 so that the integrated cooling assembly 203 is disposed between the package substrate 202 and the package cover 208. The integrated cooling assembly 203 typically includes a semiconductor device 204 and a cold plate 206 bonded to the semiconductor device 204. Although the lateral dimensions (or footprint) of the cold plate 206 are shown to be the same or similar to the lateral dimensions (or footprint) of the semiconductor device 204, the footprint of the cold plate 206 may be smaller or larger in one or both directions when compared to the footprint of the semiconductor device 204.

As shown, the device package 201 further includes a sealing material layer 222 that forms a coolant fluid impermeable barrier between the package cover 208 and the integrated cooling assembly 203 that prevents leaking of the coolant fluid outside of the cooling assembly and prevents coolant fluid from reaching an active side 218 (discussed below in relation to FIG. 3) of the semiconductor device 204 and causing damage thereto. In some embodiments, the sealing material layer 222 comprises an adhesive material that reliably attaches the package cover 208 to the integrated cooling assembly 203. In some embodiments, the sealing material layer 222 comprises a polymer or epoxy material that extends upwardly from the package substrate 202 to encapsulate and/or surround at least a portion of the semiconductor device 204. In some embodiments, the sealing material layer 222 may also comprise conductive material, e.g., solder. In other embodiments, the sealing material layer 222 is formed from a molding compound, e.g., a thermoset resin, that when polymerized, forms a hermetic seal between the package cover 208 and the cold plate 206. Here, the coolant fluid is delivered to the cold plate 206 through openings 222A disposed through the sealing material layer 222. As shown, the openings 222A are respectively in registration and fluid communication with inlet and outlet openings 212 of the package cover 208 thereabove and inlet and outlet openings 206A in the cold plate 206 therebelow.

It will be understood that the openings are shown in a section view. The openings may have any cross-sectional shape that allows fluid to flow therethrough (e.g., rectangular, square, hexagonal or circular cross-sections). For example, the inlet and outlet openings 206A of the cold plate 206 may form an elongated shape extending from one side of the cold plate 206 to another side of the cold plate 206. For example, the inlet and outlet openings 206A may form any shape having a length greater than a width in the X-Y plane (e.g., a rectangular or a trapezoidal shape). A shape in the X-Y plane of the openings 222A disposed through the sealing material layer 222 may be substantially the same as the shape of the inlet and outlet openings 206A of the cold plate 206 in the same place. Furthermore, it will be understood that references to an opening throughout the present disclosure refer to an opening defined by a sidewall (e.g., opening sidewall), unless otherwise indicated.

In some embodiments, gaps formed between the inside walls of the package cover 208 and the integrated cooling assembly 203 may be filled (partially or completely) with a molding material 223. The molding material 223 may encapsulate the integrates cooling assembly 203 to improve structural stability, for example.

The package substrate 202 can include a rigid material, such as an epoxy or resin-based laminate, that supports the integrated cooling assembly 203 and the package cover 208. The package substrate 202 may include conductive features disposed in or on the rigid material that electrically couples the integrated cooling assembly 203 to a system panel, such as the PCB 102.

Figure 3:
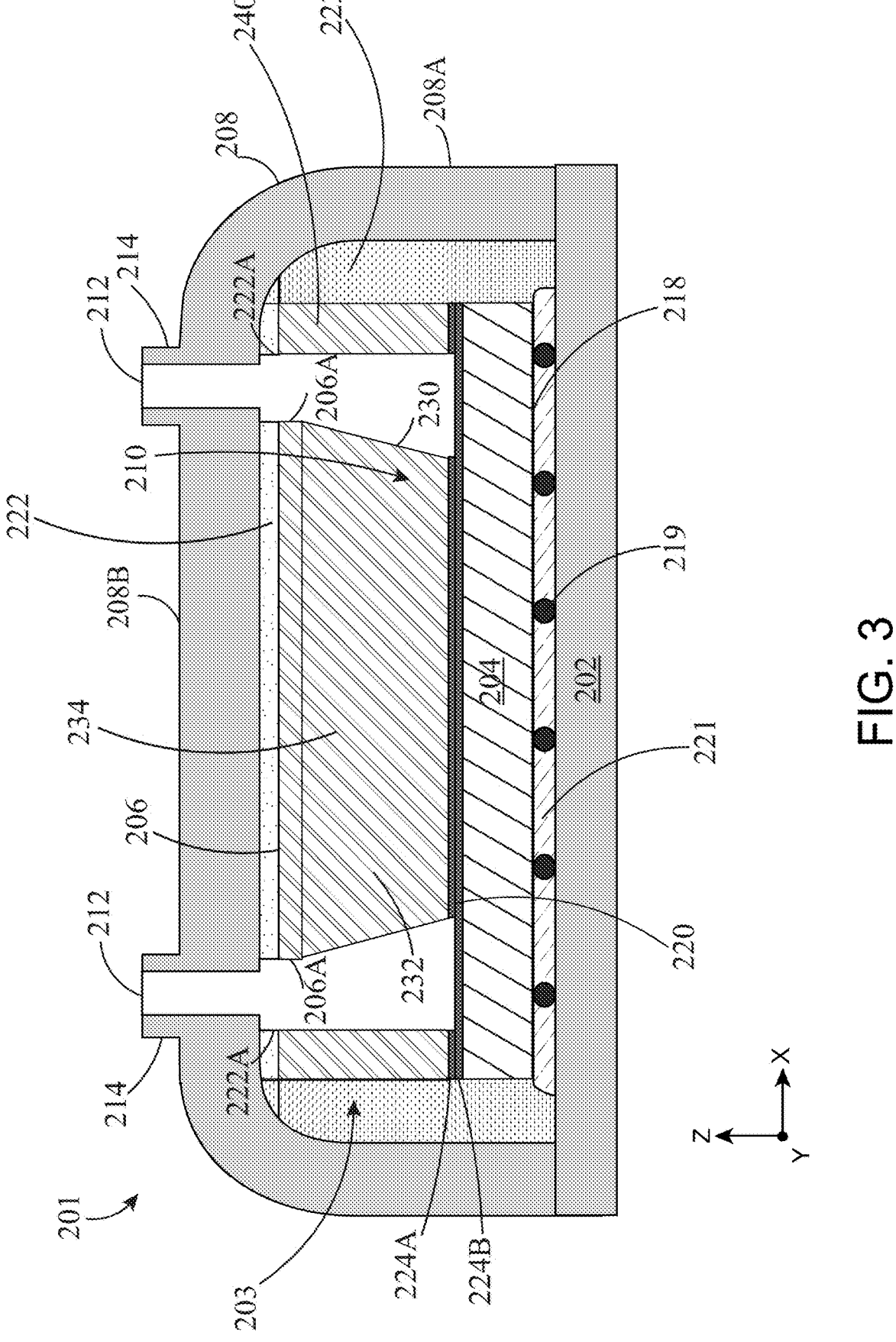
FIG. 3 is a schematic sectional view of an example device package, in accordance with embodiments of the present disclosure, that may be used with the system panel.

FIG. 3 is a schematic sectional view in the X-Z plane of the device package 201 taken along line A-A' of FIG. 2C. As illustrated in FIG. 3, the semiconductor device 204 includes the active side 218 that includes device components, e.g., transistors, resistors, and capacitors, formed thereon or therein, and a non-active side, here the semiconductor device backside 220, opposite the active side 218. As shown, the active side 218 is positioned adjacent to and facing towards the package substrate 202. The active side 218 may be electrically connected to the package substrate 202 by use of conductive bumps 219, which are encapsulated by a first underfill layer 221 disposed between the semiconductor device 204 and the package substrate 202. The first underfill layer 221 may comprise a cured polymer resin or epoxy, which provides mechanical support to the conductive bumps 219 and protects against thermal fatigue.

In some embodiments, the active side 218 may be electrically connected to another package substrate, another active die, or another passive die (e.g., interposer) using hybrid bonding or conductive bumps 219. For example, the package substrate 202 may be a semiconductor substrate, a semiconductor interposer, a glass substrate, a glass interposer, a PCT or a combination thereof. The cold plate 206 may be disposed above the package substrate 202 with the semiconductor device 204 disposed therebetween. For example, the semiconductor device 204 (and the first underfill layer 221) may be disposed between the cold plate 206 and the package substrate 202. In some embodiments, the cold plate 206 may be disposed directly on the package substrate 202.

Figure 4:
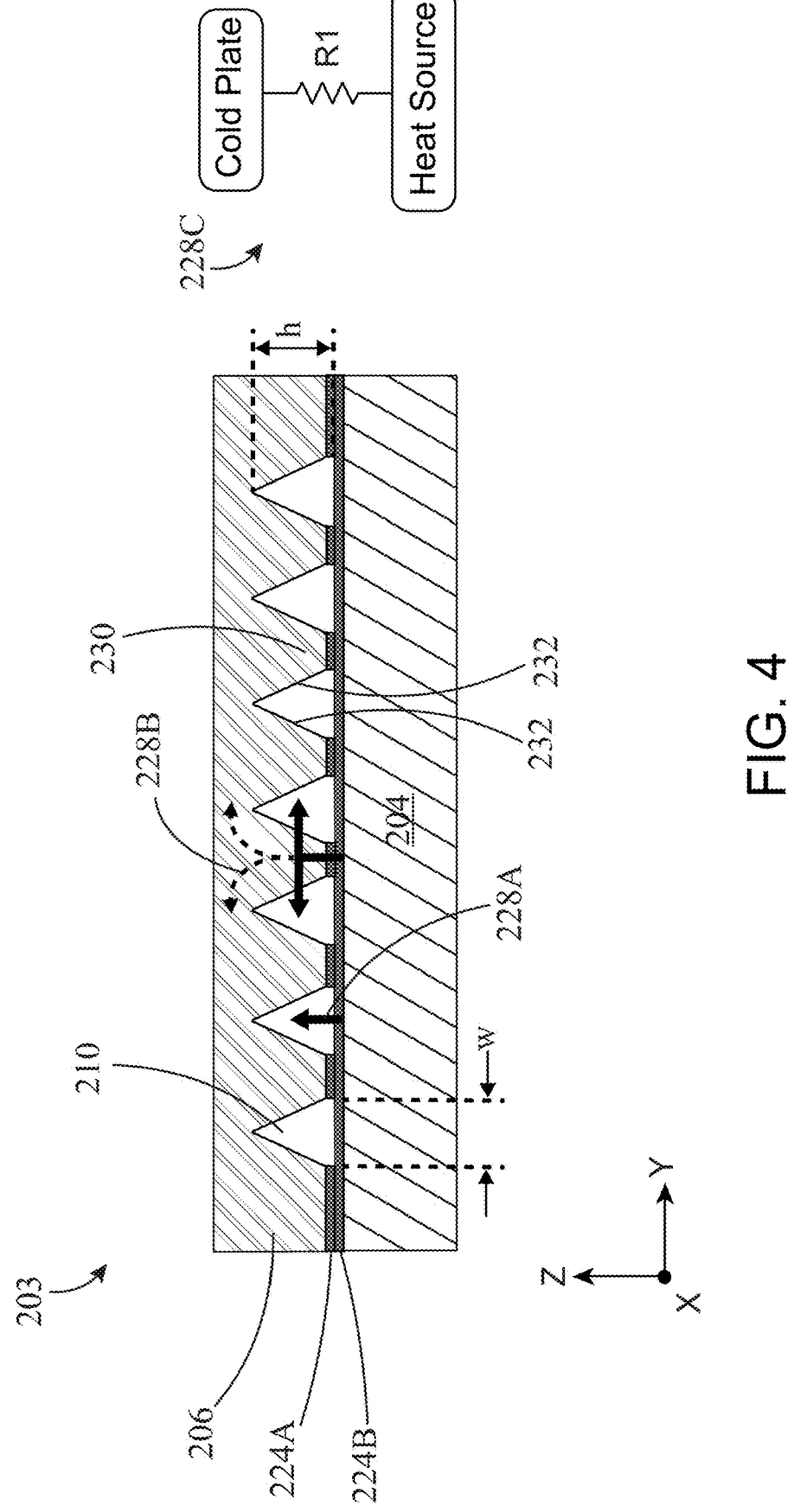
FIG. 4 is a schematic sectional view of an integrated cooling assembly of a device package, in accordance with embodiments of the present disclosure.

Here, the cold plate 206 comprises a upper portion 234 and a sidewall 240 (e.g., a perimeter sidewall defining a perimeter of the cold plate 206) extending downwardly from the upper portion 234 to the backside 220 of the semiconductor device 204. The upper portion 234, the perimeter sidewall 240, and the backside 220 of the semiconductor device 204 collectively define a coolant channel 210 therebetween. The cold plate 206 comprises cavity dividers 230 extending downwardly from the upper portion 234 towards the backside 220 of the semiconductor device 204. The cavity dividers 230 may alternatively be referred to as support features 230, which provide structural support to the integrated cooling assembly 203. The cavity dividers 230 may extend laterally and in parallel between an inlet opening 206A of the cold plate 206 and an outlet opening 206A of the cold plate 206 to define plural coolant channels 210 therebetween. It should be appreciated that, the cold plate 206 may comprise one cavity divider 230 which forms two coolant channels (e.g., one coolant channel on either side of the cavity divider 230) by means of the cavity divider 230 and portions of the perimeter sidewall 240. More specifically, coolant channels 210 may be formed between the cavity divider 230 and a portion of the perimeter sidewall 240 extending parallel to or in the same general direction as the cavity divider 230. Alternatively, in other embodiments, the cold plate 206 may comprise plural cavity dividers 230, for example two cavity dividers, five cavity dividers, or six cavity dividers (as illustrated in FIG. 4). In such examples, the cold plate 206 comprises more than two coolant channels 210, for example three coolant channels, four coolant channels, seven coolant channels, or more, defined between cavity dividers 230 and/or the cavity divider(s) 230 and the perimeter sidewall 240. In some embodiments, at least one of the cavity dividers 230 may extend discontinuously between the inlet opening 206A and the outlet opening 206A (in the X-axis direction) to form a discontinuous cavity divider. A discontinuous cavity divider may be formed of plural segments between which coolant fluid may flow. The segments of a discontinuous cavity divider may have the same or different lengths in the X-axis direction. One or more segments may form a post.

The cavity dividers 230 comprise cavity sidewalls 232 which form surfaces of corresponding coolant channels 210. In embodiments where plural cavity dividers 230 extend in parallel to each other, cavity sidewalls 232 of adjacent cavity dividers 230 are opposite (e.g., facing) each other. In embodiments comprising a single cavity divider 230, a first cavity sidewall may be opposite (e.g., face) a first portion of the perimeter sidewall 240 extending parallel to and facing the first cavity sidewall. A second cavity sidewall may be opposite (e.g., face) a second portion of the perimeter sidewall 240 extending parallel to and facing the second cavity sidewall. The first portion of the perimeter sidewall 240 may be an opposite side of the cold plate 206 to the second portion of the perimeter sidewall 240. For example, in embodiments where the cold plate 206 is rectangular, first and second opposing sides of the rectangular cold plate 206 form the first and second portions of the perimeter sidewall 240.

The cavity dividers 230 may be continuous cavity dividers which extend continuously (e.g., in the X-axis direction) between the inlet opening 206A and the outlet opening 206A of the cold plate 206.

With reference to FIG. 3, coolant channels 210 may be defined by:

the backside 220 of the semiconductor device 204, which forms lower coolant channel surfaces;

portions of the perimeter sidewall 240 extending in the Y-axis direction, which form end surfaces of the coolant channels 210;

the cavity sidewalls 232, which form inner surfaces of the coolant channels 210 in the X-axis direction; and portions of the perimeter sidewall 240 extending in the X-axis direction, which form outer surfaces of the coolant channels 210 in the X-axis direction.

As shown in FIG. 4 and described in further detail below, the cavity sidewalls 232 can be formed at an acute angle with respect to the backside 220 of the semiconductor device 204 such that upper portions of opposing (e.g., facing) cavity sidewalls 232 meet. Therefore, the cavity sidewalls 232 and the backside 220 of the semiconductor device 204 collectively define a triangular cross-section of the coolant channel 210. However, it will be understood that the coolant channel 210 may be formed with different shaped cross-sections. For example, one or more coolant channels may be formed with trapezoidal, rectangular, or semi-circular cross-section, or a combination thereof.

In some embodiments, the backside 220 of the semiconductor device 204 comprises a corrosion protective layer (not shown). The corrosion protective layer may be a continuous layer disposed across the entire backside 220 of the semiconductor device 204, such that the cold plate 206 is attached thereto. Beneficially, the corrosion protective layer provides a corrosion-resistant barrier layer, thus preventing undesired corrosion of the semiconductor device 204 (e.g., the semiconductor substrate material which might otherwise be in direct contact with coolant fluid flowing through a coolant chamber volume 210).

One or more coolant chamber volumes may include one or more coolant channels. The coolant channels may extend between a single inlet opening and a single outlet opening of the cold plate 206, such that the coolant chamber volume(s) and/or coolant channel(s) share the same inlet and outlet openings. In other embodiments, multiple inlet and/or outlet openings may be coupled to the coolant chamber volume(s).

In embodiments having plural coolant chamber volumes and/or plural coolant channels, each coolant chamber volume and/or coolant channel may be connected between a separate inlet opening and a separate outlet opening. In such embodiments, the coolant fluid may be directed to the separate inlet openings and from the separate outlet openings using a manifold disposed above the openings in the Z-axis direction. In some embodiments, a gasket may be used to seal a gap between the manifold and the cold plate inlet/outlet openings. The gasket may be made of rubber (e.g., neoprene, nitrile, ethylene propylene diene monomer, or silicon rubber) or similar such material. For example, the gasket may be an o-ring. The gasket may be attached between a lower surface of the manifold and an upper surface of the cold plate facing the manifold using an adhesive. The gasket may provide a water tight seal to direct coolant fluid from the manifold into the cold plate inlet/outlet openings while preventing coolant fluid from leaking onto exterior surfaces of the integrated cooling assembly 203. In some embodiments, the manifold is attached to one or more cold plates using one or more corresponding gaskets.

Referring to FIG. 4, a height h in the Z-axis direction of the coolant chamber volume(s) and or coolant channel(s) may be greater than 100 μm, 100 μm-1000 μm, or 100 μm-700 μm. A width w in the Y-axis direction of each coolant channel 210 may be greater than 100 μm, 100 μm-1000 μm, or 100 μm-700 μm. For example, the width w of each coolant channel 210 may be greater than the height h thereof. In some embodiments, the width w of a coolant channel 210 may, at the widest portion, which may be taken as a base of the triangular shape of the coolant chamber channels 210 shown in FIG. 4, range from 0.2 mm to 5 mm. More specifically, the width w of a coolant channel 210 may range from 0.5 to 1.5 mm. The width w of a coolant channel 210 may also be between 1 and 5 mm.

A cross-section of a coolant channel 210 in the Y-Z plane may be wide enough to allow for a pressure drop of 0-20 psi, 3-15 psi, or 4-10 psi.

In some embodiments, preparing a desired surface roughness of the sidewalls of each coolant channel 210 may include depositing an organic layer on a photoresist layer after cold plate features have been etched to form a micro-masking layer, such as between 1 to 30 nm. The micro-masking layer may be dry etched to form the desired surface roughness, such as between 0.1 to 3.0 nm. Advantageously, providing sidewalls with surface roughness increases the likelihood of fluid being directed towards and contacting the backside 220 of the semiconductor device 204 (e.g., by disrupting a hydrodynamic boundary layer of fluid between the sidewall and the coolant fluid).

With reference to FIG. 3, the cold plate 206 is attached to the backside 220 of the device 204 without the use of an intervening adhesive. For example, the cold plate 206 may be directly bonded to the backside 220 of the device 204, such that the cold plate 206 and the backside 220 of the device 204 are in direct contact. For example, in some embodiments, one or both of the cold plate 206 and the backside 220 of the semiconductor device 204 may comprise a dielectric material layer, e.g., a first dielectric material layer 224A and a second dielectric material layer 224B respectively, and the cold plate 206 is directly bonded to the backside 220 of the semiconductor device 204 through bonds formed between the dielectric material layers 224A, 224B. In some embodiments, one of the cold plate 206 or the backside 220 of the semiconductor device 204 may comprise a thin bonding dielectric layer (e.g., silicon nitride, etc.) and other element(s) may not include any such explicit bonding dielectric layer (or can have only a native oxide layer). The first and second dielectric material layers 224A, 224B may be continuous or non-continuous. For example, the first dielectric material layer 224A may be disposed only on lower surfaces of the cold plate 206 facing the backside 220 of the semiconductor device 204. With reference to FIG. 4, described below, portions of the first dielectric material layer 224A may be disposed only on lower surfaces of the cavity dividers 230 (e.g. support features 230) and the perimeter sidewall 240. Beneficially, directly bonding the cold plate 206 to the semiconductor device 204, as described above, reduces the thermal resistance therebetween and increases the efficiency of heat transfer from the semiconductor device 204 to the cold plate 206. In particular, thermal resistance is reduced by directly bonding lower surfaces of the cavity dividers 230 facing the semiconductor device 204 to the backside 220 of the semiconductor device 204.

FIG. 4 is a schematic sectional view in the Y-Z plane of the integrated cooling assembly 203. In FIG. 4, the cold plate 206 comprises a patterned side that faces towards the semiconductor device 204 and an opposite side that faces towards the package cover 208 (not shown). The patterned side comprises a coolant chamber volume having plural coolant channels 210, which extend laterally (along the X-axis direction in FIG. 4) between the inlet and outlet openings of the cold plate 206. Each coolant channel 210 comprises cavity sidewalls that define a corresponding coolant channel 210. Portions of the cold plate 206 between the cavity sidewalls 232 form the support features 230 (e.g., cavity dividers 230). The support features 230 (e.g., cavity dividers 230) provide structural support to the integrated cooling assembly 203 and disrupt laminar fluid flow (e.g., due to surface roughness of the sidewalls) at the interface of the coolant and the device backside 220, resulting in increased heat transfer therebetween. Furthermore, by introducing plural coolant channels 210 to define separate coolant flow paths, an internal surface area of the cold plate 206 is increased, which further increases the efficiency of heat transfer.

In FIG. 4, arrows 228A and 228B illustrate two different heat transfer paths in the integrated cooling assembly 203. A first heat transfer path illustrated by arrow 228A shows heat generated by the semiconductor device 204 transferring directly from the semiconductor material of the semiconductor device 204 to coolant fluid flowing through the cold plate 206. A second heat transfer path illustrated by arrows 228B shows heat generated by the semiconductor device 204 being transferred from semiconductor material (e.g., silicon material) of the semiconductor device 204 to semiconductor material (e.g., silicon material) of the cold plate 206 structure, propagated throughout the semiconductor material of the cold plate 206 structure (shown as dashed lines), and being transferring into coolant fluid flowing through the cold plate 206. A thermal resistance of the first and second heat transfer paths 228A, 228B is illustrated by heat transfer path 228C, which is shown as thermal resistance R1 between a heat source and a cold plate. Here, R1 is the thermal resistance of the bulk semiconductor material of the semiconductor device 204. It can be seen that the heat transfer path 228C of the integrated cooling assembly 203 is reduced compared to the heat transfer path 26 of the device package 10 of FIG. 1, due to the direct bonding discussed above.

In some embodiments, the cold plate 206 may be attached to the semiconductor device 204 using a hybrid bonding technique, where bonds are formed between the dielectric material layers 224A, 224B and between metal features, such as between first metal pads and second metal pads, disposed in the dielectric material layers 224A, 224B. Advantageously, by using hybrid bonding techniques, interconnections may be formed between the cold plate 206 and the semiconductor device 204 using the first and second metal pads.

Suitable dielectrics that may be used as the dielectric material layers 224A, 224B include silicon oxides, silicon nitrides, silicon oxynitrides, silicon carbon nitrides, metaloxides, metal-nitrides, silicon carbide, silicon oxycarbides, silicon oxycarbonitride, diamond-like carbon (DLC), or combinations thereof. In some embodiments, one or both of the dielectric material layers 224A, 224B are formed of an inorganic dielectric material, e.g., a dielectric material substantially free of organic polymers. Typically, one or both of the dielectric layers are deposited to a thickness greater than the thickness of a native oxide, such as about 1 nanometer (nm) or more, 5 nm or more, 10 nm or more, 50 nm or more, or 100 nm or more. In some embodiments, one or both of the layers are deposited to a thickness of 3 micrometers or less, 1 micrometer or less, 500 nm or less, such as 100 nm or less, or 50 nm or less. The dielectric layer material and thickness may be optimized for lower thermal resistance between the semiconductor device and the cold plate.

The cold plate 206 may be formed of any suitable material that has sufficient structural strength to withstand the desired pressures of coolant flowing into the coolant chamber volume 210. For example, the cold plate 206 may be formed of semiconductor material like silicon or other materials like glass. In other examples, the cold plate 206 may be formed of a material selected from a group comprising polymers, metals, ceramics, or composites thereof. In some embodiments, the cold plate 206 may be formed of stainless steel (e.g., from a stainless steel metal sheet) or a sapphire plate.

In some embodiments, the cold plate 206 may be formed of a bulk material having a substantially similar CTE to the bulk material of the substrate 202 and/or the semiconductor device 204, where the CTE is a fractional change in length of the material (in the X-Y plane) per degree of temperature change. In some embodiments, the CTEs of the cold plate 206, the substrate 202, and/or the semiconductor device 204 are matched so that the CTE of the substrate 202 and/or the semiconductor device 204 is within about +/−20% or less of the CTE of the cold plate 206, such as within +/−15% or less, within +/−10% or less, or within about +/−5% or less when measured across a desired temperature range. In some embodiments, the CTEs are matched across a temperature range from about −60° C. to about 100° C. or from about −60° C. to about 175° C. In one example embodiment, the matched CTE materials each include silicon.

In some embodiments, the cold plate 206 may be formed of a material having a substantially different CTE from the semiconductor device 204, e.g., a CTE mismatched material. In such embodiments, the cold plate 206 may be attached to the semiconductor device 204 by a compliant adhesive layer (not shown) or a molding material that absorbs the difference in expansion between the cold plate 206 and the semiconductor device 204 across repeated thermal cycles.

The package cover 208 shown in FIGS. 2C and 3 generally comprises one or more vertical or sloped sidewall portions 208A and a lateral portion 208B that spans and connects the sidewall portions 208A. The sidewall portions 208A may extend upwardly from a peripheral surface of the package substrate 202 to surround the device 204 and the cold plate 206 disposed thereon. The lateral portion 208B may be disposed over the cold plate 206 and is typically spaced apart from the cold plate 206 by a gap corresponding to the thickness of the sealing material layer 222. The sealing material may be an adhesive or a gasket. In some embodiments, instead of or as well as the sealing material layer 222, a gasket may be used to seal a gap between the package cover 208 and the cold plate inlet/outlet openings. The gasket may be made of rubber (e.g., neoprene, nitrile, ethylene propylene diene monomer, or silicon rubber) or similar such material. For example, the gasket may be an o-ring. The gasket may be attached between a lower surface of the package cover 208 and an upper surface of the cold plate facing the package cover 208 using an adhesive. The gasket may provide a water tight seal to direct coolant fluid from the package cover 208 into the cold plate inlet/outlet openings while preventing coolant fluid from leaking onto exterior surfaces of the integrated cooling assembly 203. In some embodiments, the package cover 208 is attached to one or more cold plates using one or more corresponding gaskets.

Coolant is circulated through the coolant channels 210 through the inlet and outlet openings 212 of the package cover 208 formed through the lateral portion 208B. The inlet and outlet openings 206A of the cold plate 206 may be in fluid communication with the inlet and outlet openings 212 of the package cover 208 through the inlet and outlet openings 222A formed in the sealing material layer 222 disposed therebetween. In certain embodiments, coolant lines 108 (FIGS. 2A-2B) may be attached to the device package 201 by use of connector features formed in the package cover 208, such as threads formed in the sidewalls of the inlet and outlet openings 212 of the package cover 208 and/or protruding features 214 that surround the inlet and outlet openings 212 and extend upwardly from a surface of the lateral portion 208B.

Typically, the package cover 208 is formed of semi-rigid or rigid material so that at least a portion of the downward force exerted on the package cover 208 by the mounting frame is transferred to a supporting surface of the package substrate 202 and not transferred to the cold plate 206 and the semiconductor device 204 therebelow. In some embodiments, the package cover 208 is formed of a thermally conductive metal, such as aluminum or copper. In such embodiments, the package cover 208 functions as a heat spreader that redistributes heat from one or more electronic components of the semiconductor device 204. In some embodiments, the package cover 208 and/or a manifold (such as the manifold discussed above) may consist of or comprise a thermally insulating material or materials. In such embodiments, the package cover 208 and/or the manifold may function as a thermal insulator to retain heat or cold. In some embodiments, the package cover 208 and/or the manifold may be insulating to minimize or reduce the flow of thermal energy (e.g., thermal flux) between components (e.g., semiconductor devices, semiconductor device stacks, device packages, etc.). For example, the package cover 208 and/or the manifold may minimize or reduce the flow of thermal energy between a first semiconductor device and a second semiconductor device. In another example, the package cover 208 and/or the manifold may minimize or reduce the flow of thermal energy between a first semiconductor device stack and a second semiconductor device stack. In another example, the package cover 208 and/or the manifold may minimize or reduce the flow of thermal energy between a first device package and a second device package. In another example, the package cover 208 and/or the manifold may minimize or reduce the flow of thermal energy between a semiconductor device and a semiconductor device stack. In another example, the package cover 208 and/or the manifold may minimize or reduce the flow of thermal energy between a semiconductor device of a device package and a second device package.

It should be noted that the direction in which the coolant fluid flows through the cold plate 206 may be controlled depending on the relative locations of the inlet and outlet openings. For example, the coolant fluid may flow from left to right in the device package 201 of FIG. 3 when the inlet openings 212, 222A, 206A of the package cover 208, the sealing material layer 222, and the cold plate 206, respectively, are located on the left-hand side of the device package 201 and the outlet openings 212, 222A, 206A of the package cover 208, the sealing material layer 222, and the cold plate 206, respectively, are located on the right-hand side of the device package 201. Alternatively, the coolant fluid may flow from right to left in the device package 201 illustrated in FIG. 3 when the outlet openings 212, 222A, 206A of the package cover 208, the sealing material layer 222, and the cold plate 206 are located on the left-hand side of the device package 201 and the inlet openings 212, 222A, 206A of the package cover 208, the sealing material layer 222, and the cold plate 206 are located on the right-hand side of the device package 201. Although only one set of inlet and outlet openings is shown and described here, additional inlet and outlet openings may also be provided at various locations on the package cover 208, the sealing material layer 222, and the cold plate 206.

An example flow path of the coolant fluid through the coolant channels 210 may be as follows:

1. Coolant fluid enters the coolant chamber volume 210 through the inlet openings 212, 222A, and 206A.

2. Coolant fluid flows across the inside surfaces of the cold plate 206 and absorbs heat generated by the semiconductor device 204, which has dissipated into the cold plate 206 structure. The coolant fluid may also flow directly across the backside 220 of the semiconductor device 204 to absorb heat energy directly from the semiconductor device 204. The coolant chamber volume 210 may additionally have various channels formed to direct the coolant fluid flow from inlet opening(s) to outlet opening(s) and facilitate heat extraction from the semiconductor device 204 by the coolant fluid. In some embodiments, the coolant fluid may be in direct contact with the backside 220 of the semiconductor device 204 or via one or more substrate or layers between the coolant fluid or backside 220 of the semiconductor device 204.

3. Coolant fluid exits the coolant channels 210 through outlet openings 212, 222A, and 206A.

It will be understood from the above flow path that heat is extracted without introducing an unnecessary thermal resistance (e.g., a TIM disposed between the backside 220 of the semiconductor device 204 and the cold plate 206) between the backside 220 of the semiconductor device 204 and the cold plate 206.

Figure 5:
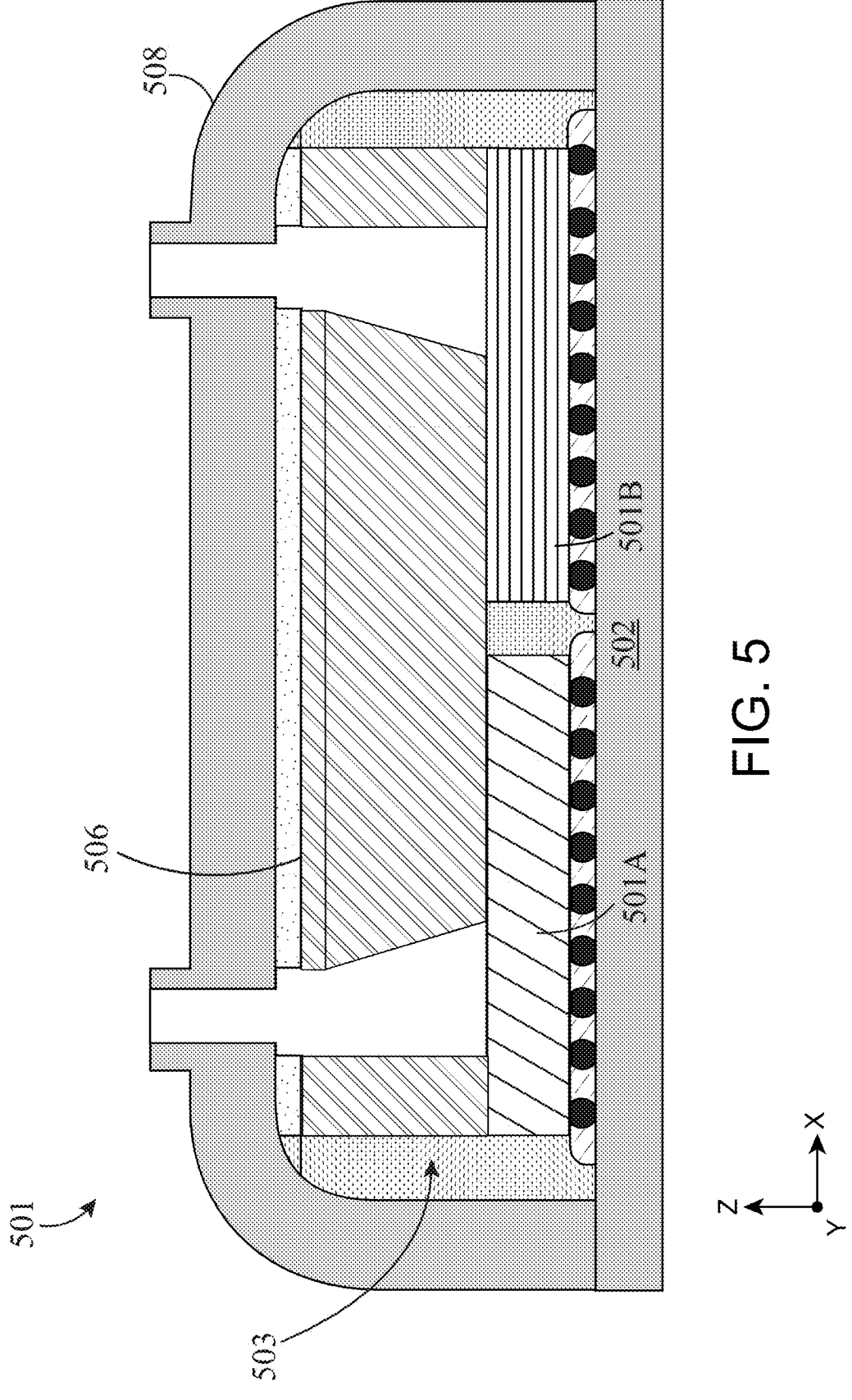
FIG. 5 is a schematic sectional view of another example device package, in accordance with embodiments of the present disclosure, that may be used with the system panel.

FIG. 5 is a schematic side sectional view in the X-Z plane of an example of a multi-component device package 501 that includes a cold plate 506 directly bonded to the backside surfaces of two or more devices 501A, 501B. The multi-component device package 501 may be similar to the device package 201 described above, and therefore the description of similar features is omitted for brevity. In some embodiments, the two or more devices 501A and 501B are singulated from reconstituted wafers and then bonded to the cold plate 506. As shown, the device package 501 includes a package substrate 502, an integrated cooling assembly 503 and a package cover 508. The integrated cooling assembly 503 may include a plurality of devices 501A (one shown) that may be singulated and/or disposed in a vertical device stack 501B (one shown). The cold plate 506 may be attached to each of the devices 501A and device stack 501B, e.g., by the direct bonding methods described herein or other methods including adhesive. In some embodiments, the device 501A may comprise a processor, and the device stack 501B may comprise a plurality of memory devices, such as a high bandwidth memory (HBM) comprising a bottom logic die and a plurality of memory (e.g., DRAM) dies stacked on the logic die. Here, the device 501A and the device stack 501B are disposed in a side-by-side arrangement on the package substrate 502 and are in electrical communication with one another through conductive elements formed in, on, or through the package substrate 502. Here, the cold plate 506 is sized to provide a bonding surface for attachment to both the device 501A and the device stack 501B but may otherwise be the same or substantially similar to other cold plates described herein. In some embodiments, the lateral dimensions (or footprint) of the cold plate 506 may be smaller or larger than the combined lateral dimensions (or footprint) of both the device 501A and the device stack 501B. In some embodiments, one or more sidewalls of the cold plate 506 may be aligned or offset to the vertical sidewalls of the device 501A and the device stack 501B (including inside or outside their footprint). In some embodiments, more than one cold plate 506 may be bonded. For example, separate cold plates may be bonded to the device 501A and the device stack 501B.

Figures 6, 7:
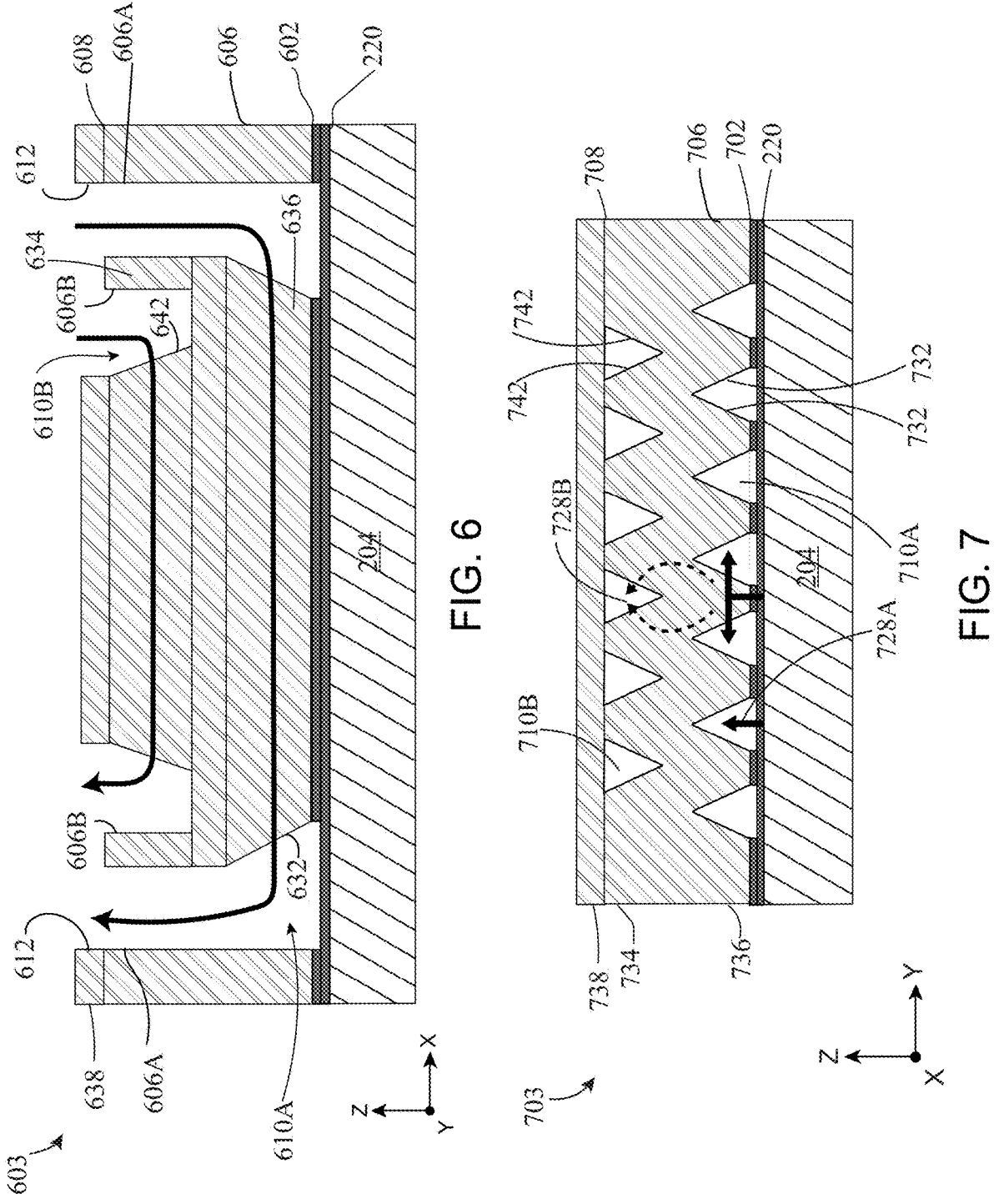
FIG. 6 is a schematic sectional view in the X-Z plane of another integrated cooling assembly, in accordance with embodiments of the present disclosure.
FIG. 7 is a schematic sectional view in the Y-Z plane of another integrated cooling assembly, in accordance with embodiments of the present disclosure.

FIG. 6 is a schematic sectional view in the X-Z plane of an integrated cooling assembly 603 which may be incorporated into the device package 201 in place of the integrated cooling assembly 203. Certain features of the integrated cooling assembly 603 illustrated in FIG. 6 are similar to features described above in relation to the integrated cooling assembly 203 illustrated in FIG. 3, and therefore repeated description of those features will be omitted for brevity.

The integrated cooling assembly 603 includes a cold plate 606 attached to the backside 220 of the semiconductor device 204. The cold plate 606 may be attached to the semiconductor device 204 by direct dielectric bonds, direct hybrid bonds, or adhesive, as described herein.

The cold plate 606 of FIG. 6 differs from the cold plate 203 described above in relation to FIG. 3 in that it includes an upper portion 634 disposed vertically adjacent to the backside 220 of the semiconductor device 204. A lower portion 636 of the cold plate is disposed between the upper portion 634 of the cold plate 606 and the backside 220 of the semiconductor device 204. That is, the upper portion 634 is positioned above the backside 220 of the semiconductor device 204 such that at least part of the upper portion 634 is located within the footprint of the semiconductor device 204. The lower portion 636 positioned between the upper portion 634 and the semiconductor device 204 such that a lower side 602 of the cold plate 606 faces the backside 220. In other words, the upper portion 634, the lower portion 634, and the semiconductor device 204 are vertically stacked, in that order.

The upper portion 634 includes upper coolant channels 610B defined by upper cavity sidewalls 642 and the lower portion includes lower coolant channels 610A defined by lower cavity sidewalls 632. The upper coolant channels 610B may be separated from the lower coolant channels 610A, for example by the upper cavity sidewalls 642 and the lower cavity sidewalls 632. That is, portions of the cold plate

Figures 11, 12:
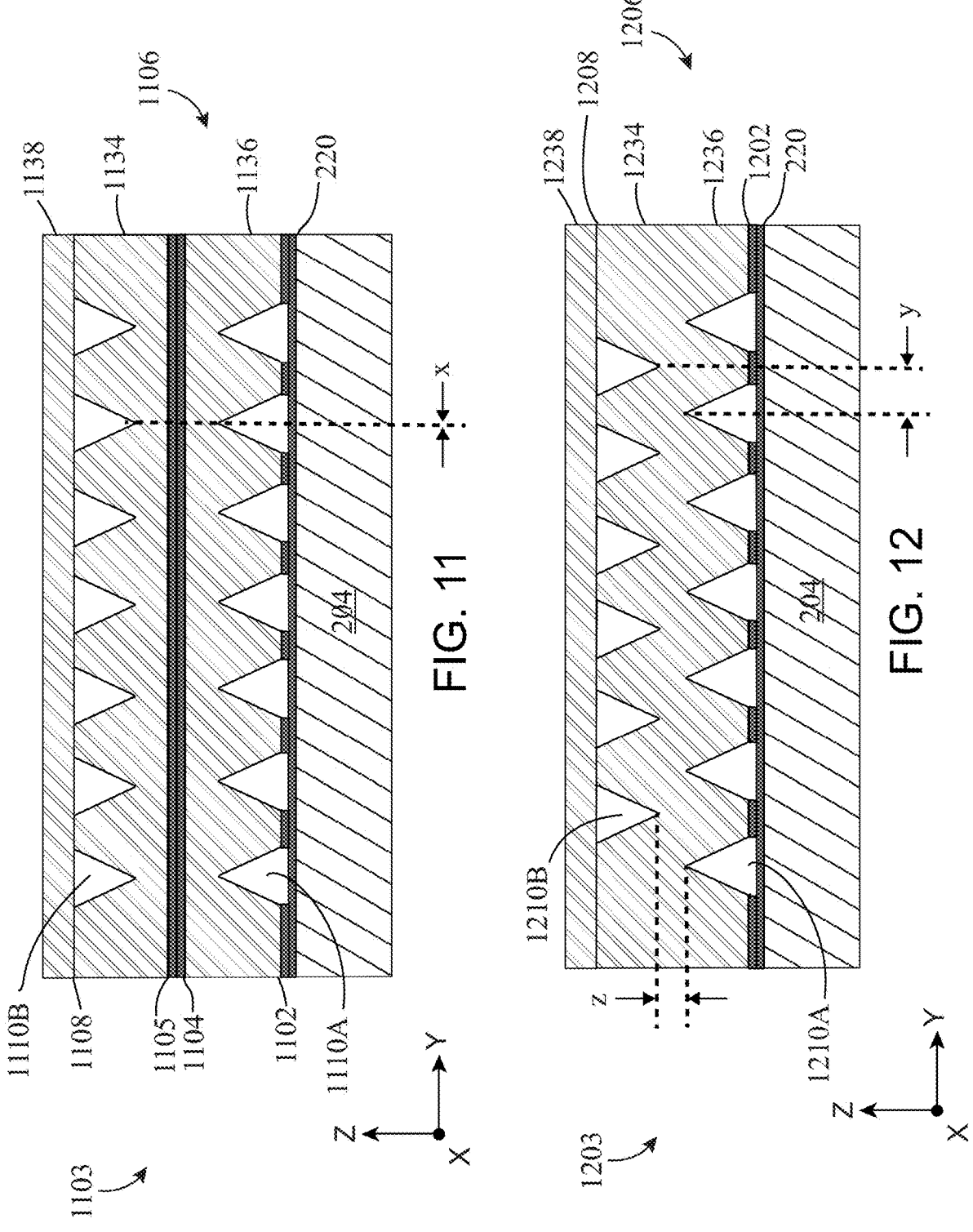
FIG. 11 is a schematic sectional view in the Y-Z plane of another integrated cooling assembly, in accordance with embodiments of the present disclosure.
FIG. 12 is a schematic sectional view in the Y-Z plane of another integrated cooling assembly, in accordance with embodiments of the present disclosure.

606 between the upper and lower cavity sidewalls 642, 632 may form cavity dividers, as discussed above in relation to FIG. 3, which may also form a fluid barrier between the upper and lower coolant channels 610B, 610A (e.g., to prevent fluid flowing through the upper coolant channels 610A from flowing into the lower coolant channels 610A, and vice versa). The relative locations and spacing between the upper and lower coolant channels 610B, 610A may vary, as described below in relation to FIGS. 7 and 11-17. Coolant fluid may flow through the upper coolant channels 610B and the lower coolant channels 610A, as shown by arrows extending through the channels in FIG. 6. For ease of explanation, the schematic sectional view shown in FIG. 6 assumes the upper and lower coolant channels 610B, 610A are horizontally aligned in the Y-axis direction (e.g., as illustrated in FIG. 11). However, it will be understood that the upper and lower coolant channels 610B, 610A may be horizontally offset in the Y-axis direction (e.g., as illustrated in FIG. 7).

As shown in FIG. 6, a horizontal length of the upper coolant channels 610B in the X-axis direction may be different to a horizontal length of the lower coolant channels 610A in the X-axis direction. By forming the upper coolant channels 610B with a horizontal length less than a horizontal length of the lower coolant channels 610A, separate inlet and outlet openings may be provided for the upper coolant channels 610B and the lower coolant channels 610A, respectively. For example, the upper coolant channels 610B may be in fluid communication with first inlet and outlet openings 606A only. Similarly, the lower coolant channels 610A may be in fluid communication with second inlet and outlet openings 606A only. In some embodiments, the first inlet and outlet openings 606B and the second inlet and outlet openings 606B may be collectively referred to as inlet and outlet openings of the cold plate 606. The second inlet and outlet openings 606B may be formed laterally adjacent to the first inlet and outlet openings 606A. Advantageously, by providing separate inlet and outlet openings, as shown, the upper and lower coolant channels 610B, 610A may be connected to different (and separate) coolant fluids (e.g., different types of fluid and/or different flow rates of fluid). In some embodiments, the upper and lower coolant channels 610B, 610A may both be connected to the same coolant fluid.

The cold plate 606 may further include a channel cover 638 disposed on the upper portion 634 of the cold plate 606 (e.g., facing an upper side 908) to fluidly seal the upper coolant channels 610A. The channel cover 628 may include inlet and outlet openings 612 which are fluidly connected to the first inlet and outlet openings 606B and the second inlet and outlet openings 606A of the cold plate 606. The channel cover 638 may be attached to the cold plate 606 by direct dielectric bonds, direct hybrid bonds, or adhesive, as discussed herein. The channel cover 638 may be formed of the same or similar material to the cold plate 606 (e.g., polymer, copper, aluminum, silicon, glass, or ceramic).

FIG. 7 is a schematic sectional view in the Y-Z plane of an integrated cooling assembly 703 including a cold plate 706 having upper and lower portions 734, 736 attached to the semiconductor device 204. The cold plate 706 includes upper coolant channels 710B defined by upper cavity sidewalls 742 and lower coolant channels 710A defined by lower cavity sidewalls 732. Certain features of the integrated cooling assembly 703 illustrated in FIG. 7 are similar to features described above in relation to the integrated cooling assembly 603 illustrated in FIG. 6, and therefore repeated description of those features will be omitted for brevity.

As shown, the cold plate 706 includes a lower side 702 facing the backside 220 of the semiconductor device 204 and an upper side 708 opposite the lower side 702. Where a channel cover 738 is provided, the upper side 708 may be facing the channel cover 738. The lower cavity sidewalls 732 may extend upwardly into the lower portion 736 from the lower side 702 of the cold plate 706 to form the lower coolant channels 710A (which may be exposed to the backside 220 of the semiconductor device 204). The upper cavity sidewalls 742 may extend downwardly into the upper portion 734 from the upper side 708 of the cold plate 706 to form the upper coolant channels 710A. The exact shape and dimensions of the upper and lower coolant channels 710B, 710A may vary. For example, as shown, the upper cavity sidewalls 742 may be sloped to form the upper coolant channels 710B with a triangular cross-section. Similarly, the lower cavity sidewalls 732 may be sloped to form lower coolant channels 710A with a triangular cross-section. Although the upper and lower coolant channels 710B, 710A are illustrated as having triangular cross-sections, the upper and lower coolant channels 710B, 710A may instead have trapezoidal, rectangular, or semi-circular cross-section, or a combination thereof.

The upper and lower coolant channels 710B, 710A are horizontally offset in the X-axis direction. The upper and lower coolant channels 710A, 710B do not overlap in the Z-axis direction, as described in more detail below with reference to FIG. 12

In FIG. 7, arrows 728A and 728B illustrate two different heat transfer paths in the integrated cooling assembly 703. A first heat transfer path illustrated by arrow 728A shows heat generated by the semiconductor device 204 transferring directly from the semiconductor material of the semiconductor device 204 to coolant fluid flowing through the lower coolant channels 710A of the cold plate 706. A second heat transfer path illustrated by arrows 728B shows heat generated by the semiconductor device 204 being transferred from semiconductor material (e.g., silicon material) of the semiconductor device 204 to semiconductor material (e.g., silicon material) of the cold plate 706, being propagated throughout the semiconductor material of the cold plate 706 (shown as dashed lines), and being transferring into coolant fluid flowing through the upper coolant channels 710B. Advantageously, by providing a cold plate with separate upper and lower coolant channels, the efficiency with which heat can be transferred away from a heat source (e.g., the semiconductor device 204) is improved. In particular, the volume of coolant fluid to which thermal energy may be transferred in increased, and, since cooling fluid has a high capacity for removing heat, the integrated cooling assemblies disclosed herein can accommodate relatively high power heat sources.

Figure 8:
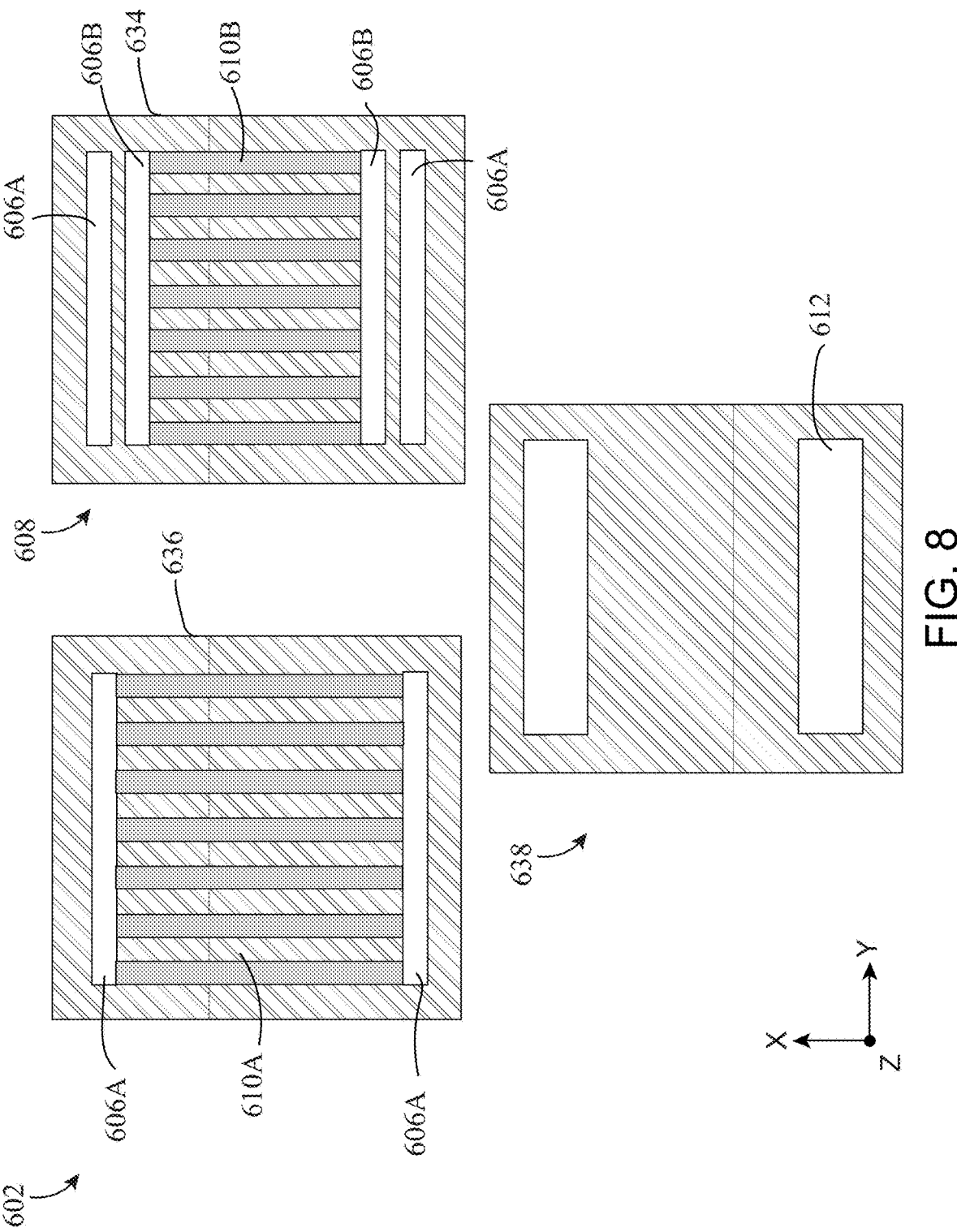
FIG. 8 shows schematic plan views of a cold plate and a channel cover of the integrated cooling assembly illustrated in FIG. 6.

FIG. 8 shows schematic plan views of the cold plate 606 and the channel cover 638 illustrated in FIG. 6. The top left portion of FIG. 8 shows a plan view of the lower side 602 of the cold plate 606 facing the backside 220 of the semiconductor device 204. The top right portion of FIG. 8 shows a plan view of the upper side 608 of the cold plate 606 facing the channel cover 638. The bottom middle portion of FIG. 8 shows a plan view of the channel cover 638 (for which both sides may be the same).

Here, the lower coolant channels 610A extend in parallel between the second inlet and outlet openings 606A and the upper coolant channels 610B extend in parallel between the first inlet and outlet openings 606B. As shown in the plan view of the upper side 608, the second inlet and outlet openings 606A are separate from the first inlet and outlet openings 606B. Therefore, the second inlet and outlet openings 606A may supply coolant fluid to the lower coolant channels 610A only while remaining separated from the upper coolant channels 610B. Similarly, the first inlet and outlet openings 606B may supply coolant fluid to the upper coolant channels 610B only while remaining separated from the lower coolant channels 610A.

The inlet and outlet openings 612 of the channel cover 638 are shown to extend laterally across the inlet and outlet openings 606A, 606B of the cold plate 606 in the X-axis direction and the Y-axis direction. For example, the inlet opening 612 of the channel cover 638 may extend laterally across both the first inlet opening 606A and the second inlet opening 606B of the cold plate 606, and the outlet opening 612 of the channel cover 638 may extend laterally across both the first outlet opening 606A and the second outlet opening 606B of the cold plate 606. Further, the inlet and outlet openings 612 of the channel cover 638 may be laterally aligned (in the X-axis directions and the Y-axis direction) with corresponding inlet and outlet openings 606A, 606B disposed therebelow. As such, coolant fluid may flow through the inlet and outlet openings 612 of the channel cover 638 and into the cold plate 606 without being obstructed by the bulk material of the channel cover 638. In some embodiments, the channel cover 638 may include a first pair of inlet and outlet openings corresponding to the size and alignment of the first inlet and outlet openings 606A of the cold plate 606, and a second pair of inlet and outlet openings corresponding to the size and alignment of the second inlet and outlet openings 606B of the cold plate 606. That is, the channel cover 638 may include separate inlet and outlet openings for the upper coolant channels 610B and the lower coolant channels 610A in a similar manner to the inlet and outlet openings 606A, 606B of the cold plate 606.

Figure 9:
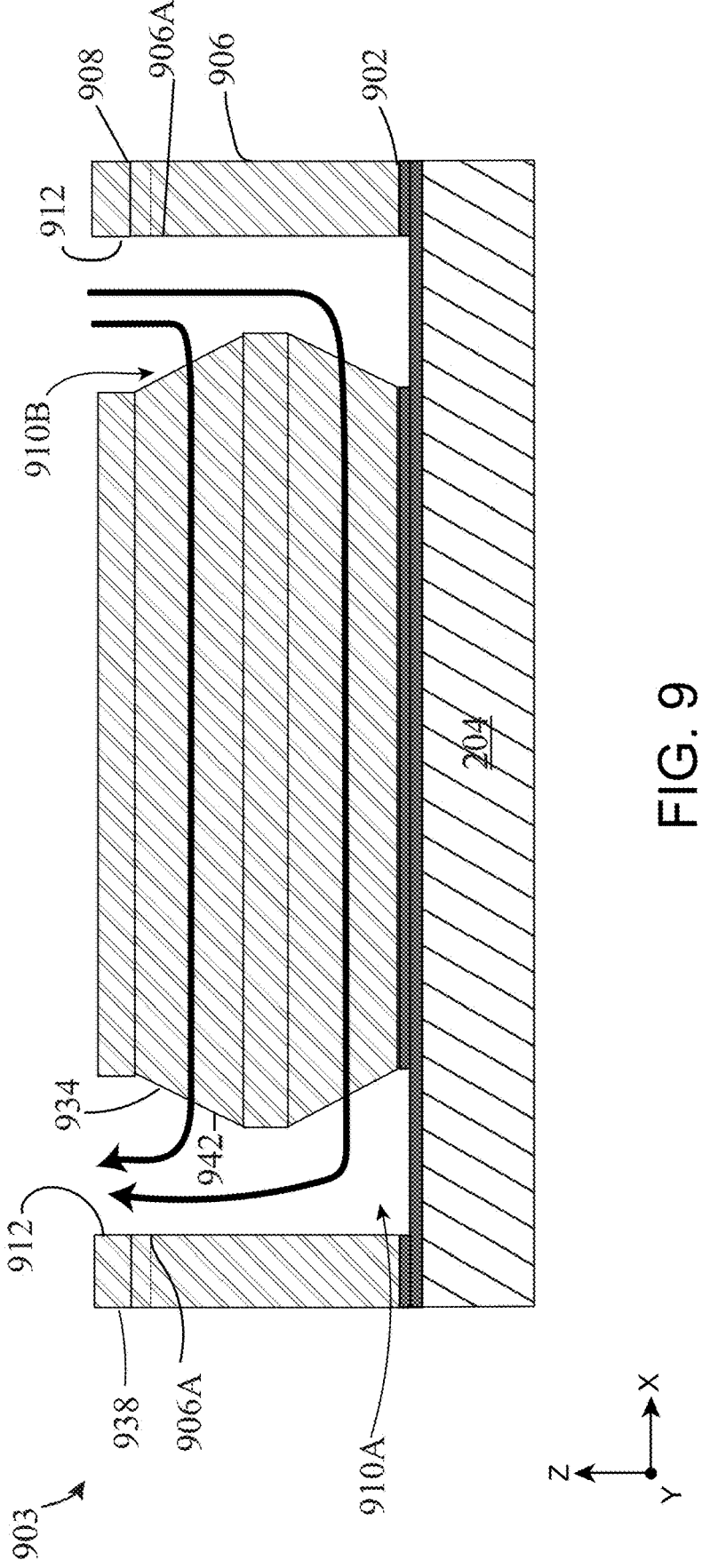
FIG. 9 is a schematic sectional view in the X-Z plane of another integrated cooling assembly, in accordance with embodiments of the present disclosure.

FIG. 9 is a schematic sectional view in the X-Z plane of an integrated cooling assembly 903 which may be incorporated into the device package 201 in place of the integrated cooling assembly 203. Certain features of the integrated cooling assembly 903 illustrated in FIG. 9 are similar to features described above in relation to the integrated cooling assembly 203, of FIG. 3, and the integrated cooling assembly 603, of FIG. 6, and therefore repeated description of those features will be omitted for brevity.

The integrated cooling assembly 903 includes a cold plate 906 attached to the backside 220 of the semiconductor device 204. The cold plate 906 (e.g., a lower side 902) may be attached to the semiconductor device 204 by direct dielectric bonds, direct hybrid bonds, or adhesive, as described herein.

The cold plate 906 of FIG. 9 differs from the cold plate 603 described above in relation to FIG. 6 in that a horizontal length of upper coolant channels 910B in the X-axis direction may be the same (or substantially the same) as a horizontal length of lower coolant channels 910A in the X-axis direction. By forming the upper coolant channels 910B and the lower coolant channels 910A with a same or similar length, a single pair of inlet and outlet openings 906A may be shared between the upper coolant channels 910B and the lower coolant channels 910A. For example, the upper coolant channels 910B and the lower coolant channels 910A may both be in fluid communication with the same inlet and outlet openings 906A. As such, a same coolant fluid may be supplied to both the upper coolant channels 910B and the lower coolant channels 910A from a same supply (as shown by arrows extending through the channels in FIG. 9), which may reduce the complexity of the integrated cooling assembly 903. It will be understood that, although the upper and lower coolant channels 910B, 910A may share the same supply of coolant fluid, once the coolant fluid enters the respective coolant channels the coolant fluid remains within the respective coolant channels and does not flow from the upper coolant channels 910B to the lower coolant channels 910A, or vice versa.

As with the cold plate 606 of FIG. 6, the cold plate 906 illustrated in FIG. 9 may further include a channel cover 938 disposed on an upper portion 934 (e.g., facing an upper side 908) of the cold plate 906 to fluidly seal the upper coolant channels 910A. The channel cover 928 may include inlet and outlet openings 912 which are fluidly connected to the inlet and outlet openings 906A of the cold plate 906.

Figure 10:
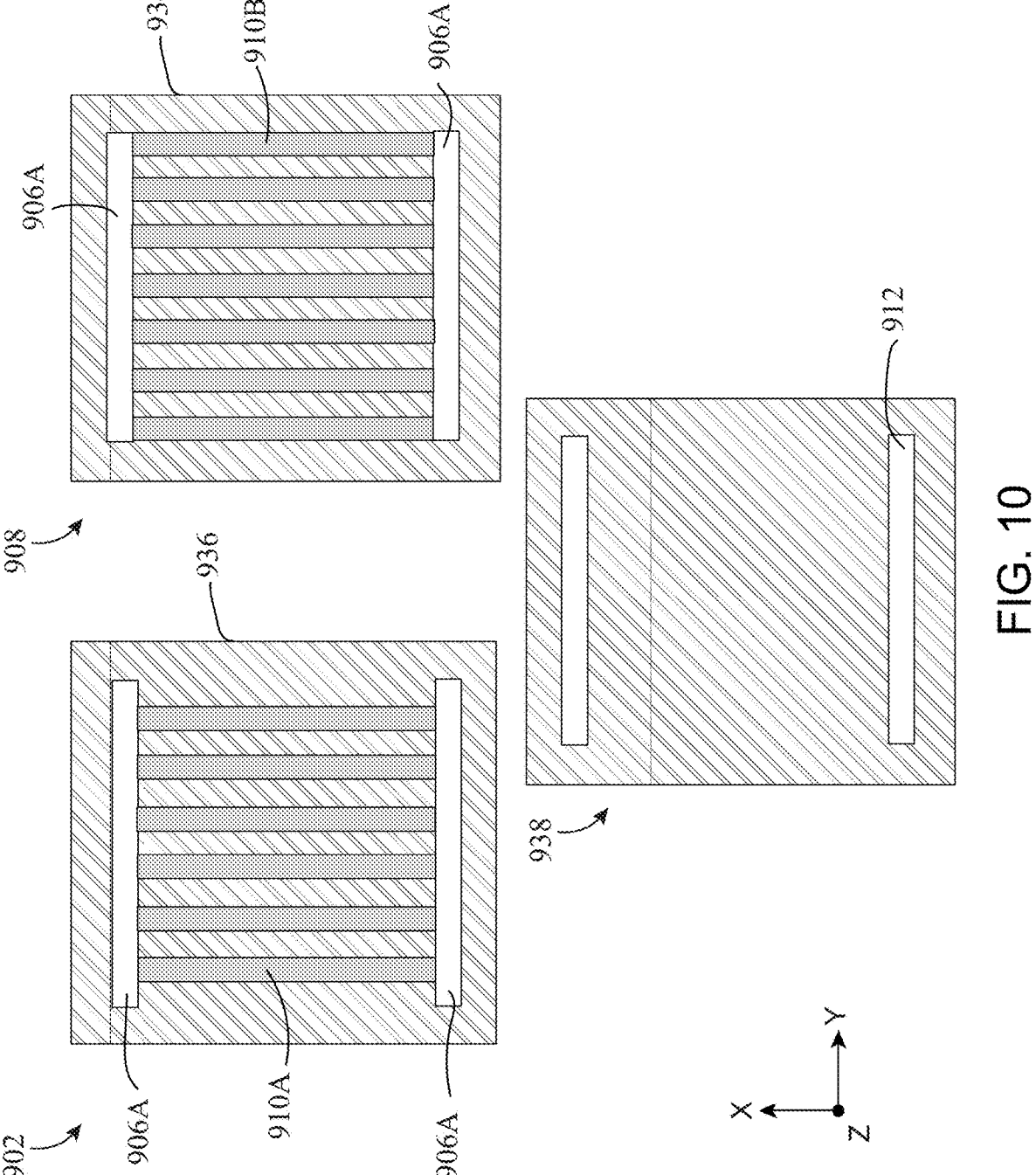
FIG. 10 shows schematic plan views of a cold plate and a channel cover of the integrated cooling assembly illustrated in FIG. 9.

FIG. 10 shows schematic plan views of the cold plate 906 and the channel cover 938 illustrated in FIG. 9. The top left portion of FIG. 10 shows a plan view of the lower side 902 of the cold plate 606 facing the backside 220 of the semiconductor device 204. The top right portion of FIG. 10 shows a plan view of the upper side 908 of the cold plate 906 facing the channel cover 938. The bottom middle portion of FIG. 10 shows a plan view of the channel cover 938 (for which both sides may be the same).

Here, both the lower coolant channels 910A and the upper coolant channels 910B extend in parallel between the single pair of inlet and outlet openings 906A. As shown in the plan view of the upper side 908 and the plan view of the lower side 902, the inlet and outlet openings 906A are shared between both upper and lower coolant channels 910B, 910A, as opposed to having separate openings in the cold plate 606 illustrated in FIG. 8. Therefore, the inlet and outlet openings 906A may simultaneously supply coolant fluid to the lower coolant channels 610A and the upper coolant channels 610B.

Dimensions of the inlet and outlet openings 912 of the channel cover 938 are shown to be approximately (i.e., within a tolerance of between 0.5 mm and 2 mm) the same as dimensions of the single pair of inlet and outlet openings 906A of the cold plate 606. Further, the inlet and outlet openings 912 of the channel cover 938 may be vertically and horizontally aligned (in the X-axis directions and the Y-axis direction) with the single pair of inlet and outlet openings 906A disposed therebelow. As such, coolant fluid may flow through the inlet and outlet openings 612 of the channel cover 638 and into the cold plate 606 without being obstructed by the bulk material of the channel cover 938.

FIG. 11 is a schematic sectional view in the Y-Z plane of an integrated cooling assembly 1103 including a cold plate 1106 having upper and lower portions 1134, 1136 attached to the semiconductor device 204. The cold plate 1106 includes upper coolant channels 1110B defined by upper cavity sidewalls and lower coolant channels 1110A defined by lower cavity sidewalls. Certain features of the integrated cooling assembly 1103 illustrated in FIG. 11 are similar to features described above in relation to the integrated cooling assembly 603 shown in FIG. 6 and the integrated cooling assembly 706 shown in FIG. 7, and therefore repeated description of those features will be omitted for brevity.

The lower portion 1136 of the cold plate 1106 includes a first side 1102 attached to the backside 220 of the semiconductor device 204 and a second side 1104 opposite the first side 1102. The upper portion 1134 of the cold plate 1106 includes a first side 1105 attached to the second side 1104 of the lower portion 1136 and a second side 1108 opposite the first side 1105. In embodiments illustrated by FIG. 11, the lower portion 1136 and the upper portion 1134 are formed from separate substrates vertically stacked. In some embodiments, the lower portion 1136 may be attached to the upper portion 1134 by direct dielectric bond, direct hybrid bonds, or adhesive, as described herein. For example, the first side 1105 of the upper portion 1134 may be attached to the second side 1104 of the lower portion 1136 to form the cold plate 1106. Where a channel cover 1138 is provided, the second side 1108 of the upper portion 1134 may be facing the channel cover 1138.

The lower cavity sidewalls may extend upwardly into the lower portion 1136 from the first side 1102 of the lower portion 1136 to form the lower coolant channels 1110A (which may be exposed to the backside 220 of the semiconductor device 204). The upper cavity sidewalls may extend downwardly into the upper portion 1134 from the second side 1108 of the upper portion 1134 to form the upper coolant channels 1110A (which may be exposed to the channel cover 1138). The exact shape and dimensions of the upper and lower coolant channels 710B, 710A may vary, as described above. Here, the upper coolant channels 1110B and the lower coolant channels 1110B may be horizontally aligned (or substantially aligned), as illustrated by an alignment marker x, in the Y-axis direction. The alignment marker x illustrates that a central line of the upper and lower coolant channels 1110B, 1110A is substantially the same (e.g., within a tolerance of 0.5 mm to 1 mm). FIG. 11 also shown that portions of the upper and lower coolant channels 1110B, 1110A do not vertically overlap in the Z-axis direction due to the bulk material of the upper and lower portions 1134, 1136 therebetween.

Figures 16A, 16B:
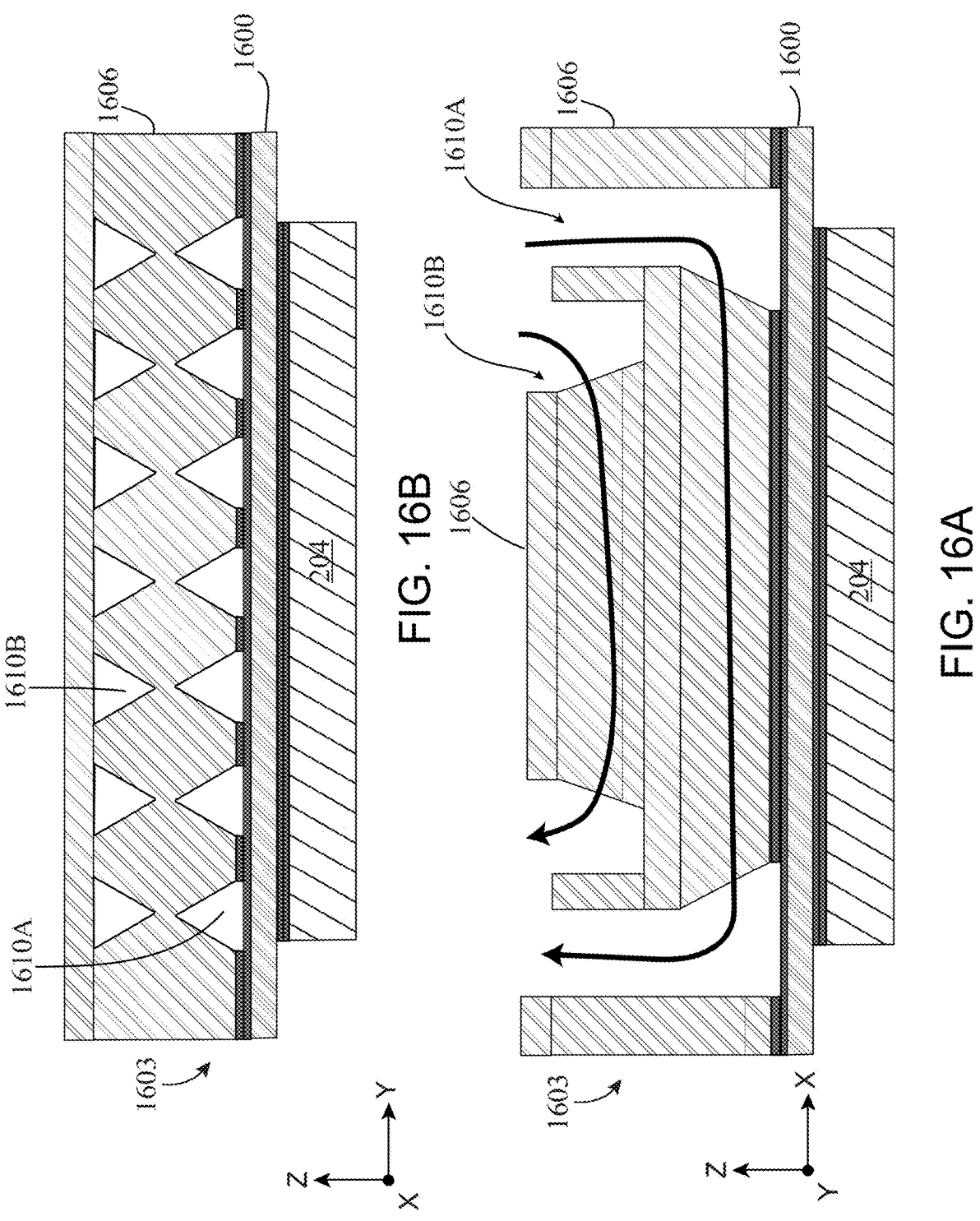
FIG. 16A is a schematic sectional view in the X-Z plane of another integrated cooling assembly, in accordance with embodiments of the present disclosure.
FIG. 16B is a schematic sectional view in the Y-Z plane of the integrated cooling assembly illustrated in FIG. 16A.

It will be understood that, in some embodiments, the above described arrangement of upper and lower coolant channels 1110B, 1110A may be formed in a cold plate formed from a single substrate, rather than two vertically stacked substrates as illustrated in FIG. 11. Similarly, upper and lower portions of cold plates described herein may be equally formed from separate corresponding substrates vertically stacked together, as illustrated in FIG. 16B.

Figure 21:
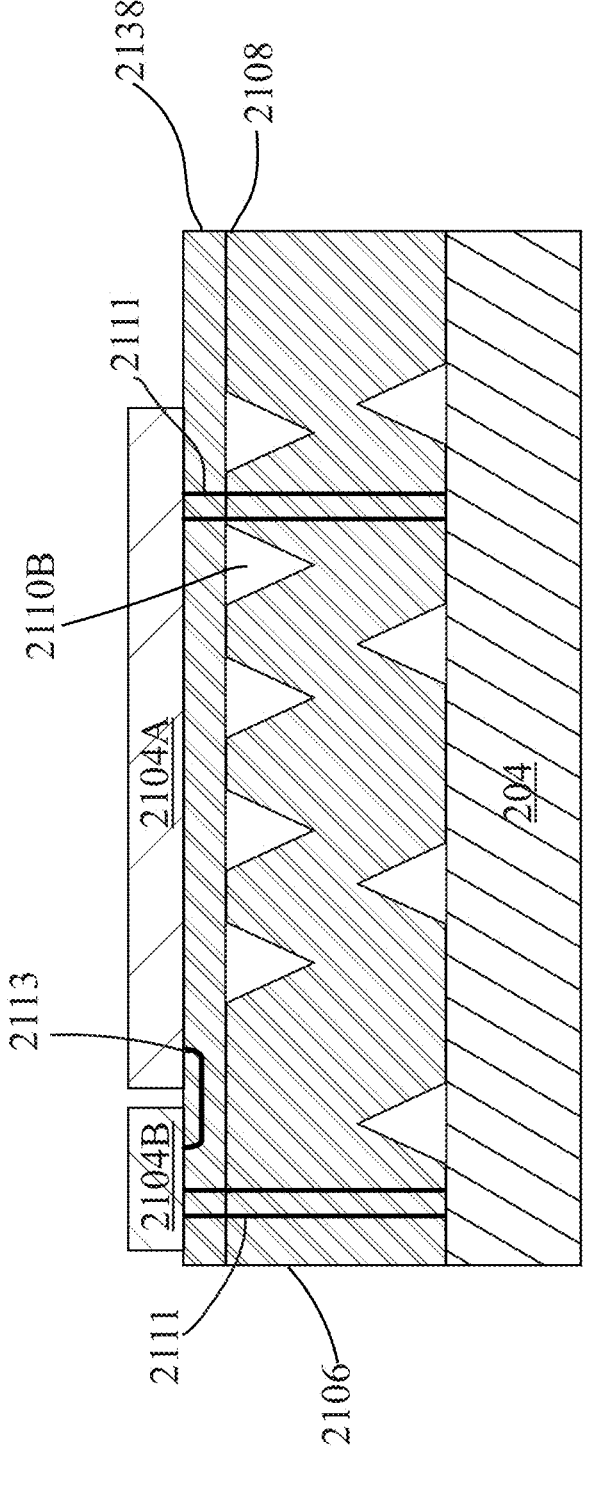
FIG. 21 is a schematic sectional view in the Y-Z plane of another integrated cooling assembly, in accordance with embodiments of the present disclosure.

FIG. 12 is a schematic sectional view in the Y-Z plane of an integrated cooling assembly 1203 including a cold plate 1206 having upper and lower portions 1234, 1236 attached to the semiconductor device 204. The cold plate 1206 includes upper coolant channels 1210B defined by upper cavity sidewalls and lower coolant channels 1210A defined by lower cavity sidewalls. Certain features of the integrated cooling assembly 1203 illustrated in FIG. 21 are similar to features described above in relation to the integrated cooling assembly 603 shown in FIG. 6 and the integrated cooling assembly 706 shown in FIG. 7, and therefore repeated description of those features will be omitted for brevity.

As shown, the cold plate 1206 includes a lower side 1202 facing the backside 220 of the semiconductor device 204 and an upper side 1208 opposite the lower side 1202. Rather than being formed from two vertically stacked substrates, as illustrated in FIG. 11, the cold plate 1206 of FIG. 12 is formed from a single substrate. Where a channel cover 1238 is provided, the upper side 1208 may be facing the channel cover 1238. The lower cavity sidewalls may extend upwardly into the lower portion 1236 from the lower side 1202 of the cold plate 1206 to form the lower coolant channels 1210A (which may be exposed to the backside 220 of the semiconductor device 204). The upper cavity sidewalls may extend downwardly into the upper portion 1234 from the upper side 1208 of the cold plate 706 to form the upper coolant channels 1210A. The exact shape and dimensions of the upper and lower coolant channels 1210B, 1210A may vary, as described above. Here, the upper coolant channels 1210B and the lower coolant channels 1210B may be horizontally offset, as illustrated by an offset spacing y in the Y-axis direction. The offset spacing y illustrates that a central line of the upper coolant channels 1210B is horizontally spaced apart from a central line of the lower coolant channels 1210B (e.g., by approximately 0.2 mm, 1 mm, 5 mm, 10 mm, or 30 mm). It will be understood that the upper and lower coolant channels 1210B, 12010A may still be considered offset even if portions of vertically adjacent channels horizontally overlap in the Y-axis direction. FIG. 12 also shown that portions of the upper and lower coolant channels 1210B, 1210A do not vertically overlap in the Z-axis direction due to the bulk material of the upper and lower portions 1134, 1136 therebetween.

It will be understood that, in some embodiments, the above described arrangement of upper and lower coolant channels 1210B, 1210A may be formed in a cold plate formed from two vertically stacked substrates, as illustrated in FIG. 11.

Figures 13, 14:
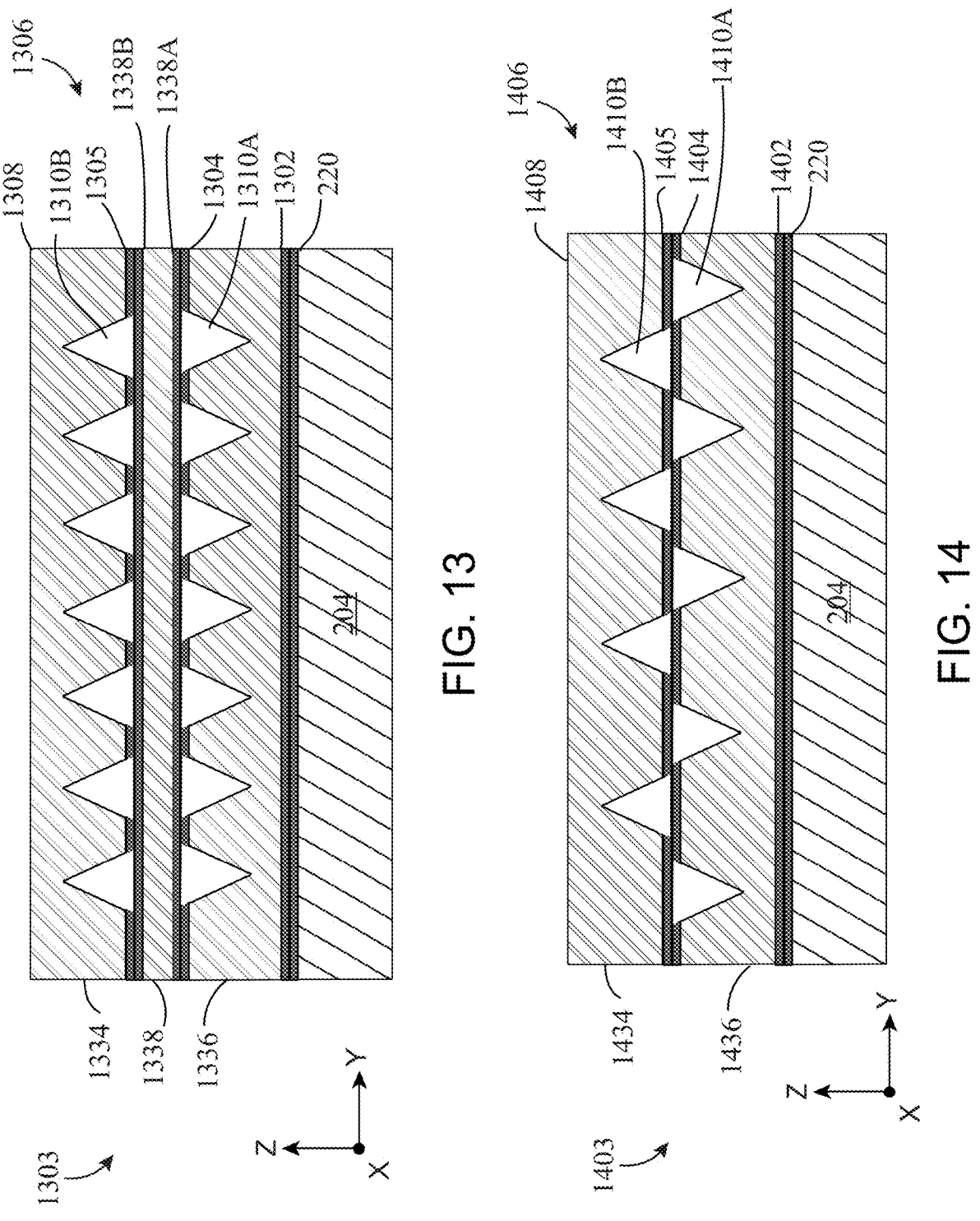
FIG. 13 is a schematic sectional view in the Y-Z plane of another integrated cooling assembly, in accordance with embodiments of the present disclosure.
FIG. 14 is a schematic sectional view in the Y-Z plane of another integrated cooling assembly, in accordance with embodiments of the present disclosure.

FIG. 13 is a schematic sectional view in the Y-Z plane of an integrated cooling assembly 1303 including a cold plate 1306 having upper and lower portions 1334, 1336 attached to the semiconductor device 204. The cold plate 1306 includes upper coolant channels 1310B defined by upper cavity sidewalls and lower coolant channels 1310A defined by lower cavity sidewalls. Certain features of the integrated cooling assembly 1303 illustrated in FIG. 13 are similar to features described above in relation to the integrated cooling assembly 603 shown in FIG. 6 and the integrated cooling assembly 706 shown in FIG. 7, and therefore repeated description of those features will be omitted for brevity.

As described in more details below, the upper coolant channels 1310B and the lower coolant channels 1310A may face each other. Therefore, in order to fluidly seal the upper and lower coolant channels 1310B, 1310A, a continuous substrate 1338) may be disposed therebetween. The continuous substrate 1338 includes a first side 1338A and a second side 1338B opposite the first side 1338A. The continuous substrate 1338 provides a unbroken sheet of substrate between which coolant fluid may not flow. Therefore, the continuous substrate 1338 prevents cooling fluid from flowing between the upper coolant channels 1310B and the lower coolant channels 1310A.

The lower portion 1336 of the cold plate 1306 includes a first side 1302 attached to the backside 220 of the semiconductor device 204 and a second side 1304 opposite the first side 1102. The second side 1304 of the lower portion 1336 is attached to the first side 1338A of the continuous substrate 1338. The upper portion 1334 of the cold plate 1306 includes a first side 1305 attached to the second side 1338B of the continuous substrate 1338 and a second side 1308 opposite the first side 1305. In embodiments illustrated by FIG. 13, the lower portion 1336 and the upper portion 1334 are formed from separate substrates vertically stacked with the continuous substrate 1338 disposed between the first side 1305 of the upper portion 1334 and the second side 1304 of the lower portion 1336. In some embodiments, the continuous substrate 1338 may be attached between the upper and lower portions 1334, 1336 of the cold plate 1306 by direct dielectric bond, direct hybrid bonds, or adhesive, as described herein. For example, the first side 1305 of the upper portion 1334 may be attached to the second side 1338B of the continuous substrate 1338 and the second side 1304 of the lower portion 1336 may be attached to the first side 1338A of the continuous substrate 1338.

The lower cavity sidewalls may extend downwardly into the lower portion 1336 from the second side 1304 of the lower portion 1336 to form the lower coolant channels 13310A (which may be exposed to the first side 1338A of the continuous substrate 1338). The upper cavity sidewalls may extend upwardly into the upper portion 1334 from the first side 1305 of the upper portion 1334 to form the upper coolant channels 1310B (which may be exposed to the second side 1338B of the continuous substrate 1338). The exact shape and dimensions of the upper and lower coolant channels 1310B, 1310A may vary, as described above. Here, the upper coolant channels 1310B and the lower coolant channels 1310B are horizontally aligned (or substantially aligned) and facing each other. FIG. 11 also shown that portions of the upper and lower coolant channels 1310B, 1310A do not vertically overlap in the Z-axis direction due to the bulk material of the cold plate 1305 and the continuous substrate 1338 disposed therebetween.

FIG. 14 is a schematic sectional view in the Y-Z plane of an integrated cooling assembly 1403 including a cold plate 1406 having upper and lower portions 1434, 1436 attached to the semiconductor device 204. The cold plate 1406 includes upper coolant channels 1410B defined by upper cavity sidewalls and lower coolant channels 1410A defined by lower cavity sidewalls. Certain features of the integrated cooling assembly 1403 illustrated in FIG. 14 are similar to features described above in relation to the integrated cooling assembly 603 shown in FIG. 6 and the integrated cooling assembly 706 shown in FIG. 7, and therefore repeated description of those features will be omitted for brevity.

The lower portion 1436 of the cold plate 1406 includes a first side 1402 attached to the backside 220 of the semiconductor device 204 and a second side 1404 opposite the first side 1402. The upper portion 1434 of the cold plate 1406 includes a first side 1405 attached to the second side 1404 of the lower portion 1446 and a second side 1408 opposite the first side 1405. In embodiments illustrated by FIG. 14, the lower portion 1436 and the upper portion 1434 are formed from separate substrates vertically stacked and attached to together using direct dielectric bond, direct hybrid bonds, or adhesive, as described herein. For example, the first side 1405 of the upper portion 1434 may be attached to the second side 1404 of the lower portion 1436.

The lower cavity sidewalls may extend downwardly into the lower portion 1436 from the second side 1404 of the lower portion 1436 to form the lower coolant channels 1410A (which may be exposed to the first side 1405 of the upper portion 1434). The upper cavity sidewalls may extend upwardly into the upper portion 1434 from the first side 1405 of the upper portion 1434 to form the upper coolant channels 1410B (which may be exposed to the second side 1404 of the lower portion 1436). The exact shape and dimensions of the upper and lower coolant channels 1310B, 1310A may vary, as described above. Here, the upper coolant channels 1410B and the lower coolant channels 1410B are horizontally offset and facing each other. The coolant channels 1410B, 1410A are horizontally offset in the Y-axis direction to such an extent that that opposing surfaces of the upper and lower portions 1434, 1436 fluidly seal the coolant channels 1410B, 14010A, which obviates the need for a continuous substrate as described above in relation to FIG. 13. FIG. 14 also shown that portions of the upper and lower coolant channels 1410B, 1410A do not vertically overlap in the Z-axis direction.

Figure 15:
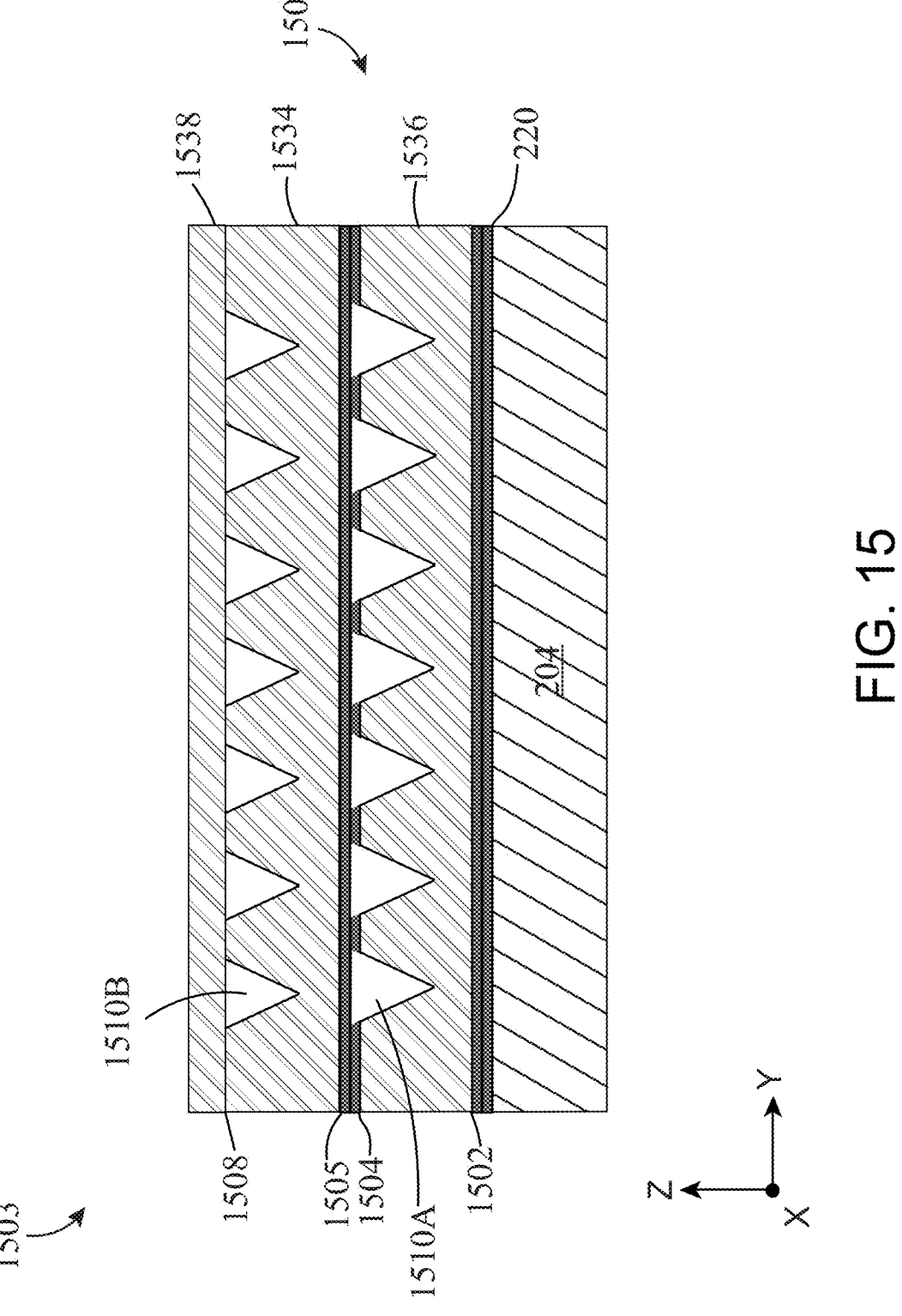
FIG. 15 is a schematic sectional view in the Y-Z plane of another integrated cooling assembly, in accordance with embodiments of the present disclosure.

FIG. 15 is a schematic sectional view in the Y-Z plane of an integrated cooling assembly 1503 including a cold plate 1506 having upper and lower portions 1534, 1536 attached to the semiconductor device 204. The cold plate 1506 includes upper coolant channels 1510B defined by upper cavity sidewalls and lower coolant channels 1510A defined by lower cavity sidewalls. Certain features of the integrated cooling assembly 1503 illustrated in FIG. 15 are similar to features described above in relation to the integrated cooling assembly 603 shown in FIG. 6 and the integrated cooling assembly 706 shown in FIG. 7, and therefore repeated description of those features will be omitted for brevity.

The lower portion 1536 of the cold plate 1506 includes a first side 1502 attached to the backside 220 of the semiconductor device 204 and a second side 1504 opposite the first side 1502. The upper portion 1534 of the cold plate 1506 includes a first side 1505 attached to the second side 1504 of the lower portion 1536 and a second side 1508 opposite the first side 1505. In embodiments illustrated by FIG. 15, the lower portion 1536 and the upper portion 1534 are formed from separate substrates vertically stacked. In some embodiments, the lower portion 1536 may be attached to the upper portion 1534 by direct dielectric bond, direct hybrid bonds, or adhesive, as described herein. For example, the first side 1505 of the upper portion 1534 may be attached to the second side 1504 of the lower portion 1536 to form the cold plate 1505. Where a channel cover 1538 is provided, the second side 1508 of the upper portion 1534 may be facing the channel cover 1538.

The lower cavity sidewalls may extend downwardly into the lower portion 1536 from the second side 1504 of the lower portion 1536 to form the lower coolant channels 1510A (which may be exposed to the first side 1505 of the upper portion 1534). The upper cavity sidewalls may extend downwardly into the upper portion 1534 from the second side 1508 of the upper portion 1534 to form the upper coolant channels 1510B (which may be exposed to the channel cover 1538). The exact shape and dimensions of the upper and lower coolant channels 1510B, 1510A may vary, as described above. Here, the upper coolant channels 1510B and the lower coolant channels 1510B may be horizontally aligned (or substantially aligned) in the Y-axis direction. FIG. 15 also shown that portions of the upper and lower coolant channels 1510B, 1510A do not vertically overlap in the Z-axis direction due to the bulk material of the upper portion 1534 therebetween.

It will be understood that, in some embodiments, the above described arrangement of upper and lower coolant channels 1510B, 1510A may be formed in a cold plate formed from a single substrate, rather than two vertically stacked substrates as illustrated in FIG. 15.

FIG. 16A is a schematic sectional view in the X-Z plane of an integrated cooling assembly 1603 and FIG. 16B is a schematic sectional view in the Y-Z plane of an integrated cooling assembly 1603. The integrated cooling assembly 1603 may be similar to the integrated cooling assembly 203 shown in FIG. 3 and the integrated cooling assembly 606 shown in FIG. 6, and therefore the description of similar features is omitted for brevity.

In FIG. 16A, a width of a cold plate 1606 in a first direction is greater than a width of the semiconductor device 204 the first direction. The first direction may be taken to be a direction perpendicular to a second direction in which perimeter sidewall extends. Alternatively, the first direction may be taken to be a direction parallel with the backside 220 of the semiconductor device 204 (e.g. the X-axis direction or the Y-axis direction). With reference to FIGS. 16A and 16B, the second direction is the Z-axis direction and the first direction is either the X-axis or the Y-axis direction. As shown, the width of the cold plate 1606 is greater than the width of the semiconductor device 204 in both the X-axis direction and the Y-axis direction. In embodiments of FIGS. 16A and 16B where the semiconductor device 204 has a rectangular footprint, the cold plate 1606 may extend beyond all four sidewalls of the semiconductor device 204. However, it will be understood that the width of the cold plate 1606 may be greater than the width of the semiconductor device 1604 in either the X-axis direction or the Y-axis direction.

In order to provide the cold plate 1606 with a width greater than a width of the semiconductor device 204, a structural substrate 1600 having substantially the same width (in the X-axis direction and/or the Y-axis direction) as the cold plate 1606 is provided between the cold plate 1606 and the semiconductor device 204. The structural substrate 1600 provides structural rigidity to overhanging portions of the cold plate 1606 and also closes portions of lower coolant channels 1610A in the overhanging portions which would otherwise be exposed. The structural substrate 1600 may be attached between the cold plate 1606 and the semiconductor device 204 using direct bonding techniques described herein.

Advantageously, by increasing the width of the cold plate 1606 in the X-axis direction and/or the Y-axis direction, as described above, additional coolant channels may be introduced to the cold plate 1606 in order to increase the efficiency of thermal cooling.

In some embodiments, only portions of lower coolant channels 1610A in the overhanging portions may be closed by the structural substrate 1600, while portions of lower coolant channels 1610A vertically adjacent to the semiconductor device 204 may be exposed to the backside of the semiconductor device 204. For example, portions of the lower coolant channels 1610A vertically adjacent to the semiconductor device 204 may be exposed by etching openings in horizontally aligned portions of the structural substrate 1600.

In certain embodiments, the structural substrate 1600 may be omitted and instead the lower coolant channels 1610A may be formed vertically above the backside 220 of the semiconductor device 204 only, in order that the lower coolant channels 1610A are fluidly sealed against the backside 220. In such embodiments, the upper coolant channels 1610B may be formed in regions laterally beyond the lower coolant channels 1610A in the X-axis direction or the Y-axis direction. Therefore, the cold plate 1606 may include more upper coolant channels 1610B than lower coolant channels 1610A and/or a horizontal length of the upper coolant channels 1610B in the X-axis direction may be greater than a horizontal length of the lower coolant channels 1610A in the X-axis direction.

In FIGS. 16A and 16B, the cold plate 1606 is illustrated as having first inlet and outlet openings 1610A corresponding to the lower coolant channels 1610A and second inlet and outlet openings corresponding to the upper coolant channels 1610B. However, it will be understood that the cold plate 1606 may include a single pair of inlet and outlet openings shared between the upper and lower coolant channels 1610B, 1610B, as illustrated in FIG. 9.

FIG. 17 is a flow diagram showing a method 1700 of forming an integrated cooling assembly (such as the integrated cooling assemblies described herein), according to embodiments of the present disclosure. Generally, the method 1700 includes bonding a first substrate comprising one or more cold plates (such as the cold plates described herein) to a second substrate comprising one or more semiconductor devices, and singulating one or more integrated cooling assemblies from the bonded first and second substrates. For example, a wafer (bare or reconstituted wafer) comprising one or more cold plates can be directly bonded to another wafer (bare or reconstituted wafer) comprising one or more semiconductor devices.

It will be understood that the first substrate may be a cold plate die or part of a wafer of cold plates. Further, the second substrate may be a semiconductor device die or part of a wafer of semiconductor devices. Therefore, the method 1700 may include die-to-die direct bonding (e.g., cold plate die to semiconductor device die), wafer-to-die direct bonding (e.g., cold plate die to semiconductor device wafer, or cold plate wafer to semiconductor device die), and wafer-to-wafer direct bonding (e.g., cold plate wafer to semiconductor device wafer). It will be understood that the singulation step (discussed in relation to block 1760, below) may not be required for a die-to-die direct bonding operation.

For simplicity, the following description is focused on forming one integrated cooling assembly comprising one cold plate and one semiconductor device. However, as mentioned above, in some embodiments, the first substrate may comprise plural cold plates and the second substrate may comprise plural semiconductor devices, such that plural integrated cooling assemblies may be formed from the first and second substrates.

At block 1720, the method 1700 includes forming a first substrate comprising a cold plate 606, wherein the cold plate comprises upper cavity sidewalls defining upper coolant channels and lower cavity sidewalls defining lower coolant channels separated from the upper coolant channels. The upper coolant channels, the lower coolant channels, inlet opening(s) and outlet opening(s) may be formed in the first substrate by etching using a patterned mask layer formed on its surface.

With reference to FIG. 8, a first patterned mask layer may be patterned on the lower side 602 of the cold plate 606 such that the lower coolant channels 610A extend between the second inlet and outlet openings 606A only and do not extend to the first inlet and outlet openings 606B. A second patterned mask later may be patterned on the upper side 608 of the cold plate 606 such that the upper coolant channels 610B are shorter than the lower coolant channels 610A in order that the upper coolant channels 610B extend between the first inlet and outlet openings 606B only. It will be understood that the second inlet and outlet openings 606A are etched entirely through the cold plate 606 to fluidly connect the lower coolant channels 610A to the upper side 608 of the cold plate 606. The first inlet and outlet openings 606B are etched partially through the upper surface 608 of the cold plate 606 only, in order that the upper coolant channels 610B are fluidly connected to the upper side 608 of the cold plate 606.

With reference to FIG. 10, a first patterned mask layer may be patterned on the lower side 902 of the cold plate 906 and a second patterned mask layer may be patterned on the upper side 908 of the cold plate 906 such that both the lower coolant channels 910A and the upper coolant channels 910B extend between a single pair of inlet and outlet openings 906A. In such embodiments, the upper and lower coolant channels 910B, 910A are the same (or substantially the same) length in the X-axis direction. It will be understood that the inlet and outlet openings 906A are etched entirely through the cold plate 906 to fluidly connect the upper and lower coolant channels 910B, 910A to each other and to the upper side 908 of the cold plate 906.

In some embodiments, a channel cover (such as channel cover 638) comprising inlet and outlet openings may be formed and directly bonded to the cold plate. In such embodiments, the same etching and bonding techniques described herein may be used to form the channel cover.

In some embodiments, a continuous substrate (such as continuous substrate 1338) may be formed and directly bonded between upper and lower portions of the cold plate. In such embodiments, the same etching and bonding techniques described herein may be used to form the upper and lower portions of the cold plate and the continuous substrate. In other embodiments, the same etching and bonding techniques may be used to form upper and lower portions on the cold plate without a continuous substrate disposed therebetween.

An anisotropic etch process may be used, which uses inherently differing etch rates for the silicon material as between {100} plane surfaces and {111} plane surfaces when exposed to an anisotropic etchant.

In some embodiments, the etching process is controlled to where a ratio of the etch rate in the {100} plane to the etch rate in the {111} plane is between about 1:10 and about 1:200, such as between about 1:10 and about 1:100, for example between about 1:10 and 1:50, or between about 1:25 and 1:75. Examples of suitable anisotropic wet etchants include aqueous solutions of potassium hydroxide (KOH), ethylene diamine and pyrocatechol (EPD), ammonium hydroxide (HNOH), hydrazine ($N_2H_4$), or tetra methyl ammonium hydroxide (TMAH). The actual etch rates of the silicon substrate depend on the concentration of the etchant in the aqueous solution, the temperature of the aqueous solution, and a concentration of the dopant in the substrate (if any). Typically, the mask layer is formed of a material that is selective to anisotropic etch compared to the underlying monocrystalline silicon substrate. Examples of suitable mask materials include silicon oxide (SixOx) or silicon nitride (SixNy). In some embodiments, the mask layer has a thickness of about 100 nm or less, such as about 50 nm or less, or about 30 nm or less. The mask layer may be patterned using any suitable combination of lithography and material etching patterning methods.

At block 1740, the method 1800 includes directly bonding the first substrate (e.g., a monocrystalline silicon wafer) comprising a cold plate to the second substrate (e.g., a monocrystalline silicon wafer) comprising a semiconductor device. By direct bonding, it is meant that the bond is effected without an intervening adhesive.

The second substrate may include a bulk material, and a plurality of material layers disposed on the bulk material. The bulk material may include any semiconductor material suitable for manufacturing semiconductor devices, such as silicon, silicon carbide, silicon germanium, germanium, group III-V semiconductor materials, group II-VI semiconductor materials, or combinations thereof. While some high-performance processors like CPUs, GPUs, neural processing units (NPUs), and tensor processing units (TPUs) are typically made out of silicon, some other high power density (hence substantial heat-generating) devices may comprise silicon carbide or gallium nitride, for example. In some embodiments, the second substrate may include a monocrystalline wafer, such as a silicon wafer, a plurality of device components formed in or on the silicon wafer, and a plurality of interconnect layers formed over the plurality of device components. In other embodiments, the second substrate may comprise a reconstituted substrate, e.g., a substrate formed from a plurality of singulated devices embedded in a support material. In some embodiments, each semiconductor device may have its own individual cold plate fabricated through a reconstitution process.

The bulk material of the second substrate may be thinned after the semiconductor device is formed using one or more backgrinding, etching, and polishing operations that remove material from the backside. Thinning the second substrate may include using a combination of grinding and etching processes to reduce the thickness (in the Z-direction) to about 450 μm or less, such as about 200 μm or less, or about 150 μm or less or about 50 μm or less. After thinning, the backside may be polished to a desired smoothness using a chemical mechanical polishing (CMP) process, and the dielectric material layer may be deposited thereon. In some embodiments, the dielectric material layer may be polished to a desired smoothness to prepare the second substrate for the bonding process. In some embodiments, the method 1700 includes forming a plurality of metal features in the dielectric material layer in preparation for a hybrid bonding process, such as by use of a damascene process.

In some embodiments, the active side of the second substrate is temporarily bonded to a carrier substrate (not shown) before the thinning process. When used, the carrier substrate provides support for the thinning operation and/or for the thinned material to facilitate substrate handling during one or more of the subsequent manufacturing operations described herein.

Here, the method 1700 may include forming dielectric layers on one or both the first and second substrates, and directly bonding includes forming dielectric bonds between a first dielectric material layer of the first substrate and a second dielectric material layer of the second substrate (or forming direct dielectric bonds between one substrate (which may have a native oxide layer at its bonding surface) and a dielectric material layer of the other substrate). Direct bonding processes join dielectric layers by forming strong chemical bonds (e.g., covalent bonds) between the dielectric layers.

Generally, directly bonding the surfaces (of the dielectric material layers formed on the first and second substrates) includes preparing, aligning, and contacting the surfaces. Examples of dielectric material layers include silicon oxide, silicon nitride, silicon oxynitride, and silicon carbonitride. Preparing the surfaces may include smoothing the respective surfaces to a desired surface roughness, such as between 0.1 to 3.0 nm RMS, activating the surfaces (e.g., a "very slight etch" using plasma or wet chemical treatment as taught in U.S. Pat. No. 6,902,987) to weaken or open chemical bonds in the dielectric material, and terminating the surfaces with a desired species (e.g., also as described in U.S. Pat. No. 6,902,987). Smoothing the surfaces may include polishing the first and second substrates using a CMP process. Simultaneously activating and terminating the surfaces with a desired species may include exposing the surfaces to radical species formed in a plasma. The bond interface between the bonded dielectric layers can include a higher concentration of materials from the activation and/or last chemical treatment processes compared to the bulk of the bonding layers. For example, in some embodiments that utilize a nitrogen plasma for activation that terminates the bonding surface with a nitrogen-containing species, a nitrogen concentration peak can be formed at the bond interface. In some embodiments, the nitrogen concentration peak may be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolyzed (OH-terminated) surface with $NH_2$ molecules, yielding a nitrogen-terminated surface. In embodiments that utilize an oxygen plasma for activation, an oxygen concentration peak can be formed at the bond interface between non-conductive bonding surfaces. Such an oxygen concentration peak will be more detectable when the bonding layers do not contain oxygen, such as layers containing silicon nitride or silicon carbon nitride.

In some embodiments, the plasma is formed using a nitrogen-containing gas, e.g., $N_2$, and the terminating species includes nitrogen, or nitrogen and hydrogen. In some embodiments, fluorine may also be present within the plasma. In some embodiments, the surfaces may be activated using a wet cleaning or etching process, e.g., by exposing the surfaces to an aqueous ammonia solution (e.g., ammonium hydroxide). In some embodiments, the dielectric bonds may be formed using a dielectric material layer deposited on only one of the first and second substrates, but not on both. In those embodiments, the direct dielectric bonds may be formed by contacting the deposited dielectric material layer of one of the first and second substrates directly with a bulk material surface (or such a surface with a native oxide) of the other substrate.

Directly forming direct dielectric bonds between the first and second substrates at block 1740 may include bringing the prepared and aligned surfaces into direct contact at a temperature less than 150° C., such as less than 100° C., for example, less than 30° C., or about room temperature, e.g., between 20° C. and 30° C. Without intending to be bound by theory, in the case of directly bonding surfaces terminated with nitrogen and hydrogen (e.g., $NH_2$ groups), it is believed that a chemical bond is formed in part from the nitrogen species, wherein hydrogen gas byproducts ($H_2$ gas) of the chemical reaction diffuse away from the interfacial bonding surfaces. In some embodiments, the direct bond is strengthened using an anneal process, where the substrates are heated to and maintained at a temperature of greater than about 30° C. and less than about 450° C., for example, greater than about 50° C. and less than about 250° C., or about 150° C., for a duration of about 5 minutes or more, such as about 15 minutes. Typically, the bonds will strengthen over time even without the application of heat. Thus, in some embodiments, the method does not include heating the substrates.

In embodiments where the first and second substrates are bonded using hybrid dielectric and metal bonds, the method 1700 may further include planarizing or recessing the metal features below the dielectric field surface before contacting and bonding the dielectric material layers. After the dielectric bonds are formed, the first and second substrates may be heated to a temperature of 150° C. or more and maintained at the elevated temperature for a duration of about 1 hour or more, such as between 8 and 24 hours, to form direct metallurgical bonds between the metal features.

Suitable direct dielectric and hybrid bonding technologies that may be used to perform aspects of the methods described herein include ZiBond® and DBI®, each of which are commercially available from Adeia Holding Corp., San Jose, CA, USA.

At block 1760, the method 1700 includes singulating at least one integrated cooling assembly from the bonded first and second substrates. Singulation after bonding may impart distinctive structural characteristics on the integrated cooling assembly as the cold plate has the same perimeter as the semiconductor device bonded thereto. Thus, the sidewalls (e.g., side surfaces) of the cold plate are typically flush with the sidewalls (e.g., side surfaces) of the semiconductor device about their common perimeters. In some embodiments, the cold plate is singulated from the first substrate using a process that cuts or divides the first substrate in a vertical plane, i.e., in the Z-direction. In those embodiments, the side surfaces of the cold plate are substantially perpendicular to the backside 220 of the semiconductor device, i.e., a horizontal (X-Y) plane of an attachment interface between the semiconductor device and the cold plate. In some embodiments, the cold plate is singulated using a saw or laser dicing process.

At block 1780, the method 1700 may include connecting the integrated cooling assembly to the package substrate 202 and sealing a package cover 208 comprising inlet and outlet openings 212 to the integrated cooling assembly by use of a sealing material layer 222, such as a molding compound that is cured.

At block 1800, the method 1700 may include, before or after sealing the package cover 208 to the integrated cooling assembly, forming inlet and outlet openings 222A in the sealing material layer 222 to fluidly connect the inlet and outlet openings 212 of the package cover 208 to the cold plate 606.

Figures 18A, 18B:
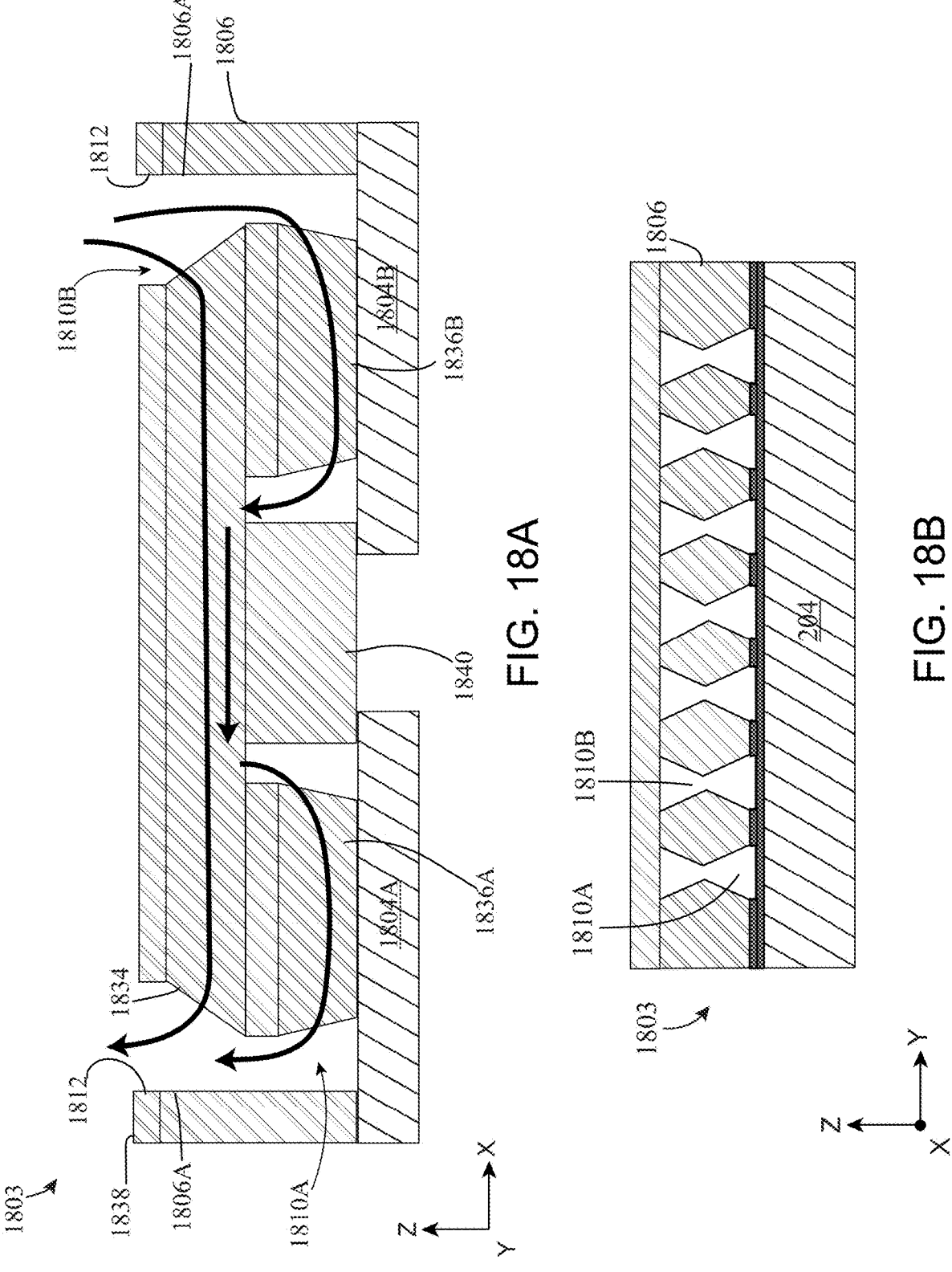
FIG. 18A is a schematic sectional view in the Y-Z plane of another integrated cooling assembly, in accordance with embodiments of the present disclosure.
FIG. 18B is a schematic sectional view in the X-Z plane of the integrated cooling assembly illustrated in FIG. 18A, in accordance with embodiments of the present disclosure.

FIG. 18A is a schematic sectional view in the X-Z plane of an integrated cooling assembly 1803 and FIG. 18B is a schematic sectional view in the Y-Z plane of the integrated cooling assembly 1803. The integrated cooling assembly 1803 may be incorporated into the device package 201 in place of the integrated cooling assembly 203. Certain features of the integrated cooling assembly 1803 illustrated in FIGS. 18A and 18B are similar to features described above in relation to the integrated cooling assembly 703, of FIG. 7. The integrated cooling assembly 1803 may also be similar to the integrated cooling assembly 603 or the integrated cooling assembly 903 shown in FIG. 6 and FIG. 9, respectively. Therefore, repeated description of those features will be omitted for brevity.

The integrated cooling assembly 1803 includes a cold plate 1806 attached to the backside 220 of the semiconductor device 204. The cold plate 1806 may be attached to the semiconductor device 204 by direct dielectric bonds, direct hybrid bonds, or adhesive, as described herein.

The integrated cooling assembly 1803 of FIGS. 18A and 18B differs from the integrated cooling assembly 703 described above in relation to FIG. 7 in that the integrated cooling assembly 1803 comprises a plurality of semiconductor devices 1804A, 1804B each comprising a backside, and the cold plate 1806 is attached to the backside of each semiconductor device 1804A, 1804B.

The cold plate 1806 includes upper coolant channels 1810B and lower coolant channels 1810A which are horizontally aligned (in the Y-axis direction). The upper coolant channels 1810B are similar to other upper coolant channels described herein, in which a continuous single flow path is provided between inlet and outlet openings (as illustrated by the arrow extending through the upper coolant channels 1810B in FIG. 18A). However, lower coolant channels 1810 are each divided into first lower channels 1836A and second lower channels 1836B, which are divided by a lower channel divider 1840. Here, at least one upper coolant channel 1810B is fluidly connected to at least one lower coolant channel 1810A, such that fluid may flow therebetween. Therefore, a flow path through a given lower coolant channel 1810 may be described as follows: fluid enters through an inlet opening 1806A and flows into the second lower channel 1836B, fluid flows upwardly from the second lower channel 1836B into at least one upper coolant channel 1810B and around the lower channel divider 1840, fluid flows downwardly from the at least one upper coolant channel 1810B into the first lower channel 1836A, and fluid exits through an outlet opening 1806A (as illustrated by the arrows extending through the lower coolant channels 1810A in FIG. 18A). The schematic sectional view shown in FIG.

18B is taken at a line in the Y-Z plane at which the at least one lower coolant channel 1810B (i.e., at least one first lower channel 1836A and/or at least one second lower channels 1836B) is fluidly connected to the at least one upper coolant channel 18010B. Although FIG. 18B illustrates that all the lower coolant channels 1810A are fluidly connected to the upper coolant channels 1810B, it will be understood that one or more lower coolant channels 1810A may be connected to one or more upper coolant channels 1810B.

The following embodiments relate, in part, to integrated cooling assemblies in which a cold plate is used to control the temperature of PICs and/or lasers that are co-packaged with other semiconductor devices, such as CPUs, GPUs, NPUs, TPUs, ASICs, HBM, and/or EICs. As discussed in detail above, such co-packaged optics suffer from thermal crosstalk that may lead to errors due to a narrow operating temperature range of PIC lasers and the relatively higher operating temperature of other high-performance devices. The following embodiments address these problems by providing dedicated cooling to specific components within a CPO system in order to improve temperature stability for difference devices. The following embodiments also provide electrical connections between different semiconductor devices to which a cold plate is attached and improve the input and output accessibility of optical signals within the CPO.

In the following embodiments, the term "semiconductor device" will be understood to mean any electronic or optical device associated with a given integrated cooling assembly. For example, a semiconductor device may be taken to be any one of: a laser, a PIC, a EIC, a CPU, a GPU, a NPU, a TPU, an ASIC, or a HBM.

The cold plates described above may be incorporated into the integrated control assemblies described below. Similarly, the cold plates described below may be incorporated into the integrated cooling assemblies described above. The above discussed manufacturing techniques used to manufacture integrated cooling assemblies may be used to manufacture corresponding features of the integrated cooling assemblies described below (e.g., the cold plates). Furthermore, it will be understood that the following integrated cooling assemblies will include similar features to those discussed in relation to the above integrated cooling assemblies, and therefore repeated description of these features will be omitted for brevity.

Figure 19:
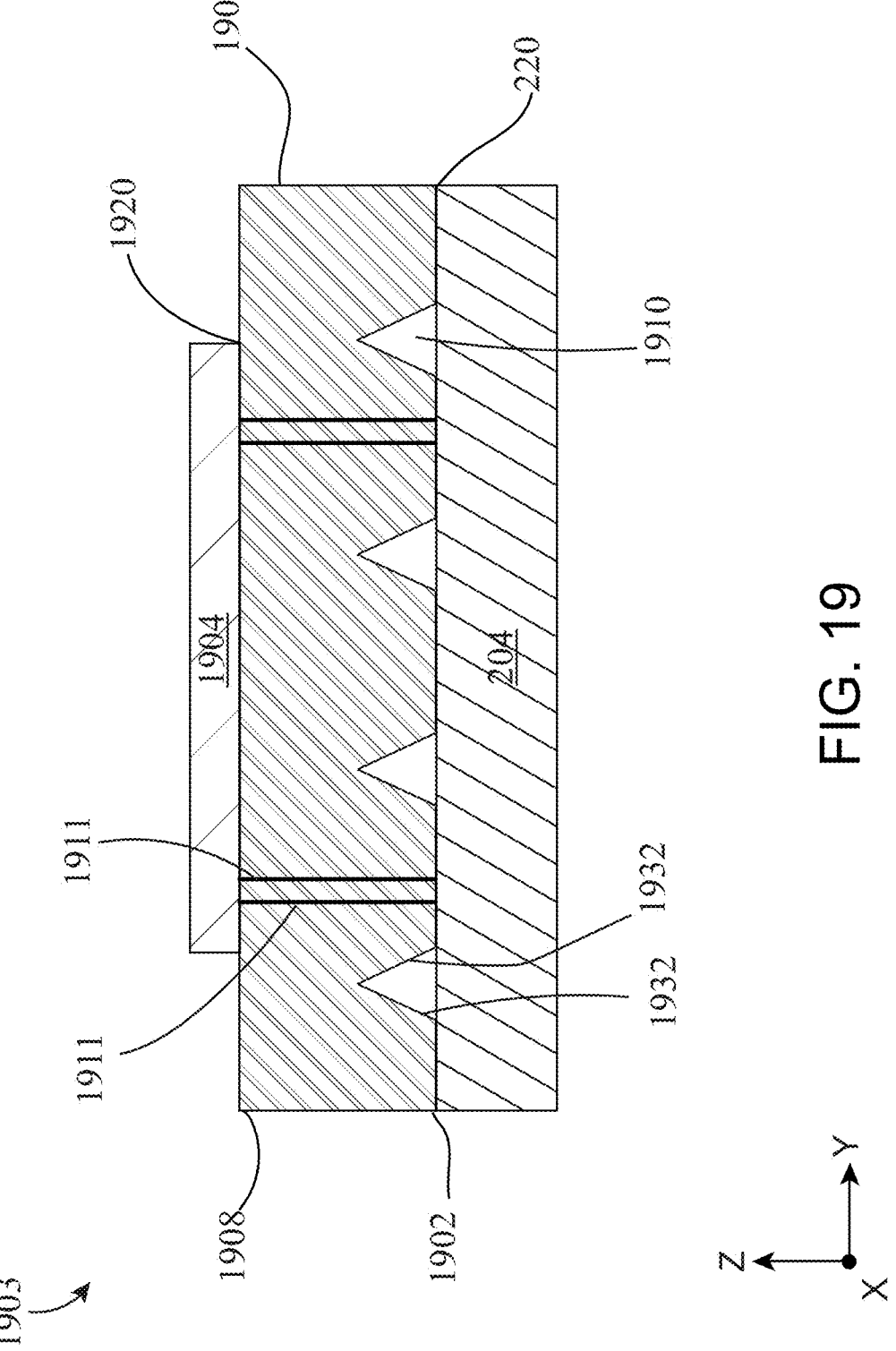
FIG. 19 is a schematic sectional view in the Y-Z plane of another integrated cooling assembly, in accordance with embodiments of the present disclosure.

FIG. 19 is a schematic sectional view in the X-Z plane of an integrated cooling assembly 1903 which may be incorporated into the device package 201 in place of the integrated cooling assembly 203. The integrated cooling assembly 1903 of FIG. 19 includes a cold plate 1906 disposed between a first semiconductor device 204 and a second semiconductor device 1904. That is, the first semiconductor device 204, the cold plate 1906, and the second semiconductor device are vertically stacked in the Z-axis direction. The cold plate 1906, the first semiconductor device 204 and the second semiconductor device 1904 may be attached together by direct dielectric bonds, direct hybrid bonds, or adhesive, as described herein. The cold plate 1906 comprises an upper portion, cavity dividers, and a sidewall (e.g., a perimeter sidewall defining a perimeter of the cold plate 1906) extending downwardly from the upper portion to the backside 220 of the semiconductor device 204. The upper portion, the perimeter sidewall, the cavity dividers, and the backside 220 of the semiconductor device 204 collectively define at least one coolant channel 1910 therebetween. As discussed above, the cavity dividers may extend laterally and in parallel between an inlet opening of the cold plate 1906 and an outlet opening of the cold plate 1906 to define plural coolant channels 1910 therebetween. It should be appreciated that, the cold plate 206 may comprise one cavity divider, which forms two coolant channels, or plural cavity dividers 230, for example two cavity dividers, five cavity dividers, or six cavity dividers (as illustrated in FIG. 4). Certain features of the integrated cooling assembly 1903 illustrated in FIG. 19 are similar to features described above in relation to the integrated cooling assembly 703 illustrated in FIG. 7, and therefore repeated description of those features will be omitted for brevity.

As shown, the cold plate 1906 includes a lower side 1902 facing the backside 220 of the semiconductor device 204 and an upper side 1908 opposite the lower side 1902. Lower cavity sidewalls 1932 extend upwardly into the cold plate 1906 from the lower side 1902 of the cold plate 1906 to form the coolant channels 1910 (which may be exposed to the backside 220 of the semiconductor device 204). The exact shape and dimensions of the upper and lower coolant channels 710B, 710A may vary, as discussed in detail above.

The cold plate 1906 may comprise at least one via 1911 communicatively connected between the first semiconductor device 204 and the second semiconductor device 1904. The via 1911 may be disposed in the body of the cold plate 1906 and extend between the backside 220 of the first semiconductor device 204 and the backside 1920 of the second semiconductor device 1904. In embodiments where the via 1911 is disposed on the body of the cold plate 1906, the via 1911 may be a through silicon via (TSV). As shown in FIG. 19, the cold plate 1906 may comprise a plurality of vias and each via may be communicatively connected between different portions of the first and second semiconductor devices.

The term "communicatively connect" may be taken throughout this disclosure to mean that the at least one via 1911 transmits information between the first semiconductor device 204 and the second semiconductor device 1904. For example, the at least one via 1911 may transmit electrical signals and/or optical signals between the first and second semiconductor devices.

The first semiconductor device 204 and the second semiconductor device 1904 may each comprise at least one of a laser, a PIC, a EIC, a CPU, a GPU, a NPU, a TPU, an ASIC, or a HBM. In some embodiments, the first semiconductor device 204 and the second semiconductor device may be different (e.g., comprise different components). For example, the first semiconductor device 204 may comprise an electronic component (e.g., a EIC, a CPU, a GPU, a NPU, a TPU, an ASIC, and/or a HBM) and the second semiconductor device 1904 may comprise an optical component (e.g., a laser and/or a PIC).

Figure 20:
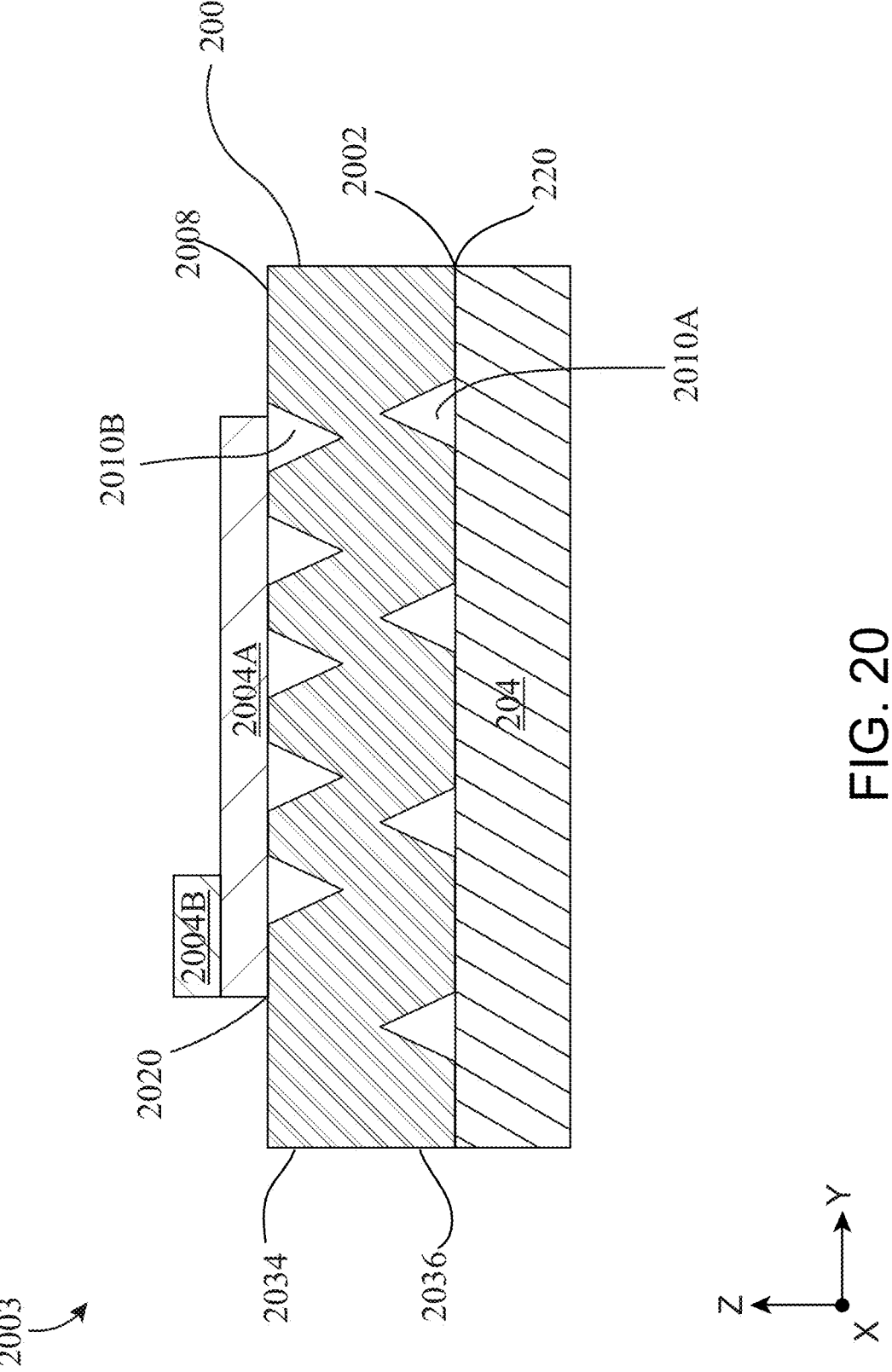
FIG. 20 is a schematic sectional view in the Y-Z plane of another integrated cooling assembly, in accordance with embodiments of the present disclosure.

FIG. 20 is a schematic sectional view in the X-Z plane of an integrated cooling assembly which may be incorporated into the device package 201 in place of the integrated cooling assembly 203. The integrated cooling assembly 2003 of FIG. 20 includes a cold plate 2006 disposed between a first semiconductor device 204 and a second semiconductor device 2004A. Optionally, the integrated cooling assembly 2003 may further comprise a third semiconductor device 2004B disposed on the second semiconductor device 2004A, as shown in FIG. 20, or disposed on a channel cover 2138, as shown in FIG. 21. In embodiments illustrated by FIG. 20, the first semiconductor device 204, the cold plate 2006, the second semiconductor device 2004A, and the third semiconductor device 2004B are vertically stacked in the Z-axis direction. The cold plate 2006, the first semiconductor device 204, the second semiconductor device 2004, and the third semiconductor device 2004B may be attached together by direct dielectric bonds, direct hybrid bonds, or adhesive, as described herein.

The cold plate 2006 includes an upper portion 2034 disposed vertically adjacent to the backside 220 of the semiconductor device 204. A lower portion 2036 of the cold plate 2006 is disposed between the upper portion 2034 of the cold plate 2006 and the backside 220 of the semiconductor device 204. That is, the upper portion 2034 is positioned above the backside 220 of the semiconductor device 204 such that at least part of the upper portion 2034 is located within the footprint of the semiconductor device 204. The lower portion 2036 is positioned between the upper portion 2034 and the semiconductor device 204 such that a lower side 2002 of the cold plate 2006 faces the backside 220. In other words, the upper portion 2034, the lower portion 2034, and the semiconductor device 204 are vertically stacked, in that order.

The upper portion 2034 includes upper coolant channels 2010B defined by upper cavity sidewalls and the lower portion 2036 includes lower coolant channels 2010A defined by lower cavity sidewalls. The upper coolant channels 2010B may be separated from the lower coolant channels 2010A, for example by the upper cavity sidewalls and the lower cavity sidewalls. That is, bulk material of the cold plate 2006 between the upper and lower cavity sidewalls may form cavity dividers, as discussed above in relation to FIG. 3, which may also form a fluid barrier between the upper and lower coolant channels 2010B, 2010A (e.g., to prevent fluid flowing through the upper coolant channels 2010A from flowing into the lower coolant channels 2010A, and vice versa). As shown, the upper coolant channels 210B may be dedicated to controlling the temperature of the second semiconductor device 2004A (and, optionally, the third semiconductor device 2004B). The lower coolant channels 2020A may be dedicated to controlling the temperature of the first semiconductor device 204. The relative locations and spacing between the upper and lower coolant channels 2010B, 2010A may vary, as described above in relation to FIG. 7. For example, the upper coolant channels 2010B and the lower coolant channels 2010A may be aligned or offset in the Y-axis direction. The cold plate 2006 may include the same number of upper and lower coolant channels. Alternatively, the cold plate may include more upper coolant channels than lower coolant channels or more lower coolant channels than upper coolant channels. In FIG. 20, the cold plate includes five upper coolant channels and four lower coolant channels.

The cold plate 2006 may comprise the lower side 2002 facing the backside 220 of the first semiconductor device 204 and an upper side 2008 opposite the lower side 2002. The lower cavity sidewalls may extend upwardly into the lower portion 2036 from the lower side 2002 of the cold plate 2006 to form the lower coolant channels 2010A (which may be exposed to the backside 220 of the semiconductor device 204). The upper cavity sidewalls may extend downwardly into the upper portion 2034 from the upper side 2008 of the cold plate 2006 to form the upper coolant channels 2010A (which may be exposed to a backside 2020 of the second semiconductor device 2004A).

In embodiments illustrated by FIG. 20, the integrated cooling assembly 2003 does not require an interconnect formed in the cold plate 2006 or a channel cover 2138 in order to communicatively connect the second and third semiconductor devices 2004A, 2004B. Instead, the third semiconductor device 2004B is disposed on an upper surface of the second semiconductor device 2004A such that direct connections can be formed therebetween. Furthermore, in such embodiments, the upper coolant channels 2010B are fluidly sealed by the second semiconductor device 2004B, and therefore the channel cover 2138 illustrated in FIG. 21 may be omitted.

The first semiconductor device 204, the second semiconductor device 2004A, and the third semiconductor device 2004B may each comprise at least one of a laser, a PIC, a EIC, a CPU, a GPU, a NPU, a TPU, an ASIC, or a HBM. In some embodiments, the first semiconductor device 204, the second semiconductor device, and/or the third semiconductor device may be different (e.g., comprise different components). For example, the first and third semiconductor devices 204, 2004B may comprise an electronic component (e.g., a EIC, a CPU, a GPU, a NPU, a TPU, an ASIC, and/or a HBM) and the second semiconductor device 2004A may comprise an optical component (e.g., a laser and/or a PIC). In other embodiments, the firs, second, and third semiconductor devices 204, 2004A, 2004B may all comprise an electronic component.

FIG. 21 is a schematic sectional view in the X-Z plane of an integrated cooling assembly 2103 which may be incorporated into the device package 201 in place of the integrated cooling assembly 203. The integrated cooling assembly 2103 of FIG. 21 includes a cold plate 2106 disposed between a first semiconductor device 204 and a second semiconductor device 2104A. The integrated cooling assembly of FIG. 21 is similar to the integrated cooling assembly of FIG. 20 and therefore repeated description will be omitted for brevity. The integrated cooling assembly 2103 of FIG. 21 differs in that a channel cover 2138 is disposed on an upper surface 2108 of the cold plate 2106 to fluidly seal upper coolant channels 2110B. The channel cover 2138 may be attached to the upper portion of the cold plate 2106 (e.g., between the upper surface of the cold plate 2106 and a backside of the second semiconductor device 2104A) using direct dielectric bond, direct hybrid bonds, or adhesive as described herein. In other embodiments including a third semiconductor device, the second and third semiconductor devices 2104A, 2104B may be adjacently attached to an upper surface of the channel cover 2138 (e.g., using direct dielectric bond, direct hybrid bonds, or adhesive as described herein).

As shown, a backside of the first semiconductor device 2104A and a backside of the third semiconductor device 2104B may both be attached to the upper surface of the channel cover 2138 such that the second and third semiconductor devices are arranged side-by-side. In such embodiments, the second semiconductor device 2104B may be communicatively connected to the third semiconductor device 2104A by an interconnect 2113 disposed in the channel cover 2138. In embodiments where the second and third semiconductor devices are both attached directly to the upper side of the cold plate 2106, the interconnect 2113 may be formed in the body of the cold plate 2106 itself. The interconnect 2113 may be formed by routing technology. In addition to or instead of the interconnect 2113, the cold plate 2106 may include at least one via 2111 (e.g., such as the vias 1911 discussed above in relation to FIG. 19) communicatively connected between the first semiconductor device 204, the second semiconductor device 1904, and/or the third semiconductor device 2104B.

Figure 22:
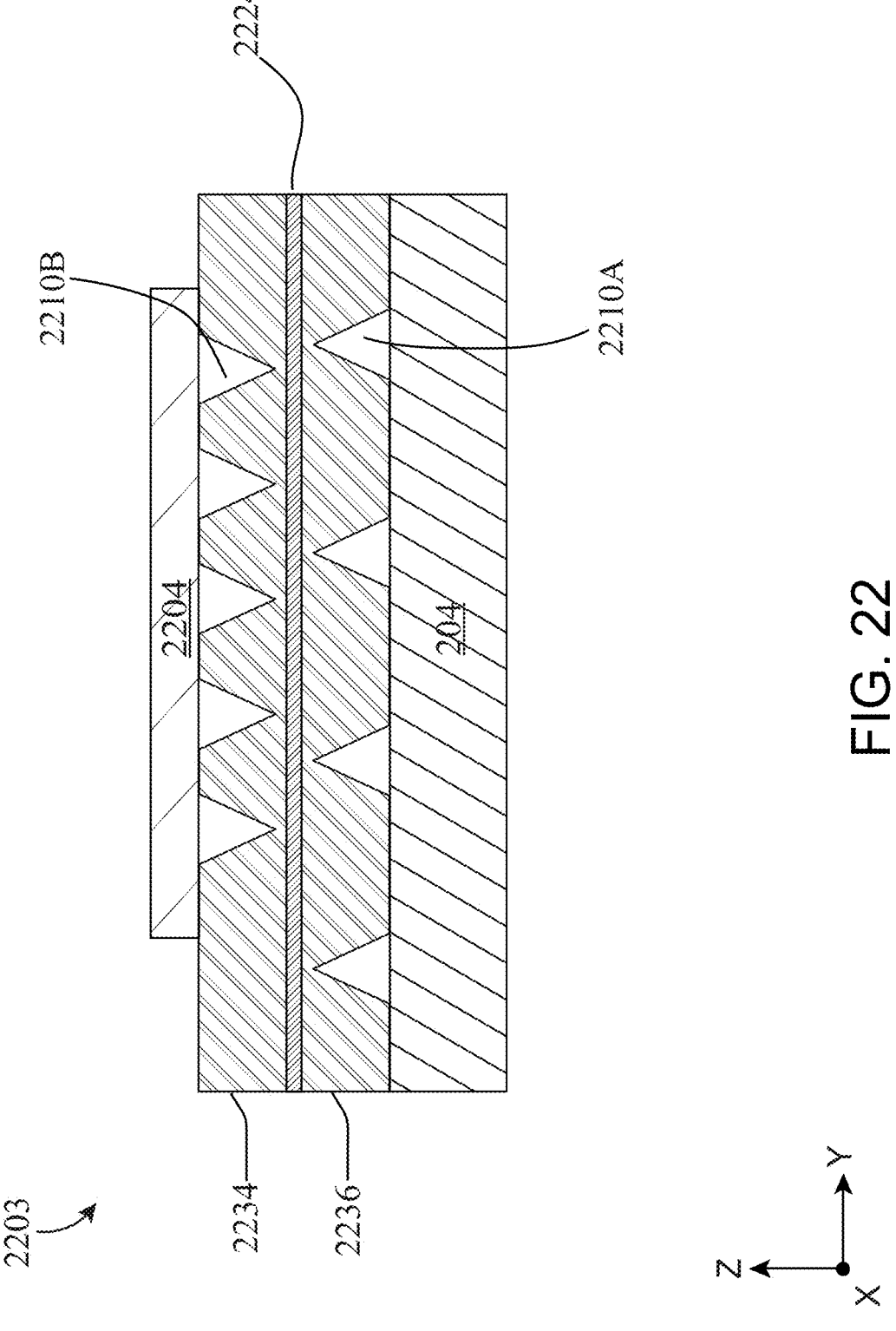
FIG. 22 is a schematic sectional view in the Y-Z plane of another integrated cooling assembly, in accordance with embodiments of the present disclosure.

FIG. 22 is a schematic sectional view in the X-Z plane of an integrated cooling assembly 2203 which may be incorporated into the device package 201 in place of the integrated cooling assembly 203. The integrated cooling assembly of FIG. 22 includes a cold plate 2206 disposed between a first semiconductor device 204 and a second semiconductor device 2204. The integrated cooling assembly 2203 may further include a third semiconductor device (not shown), as discussed above in relation to FIGS. 20 and 21. The cold plate 2206 comprises an upper portion 2234 comprising upper coolant channels 2210B and a lower portion 2236 comprising lower coolant channels 2210A. The integrated cooling assembly of FIG. 22 is similar to the integrated cooling assembly of FIG. 20 and therefore repeated description will be omitted for brevity. The integrated cooling assembly 2203 of FIG. 22 differs in that the upper coolant channels 2210B are separated from the lower coolant channels 2210A by a dielectric material 2224 disposed between the upper portion 2234 and the lower portion 2236. The dielectric material 2224 may be a layer of dielectric material that is used to form at least part of direct bonds (e.g., direct dielectric bonds or direct hybrid bonds, using the methods discussed herein) between the upper portion 2234 and the lower portion 2236. Examples of such dielectric material include oxides, nitrides, oxynitrides, carbonitrides, and oxycarbonitrides, etc., such as, for example, silicon oxide, silicon nitride, silicon oxynitride, silicon carbonitride, silicon oxycarbonitride, etc. As shown in FIG. 22, the dielectric material 2224 may be a continuous layer of material extending across opposing surfaces of the upper portion 2234 and the lower portion 2236.

In some embodiments, a thickness of the dielectric material 2224 between the upper portion 2234 and the lower portion 2236 may be about 1 μm or more, 5 μm or more, 10 μm or more, 1 μm to 10 μm, or 1 μm to 50 μm, for example.

The cold plate 2206 may further include at least one via (not shown) (e.g., such as the vias 1911 discussed above in relation to FIG. 19) communicatively connected between the first semiconductor device 204 and the second semiconductor device 2204 (and, optionally, a third semiconductor device). In such embodiments, the at least one via extends through the bulk material of the upper portion 2234, through the dielectric material 2224, and through the bulk material of the lower portion 2236 to communicatively connect the first and second semiconductor devices 204, 2204.

Advantageously, in embodiments where the upper portion 2234 is attached to the lower portion 2236 (e.g., by direct dielectric bonds or direct hybrid bonds) using the dielectric material 2224, the dielectric material 2224 will inhibits thermal transfer between the upper and lower portions 2234, 2236. That is, the dielectric material 2224 thermally isolates the upper coolant channels 2210B of the upper portion 2234 from the lower coolant channels 22210A of the lower portion 2236. Therefore, dedicated cooling can be provided to the first and second semiconductor devices 204, 2204 by the upper and lower coolant channels 2210B, 2210A, respectively, (e.g., using separate coolant fluid supplies) with minimal thermal crosstalk.

Figure 23:
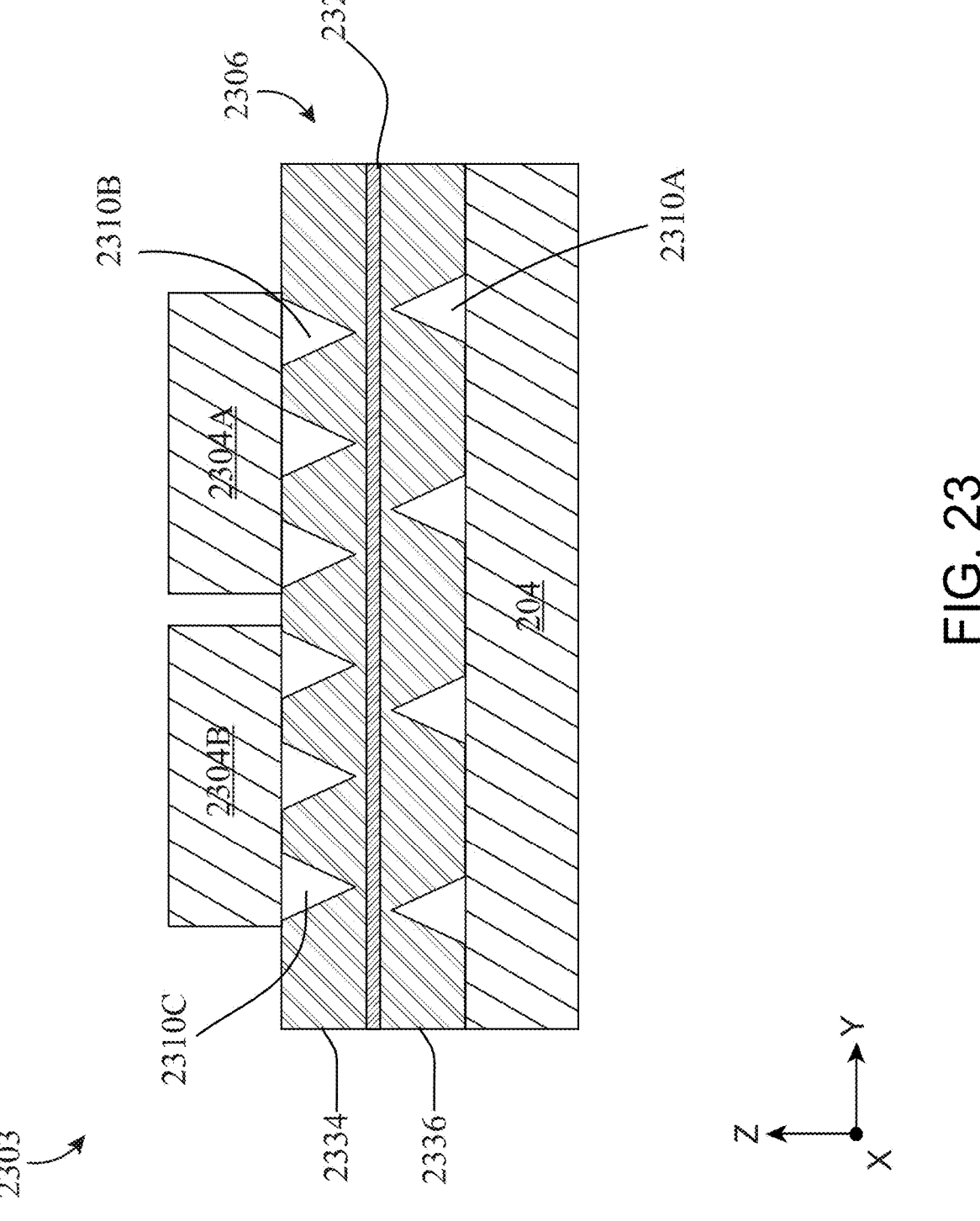
FIG. 23 is a schematic sectional view in the Y-Z plane of another integrated cooling assembly, in accordance with embodiments of the present disclosure.

FIG. 23 is a schematic sectional view in the X-Z plane of an integrated cooling assembly 2303 which may be incorporated into the device package 201 in place of the integrated cooling assembly 203. The integrated cooling assembly 2303 of FIG. 23 includes a cold plate 2306 disposed between a first semiconductor device 204 and a second semiconductor device 2304A. The integrated cooling assembly 2303 may further include a third semiconductor device 2304B, as discussed above in relation to FIGS. 20 and 21. The cold plate 2206 comprises an upper portion 2334 comprising upper coolant channels 2310B and a lower portion 2336 comprising lower coolant channels 2310A. The integrated cooling assembly 2303 of FIG. 23 is similar to the integrated cooling assembly of FIG. 20 and therefore repeated description will be omitted for brevity. The integrated cooling assembly 2303 of FIG. 23 differs in that the second semiconductor device 2304A is disposed vertically adjacent to first upper coolant channels 2310B and the third semiconductor device 2304B is disposed vertically adjacent to second upper coolant channels 2310C. A backside of the second semiconductor device 2310B and a backside of the third semiconductor device 2304C may both be attached to an upper surface of the cold plate 2306 using direct dielectric bonding, direct hybrid bonding, or adhesive, as described herein. Furthermore, the second and third semiconductor devices 2304B, 2304C may be laterally separated from each other in the Y-axis direction, as shown, or they may be in contact with each other.

The first upper coolant channels 2310B and the second upper coolant channels 2110C may include the same number of coolant channel or a different number of coolant channels. Here, the first and second upper coolant channels 2310B, 2310C each include three coolant channels. Therefore, dedicated cooling can be provided to the first, second, and third semiconductor devices 204, 2304A, 2304B by the lower coolant channels 2310A, the first upper coolant channels 2310B, and the second upper coolant channels 2310C, respectively, (e.g., using separate coolant fluid supplies).

In embodiments illustrated by FIG. 23, the first, second, and third semiconductor devices 204, 2304A, 2304C are the same (e.g., a CPU, a GPU, a NPU, a TPU, an ASIC, or a HBM). In some embodiments, the first semiconductor device 204, the second semiconductor device 2304A, and the second semiconductor device 2304B may be different (e.g., comprise different components).

The first and second upper coolant channels 2310B, 2310C may be separated from the lower coolant channels 2210A by a dielectric material 2324 disposed between the upper portion 2334 and the lower portion 2336. The dielectric material 2324 may be a layer of dielectric material that is used to form at least part of direct bonds (e.g., direct dielectric bonds or direct hybrid bonds, using the methods discussed herein) between the upper portion 2334 and the lower portion 2336. Examples of such dielectric material include oxides, nitrides, oxynitrides, carbonitrides, and oxycarbonitrides, etc., such as, for example, silicon oxide, silicon nitride, silicon oxynitride, silicon carbonitride, silicon oxycarbonitride, etc. As shown in FIG. 23, the dielectric material 2324 may be a continuous layer of material extending across opposing surfaces of the upper portion 2334 and the lower portion 2336.

In some embodiments, a thickness of the dielectric material 2324 between the upper portion 2334 and the lower portion 2336 may be about 1 μm or more, 5 μm or more, 10 μm or more, 1 μm to 10 μm, or 1 μm to 50 μm, for example The cold plate 2306 may further include at least one via (not shown) (e.g., such as the vias 1911 discussed above in relation to FIG. 19) communicatively connected between the first semiconductor device 204, the second semiconductor device 2304A, and/or the third semiconductor device 2304B. In such embodiments, the at least one via extends through the bulk material of the upper portion 2334, through the dielectric material 2324, and through the bulk material of the lower portion 2336 to communicatively connect the first, second, and/or third semiconductor devices 204, 2304A, 2304B.

Figure 24:
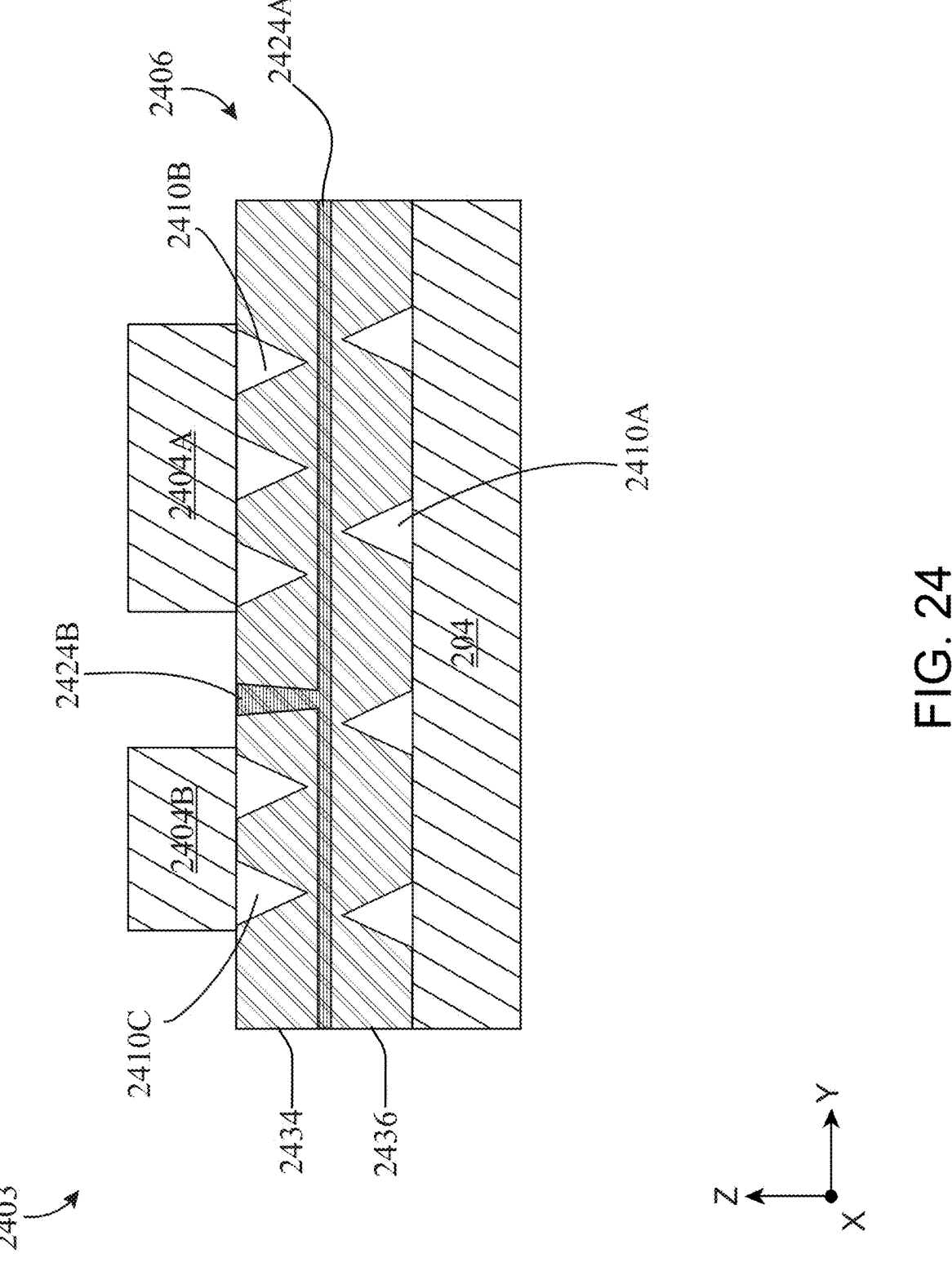
FIG. 24 is a schematic sectional view in the Y-Z plane of another integrated cooling assembly, in accordance with embodiments of the present disclosure.

FIG. 24 is a schematic sectional view in the X-Z plane of an integrated cooling assembly 2403 which may be incorporated into the device package 201 in place of the integrated cooling assembly 203. The integrated cooling assembly 2403 of FIG. 24 includes a cold plate 2406 disposed between a first semiconductor device 204, a second semiconductor device 2304A, and a third semiconductor device 2404B, as discussed above in relation to FIG. 23. The cold plate 2206 comprises an upper portion 2334 comprising upper coolant channels 2310B and a lower portion 2336 comprising lower coolant channels 2310A. The integrated cooling assembly 2403 of FIG. 24 is similar to the integrated cooling assemblies of FIG. 20 and FIG. 23 and therefore repeated description will be omitted for brevity. The integrated cooling assembly 2403 of FIG. 24 differs in that a dielectric material is provided between three different groups of coolant channels.

The second semiconductor device 2404A is disposed vertically adjacent to first upper coolant channels 2410B and the third semiconductor device 2404B is disposed vertically adjacent to second upper coolant channels 2410C. A backside of the second semiconductor device 2410B and a backside of the third semiconductor device 2404C may both be attached to an upper surface of the cold plate 2406 using direct dielectric bonding, direct hybrid bonding, or adhesive, as described herein. Here, the second and third semiconductor devices 2404B, 2404C are laterally separated from each other in the Y-axis direction, such that an air gap is formed therebetween. In some embodiments, the spacer between the second and third semiconductor devices 2404B, 2404C may comprise molding material.

The first upper coolant channels 2410B, the second upper coolant channels 2410C and the lower coolant channels 2310A may be separated from each other by the dielectric material, as shown. In some embodiments, the dielectric material may be continuous and in other embodiments the dielectric material is separated into a first dielectric material 2424A and a second dielectric material 2324B. The first dielectric material 2424A is disposed between the upper portion 2434 and the lower portion 2436, as discussed above in relation to FIGS. 22 and 23. The second dielectric portion 2424B is disposed in a trench formed in the upper portion 2436 between the first and second upper coolant channels 2410B, 2410A. That is, after the upper and lower portions 2434, 2436 have been attached together, using methods described herein, a trench may be formed (e.g., by etching) in the body of the upper portion 2434. The trench may extend partially or entirely along a length of the second and/or third semiconductor devices 2404A, 2404B, in the X-axis direction and/or the Y-axis direction. In some embodiments, the trench may entirely surround at least one of the second and third semiconductor devices 2404A, 2404B. Once the trench has been formed, the dielectric material (e.g., the second dielectric material 2424B) may be deposited in the trench As shown in FIG. 24, the dielectric material may be a continuous layer of material extending across opposing surfaces of the upper portion 2434 and the lower portion 2436 and into the trench.

In some embodiments, a thickness of the dielectric material (e.g., the first dielectric material 2424A) disposed between the upper portion 2434 and the lower portion 2436 may be about 1 μm or more, 5 μm or more, 10 μm or more, 1 μm to 10 μm, or 1 μm to 50 μm, for example. In some embodiments, a thickness of the dielectric material (e.g, the second dielectric material 2424B) disposed between the first upper channels 2410B and the second upper channels 2410C (in the X-axis direction) may be about 1 μm or more, 5 μm or more, 10 μm or more, 1 μm to 10 μm, or 1 μm to 50 μm, for example.

The cold plate 2406 may further include at least one via (not shown) (e.g., such as the vias 1911 discussed above in relation to FIG. 19) communicatively connected between the first semiconductor device 204, the second semiconductor device 2404A and/or the third semiconductor device 2404B. In such embodiments, the at least one via extends through the bulk material of the upper portion 2434, through the dielectric material, and through the bulk material of the lower portion 2436 to communicatively connect the first, second, and/or third semiconductor devices 204, 2204.

Advantageously, the dielectric material (e.g., the first dielectric material 2424A) will inhibits thermal transfer between the upper and lower portions 2234, 2236. Furthermore, the dielectric material (e.g., the second dielectric materisl 2424B) will inhibit thermal transfer between the first upper coolant channels 2410B and the second upper coolant channels 2410C. That is, the dielectric material thermally isolates the first upper coolant channels 2410B, the second upper coolant channels 2410C, and the lower coolant channels 24210A from each other. Therefore, dedicated cooling can be provided to the first, second, and third semiconductor devices 204, 2404A, 2404B by the first upper coolant channels 2410B, the second upper coolant channels 2410B, and the lower coolant channels 2410A, respectively, (e.g., using separate coolant fluid supplies) with minimal thermal crosstalk.

Figure 25:
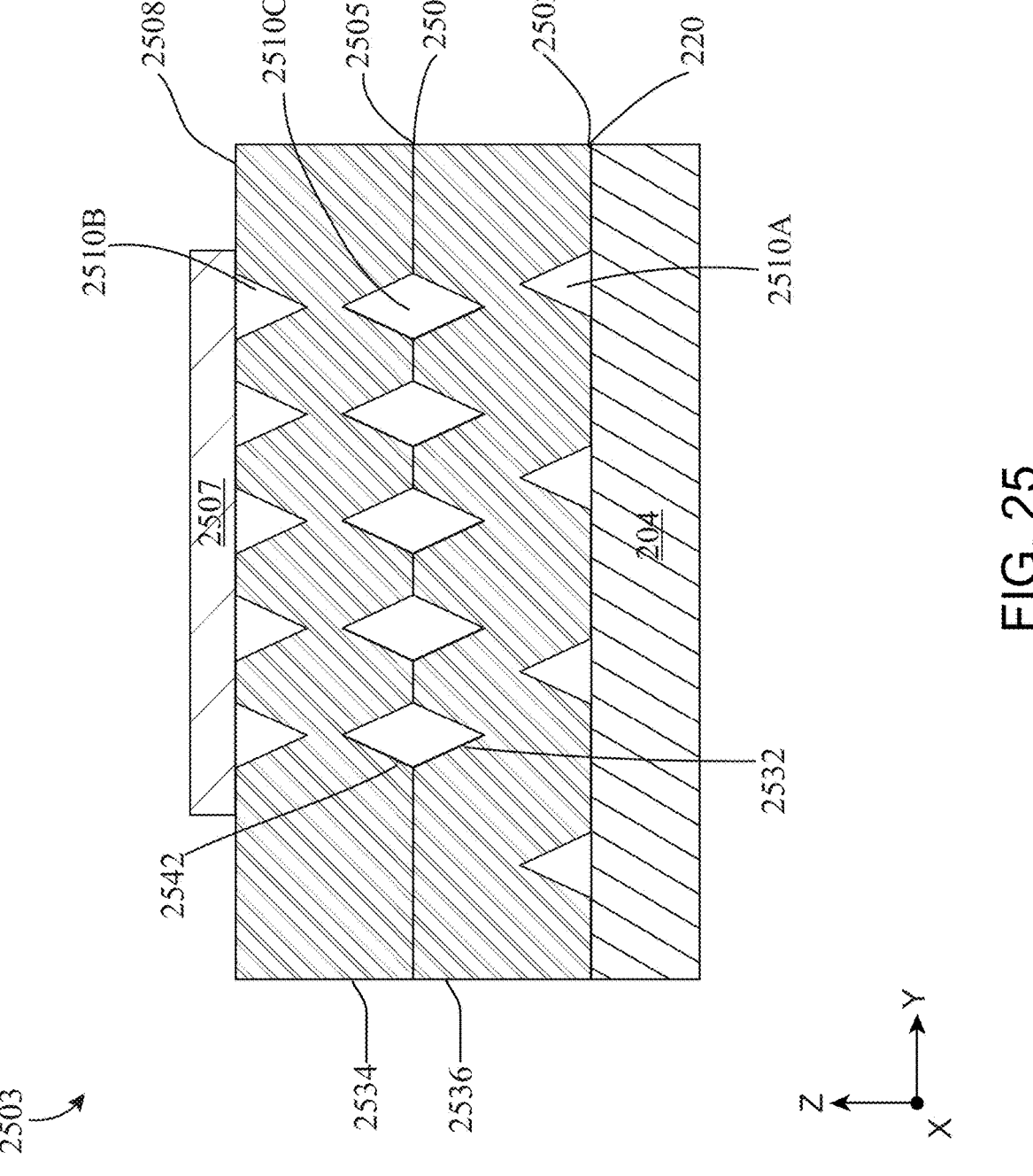
FIG. 25 is a schematic sectional view in the Y-Z plane of another integrated cooling assembly, in accordance with embodiments of the present disclosure.

FIG. 25 is a schematic sectional view in the X-Z plane of an integrated cooling assembly 2503 which may be incorporated into the device package 201 in place of the integrated cooling assembly 203. The integrated cooling assembly 2503 of FIG. 25 includes a cold plate 2506 disposed between a first semiconductor device 204 and a second semiconductor device 2507. The integrated cooling assembly 2503 may further include a third semiconductor device (not shown), as discussed above in relation to FIGS. 20 and 21. The cold plate 2506 comprises an upper portion 2534 comprising upper coolant channels 2510B and a lower portion 2536 comprising lower coolant channels 2510A. Certain aspects of the integrated cooling assembly 2503 of FIG. 25 are similar to the integrated cooling assembly of FIG. 20 and therefore repeated description will be omitted for brevity. The integrated cooling assembly 2503 of FIG. 25 differs in that the cold plate comprises central coolant channels 2510C. In particular, the upper portion 2534 may include first central sidewalls 2542 (e.g., formed by etching) and the lower portion 2536 may include second central sidewalls 2532 (e.g., formed by etching). The first central sidewalls 2542 may extend upwardly into the upper portion 2534 from a first side 2505 of the upper portion 2534. The second central sidewalls 2532 may extend downwardly into the lower portion 2536 from a second side 2505 of the lower portion 2536 opposite the first side 2502 of the lower portion 2536. The first and second central sidewalls 2534,2536 may define central coolant channels 2510C therebetween. The cold plate 2506 may comprise a single central coolant channel or plural central coolant channels 2510C, as shown. The central coolant channels 2510C may extend partially or entirely along a length of the cold plate in the X-axis direction. Ends of the central coolant channels 2510C may be fluidly connected to inlet and outlet openings in the device package, as discussed above in relation to FIG. 2C. The upper and lower portions 2534, 2536 may be attached together by direct dielectric bonds, direct hybrid bonds, or adhesive, according to methods described herein.

In some embodiments, the cold plate 2506 may further includes upper coolant channels 2510B in the upper portion 2534 and lower coolant channels 2510A in the lower portion

2536 (in addition to the central coolant channels 2510C). In such embodiment, lower cavity sidewalls extend upwardly into the lower portion 2536 from the first side 2502 of the lower portion 2536 to form the lower coolant channels 2510A. Upper cavity sidewalls extend downwardly into the upper portion 2534 from a second side 2508 of the upper portion 2534 (opposite the first side 2505 of the upper portion 2534) to form the upper coolant channels 2510B. In embodiments having upper, lower and central coolant channels 2510B, 2510A, 2510C, all the coolant channels may be fluidly connected to each other. The upper, lower and central coolant channels 2510B, 2510A, 2510C may be fluidly connected to the same of different inlet and outlet openings in the device package, as discussed above in relation to FIG. 2C.

Advantageously, by providing central coolant channels 2510C in addition to upper and lower coolant channels 2510B, 2510A, the rate at which thermal energy can be transferred away from the semiconductor devices in increased, and the overall efficiency of thermal cooling is improved.

The embodiments discussed above are intended to be illustrative and not limiting. One skilled in the art would appreciate that individual aspects of the cooling assemblies, device packages, and methods discussed herein may be omitted, modified, combined, and/or rearranged without departing from the scope of the disclosure.

What is claimed is:

1. An integrated cooling assembly comprising:
   a first semiconductor device;
   a second semiconductor device;
   a third semiconductor device adjacent to the second semiconductor device; and
   a cold plate attached to a backside of the first semiconductor device, wherein:
      the cold plate comprises an upper portion disposed vertically adjacent to the backside of the first semiconductor device;
      the cold plate comprises a lower portion disposed between the upper portion of the cold plate and the backside of the first semiconductor device;
      the upper portion comprises upper coolant channels defined by upper cavity sidewalls;
      the lower portion comprises lower coolant channels defined by lower cavity sidewalls;
      the cold plate is disposed between the first semiconductor device and the second semiconductor device;
      the cold plate comprises a channel cover disposed on the upper portion of the cold plate to fluidly seal the upper coolant channels;
      the second and third semiconductor devices are attached to an upper surface of the channel cover; and
      the second semiconductor device is communicatively connected to the third semiconductor device by an interconnect disposed in the channel cover.

2. The integrated cooling assembly of claim 1, wherein the upper coolant channels are separated from the lower coolant channels.

3. The integrated cooling assembly of claim 1, wherein:
   the cold plate comprises a lower side facing the backside of the first semiconductor device and an upper side opposite the lower side;
   the lower side is directly bonded to the backside of the first semiconductor device; and
   the upper side is directly bonded to a backside of the second semiconductor device.

4. The integrated cooling assembly of claim 1, wherein the upper coolant channels are separated from the lower coolant channels by the upper cavity sidewalls and the lower cavity sidewalls.

5. The integrated cooling assembly of claim 1, wherein the upper coolant channels are separated from the lower coolant channels by a dielectric material disposed between the upper portion and the lower portion.

6. The integrated cooling assembly of claim 5, wherein a thickness of the dielectric material between the upper portion and the lower portion is 1 μm-10 μm.

7. The integrated cooling assembly of claim 5, wherein the upper portion is attached to the lower portion by the dielectric material using direct dielectric bonds or direct hybrid bonds.

8. The integrated cooling assembly of claim 1, wherein the first semiconductor device comprises at least one of a central processing unit (CPU), a graphical processing unit (GPU), a neural processing unit (NPU), a tensor processing unit (TPU), and high-bandwidth memory (HBM).

9. The integrated cooling assembly of claim 1, wherein the second semiconductor device comprises at least one of a central processing unit (CPU), a graphical processing unit (GPU), a neural processing unit (NPU), a tensor processing unit (TPU), and high-bandwidth memory (HBM).

10. The integrated cooling assembly of claim 1, wherein the first semiconductor device is different than the second semiconductor device.

11. The integrated cooling assembly of claim 1, wherein the second semiconductor device is a photonic integrated circuit (PIC).

12. The integrated cooling assembly of claim 1, wherein the channel cover is attached to the upper portion by direct dielectric bonds, direct hybrid bonds, or adhesive.

13. The integrated cooling assembly of claim 1, further comprising a fourth semiconductor device, wherein the fourth third semiconductor device is disposed on the second semiconductor device.

14. The integrated cooling assembly of claim 1, wherein:

the second semiconductor device is disposed vertically adjacent to first upper coolant channels;

the third semiconductor device is disposed vertically adjacent to second upper coolant channels; and the first upper coolant channels are separated from the second upper coolant channels by dielectric material disposed therebetween.

15. The integrated cooling assembly of claim 14, wherein a thickness of the dielectric material between the first upper channels and the second upper channels is 1 μm-10 μm.

16. The integrated cooling assembly of claim 1, wherein the third semiconductor device is an electronic integrated circuit (EIC).

* * * * *